United States Patent [19]
Tamura et al.

[11] Patent Number: 5,338,955
[45] Date of Patent: Aug. 16, 1994

[54] SEMICONDUCTOR DEVICE HAVING STACKED TYPE CAPACITOR

[75] Inventors: Katsuhiko Tamura; Atsuko Kawai, both of Hyogo, Japan

[73] Assignee: Mitsubishi Denki Kabushiki Kaisha, Tokyo, Japan

[21] Appl. No.: 6,870

[22] Filed: Jan. 21, 1993

[30] Foreign Application Priority Data

Mar. 27, 1992 [JP] Japan .................. 4-070825

[51] Int. Cl.⁵ .......................... H01L 29/68
[52] U.S. Cl. .................. 257/306; 257/307; 257/308
[58] Field of Search ............ 257/306, 307, 308

[56] References Cited

U.S. PATENT DOCUMENTS

| | | | |
|---|---|---|---|
| 4,754,313 | 6/1988 | Takemae et al. | 257/306 |
| 4,907,046 | 3/1990 | Ohji et al. | 257/306 |
| 5,084,405 | 1/1992 | Fazan et al. | 257/306 |
| 5,126,810 | 6/1992 | Gotou | 257/306 |
| 5,164,337 | 11/1992 | Ogawa et al. | 257/307 |

FOREIGN PATENT DOCUMENTS

| | | |
|---|---|---|
| 59-89450 | 5/1984 | Japan . |
| 62-104067 | 5/1987 | Japan . |
| 1-38375 | 8/1989 | Japan . |
| 2-10762 | 1/1990 | Japan . |
| 3-142966 | 6/1991 | Japan . |
| 3-185757 | 8/1991 | Japan . |
| 3-209868 | 9/1991 | Japan . |

OTHER PUBLICATIONS

"Crown-Shaped Stacked-Capacitor Cell for 1.5-V Operation 64-Mb DRAM's" by Yoru Kaga et al., IEEE Tranactions on Electron Devices, vol. 38, No. 2, Feb. 1991, pp. 255-261.

Primary Examiner—Robert Limanek
Attorney, Agent, or Firm—Lowe, Price, LeBlanc & Becker

[57] ABSTRACT

A DRAM providing a capacitor capacity sufficient for maintaining stable storage of data even if elements are further reduced in size in accordance with high density integration of semiconductor devices is disclosed. The DRAM has its capacitor upper electrode formed of an upper layer and a lower layer, and its capacitor lower electrode formed to surround the lower layer of the capacitor upper layer, and the upper layer of the capacitor upper layer formed to cover the upper surface and both sides of the capacitor lower electrode. Thus, a capacitor capacity is tremendously increased as compared to a conventional one in the same plane area as the conventional one.

10 Claims, 44 Drawing Sheets

SEMICONDUCTOR DEVICE HAVING STACKED TYPE CAPACITOR

BACKGROUND OF THE INVENTION

1. Field of the Invention

The present invention relates generally to semiconductor devices and methods of manufacturing thereof, and more specifically, to a structure of a DRAM (Dynamic Random Access Memory) and a method of manufacturing thereof.

2. Description of the Background Art

Conventionally, demands for semiconductor memory devices have expanded rapidly with information equipments coming into wide use. Furthermore, there exists a demand for a device having a large storage capacity and capable of high speed operation. Accordingly, recent development is under way on semiconductor devices in relation to high density integration, high speed response, and high reliability.

Among various semiconductor memory devices, a DRAM is known as allowing random input and output of storage information. A DRAM generally includes a memory cell array portion which is a storage region in which a plurality of pieces of information are stored, and peripheral circuitry necessary for external input and output. FIG. 68 is a block diagram showing a general structure of a DRAM. Referring to FIG. 68, a DRAM 150 includes a memory cell array 151 for storing a data signal of storage information, a row and column address buffer 152 for receiving an external address signal to select a memory cell constituting a unit storage circuit, a row decoder 153 and a column decoder 154 for designating the memory cell by decoding the address signal, a sense refresh amplifier 155 for amplifying a signal stored in the designated memory cell and reading out the signal, a data in buffer 156 and a data out buffer 157 for inputting and outputting data, and a clock generator 158 for generating a clock signal.

Memory cell array 151 which occupies a large area on a semiconductor chip has a plurality of memory cells in a matrix for storing unit storage information. More specifically, a memory cell is usually formed of an MOS transistor and a capacitor connected thereto. The memory cell is widely known as a memory cell of 1 transistor per 1 capacitor type. A memory cell of such a structure is advantageous for increasing the integration density of a memory cell array for its simple structure, and, therefore, widely used for a DRAM of a large capacity.

Memory cells for DRAMs can be divided into several types due to the structures of their capacitors. Among them, a stacked type capacitor can increase the capacity of a capacitor by increasing the facing area between the electrodes of capacitors by extending the essential part of the capacitor over a gate electrode or a field oxide film. The stacked type capacitor with such a feature, can secure the capacity of the capacitor even when devices are reduced in size due to an increasing integration density of a semiconductor device. As a result, with high density integration of semiconductor devices, more stacked type capacitors have been used. These capacitors are for example disclosed in U.S. Pat. No. 4,907,046.

FIG. 69 is a cross sectional view of a structure of a DRAM including a conventional stacked type capacitor. Referring to FIG. 69, the conventional DRAM includes a P type silicon substrate 201, a field oxide film 202 for isolating elements formed in a prescribed region on the main surface of P type silicon substrate 201, source/drain regions 203a and 203b formed a prescribed distance apart from each other with a channel region 214 therebetween in an active region surrounded by field oxide film 202, a gate electrode 205 formed on a channel region 214 with a gate oxide film 204 therebetween, an interlayer insulating film 206 formed covering gate electrode 205, a capacitor lower electrode 207 electrically connected to source/drain region 203a and formed extending on the upper part of gate electrode 205 with interlayer insulating film 206 therebetween, a capacitor insulating film 208 formed covering capacitor lower electrode 207, a capacitor upper electrode 209 formed covering capacitor insulating film 208, an interlayer insulating film 210 having a contact hole 210a on source/drain region 203b, a bit line 211 electrically connected to source/drain region 203b in contact hole 210a and extending along the surface of interlayer insulating film 210, an interlayer insulating film 212 formed covering bit line 211 and having its surface planarized, and an aluminum interconnection 213 formed on interlayer insulating film 212 and corresponding to gate electrode 205. Capacitor lower electrode 207 and capacitor upper electrode 209 are formed of polysilicon. Bit line 211 is formed of an aluminum film. Capacitor insulating film 208 is formed of a silicon oxide film.

A pair of source/drain regions 203a and 203b, and gate electrode 205 constitute the transfer gate transistor of a memory cell. Capacitor lower electrode 207, capacitor insulating film 208, and capacitor upper electrode 209 constitute a stacked type capacitor for storing charge corresponding to a data signal.

In a writing operation, charge corresponding to a data signal is transferred to source/drain region 203b through bit line 211. Applying a prescribed voltage to gate electrode 205 turns on the transfer gate transistor. Thus, the charge transferred to source/drain region 203b is further transferred to capacitor lower electrode 207 through channel region 214 and source/drain region 203a. As a result, the charge corresponding to the data signal is stored in the capacitor.

In a reading operation, applying a prescribed voltage to gate electrode 205 turns on the transfer gate transistor. Thus, charge stored in the capacitor is transferred to source/drain region 203b through source/drain region 203a and channel region 214. The charge transferred to source/drain region 203b is read out externally through bit line 211.

FIGS. 70–78 are cross-sectional views for use in illustration of a manufacturing process (from a first step to a ninth step) of the conventional DRAM shown in Fig. 69. Referring to FIGS. 69 and 70–78, a description of a manufacturing process of the conventional DRAM follows.

Now, as shown in FIG. 70, field oxide film 202 for element isolation is formed in a prescribed region on the main surface of P type silicon substrate 201 by means of thermal oxidation. A gate oxide film layer (not shown) is formed by means of thermal oxidation, and a polysilicon layer (not shown) is formed on the gate oxide film layer by chemical vapor deposition. Gate oxide film 204 and gate electrode 205 are formed by means of photolithography and etching techniques. Source/drain regions 203a and 203b are formed by implanting ions using gate electrode 205 as mask. Interlayer insulating film 206 covering gate electrode 205 is formed by means of chemical vapor deposition or the like.

As shown in FIG. 71, a polysilicon layer 207a is formed by means of CVD on the entire surface.

Then, as shown in FIG. 72, using photolithography and etching techniques, polysilicon layer 207a (see FIG. 71) is patterned to form capacitor lower electrode 207.

Then, as shown in FIG. 73, silicon oxide film (capacitor insulating film) 208 is formed on the surface of capacitor lower electrode 207 by means of thermal oxidation.

Then, as shown in FIG. 74, polysilicon layer 209a is formed by chemical vapor deposition. Using photolithography and etching techniques, polysilicon layer 209a is patterned to form capacitor upper electrode 209 as shown in FIG. 75.

As shown in FIG. 76, interlayer insulating film 210 is formed by chemical vapor deposition. Then, as shown in FIG. 77, using the photolithography and etching techniques, contact hole 210a is formed in interlayer insulating film 210. Thus, the surface of source/drain region 203b is exposed.

As shown in FIG. 78, an aluminum film to be a bit line is formed to be electrically connected to source/drain region 203b by sputtering.

Finally, as shown in FIG. 69, interlayer insulating film 212 is formed on bit line 211. The surface of interlayer insulating film 212 is a planarized by reflow process. Then, aluminum interconnection 213 is formed on interlayer insulating film 212 corresponding to gate electrode 205. Thus, the DRAM having the conventional stacked type capacitor is completed.

As described above, conventionally, in order to secure a certain capacity of a capacitor even when elements are reduced in size due to an increased integration of semiconductor device, stacked type capacitors having a structure shown in FIG. 69 are used.

The structure of FIG. 69 however makes it difficult to secure a certain capacity of a capacitor with further down scaling of elements. More specifically, when the elements are further reduced in size, in the structure shown in FIG. 69, the facing area between capacitor lower electrode 207 and capacitor upper electrode 209 decreases. It is therefore difficult to secure a sufficient capacity of a capacitor for maintaining stable storage of data as the capacity of the capacitor is reduced and the elements are further reduced in size.

SUMMARY OF THE INVENTION

The present invention is directed to a solution to the above-stated problems.

It is one object of the present invention to secure a sufficient capacity of capacitor for obtaining stable storage of data if elements are further reduced in size, in a semiconductor device.

Another object of the present invention is to increase the facing area between a capacitor lower electrode and a capacitor upper electrode in the same plane area as a conventional stacked capacitor.

Yet another object of the present invention is to readily manufacture a semiconductor device having a capacity of a capacitor sufficient for maintaining stable storage of data if elements are further reduced in size in a manufacturing method of a semiconductor device.

According to one aspect of the present invention, a semiconductor device includes a capacitor upper electrode having an upper layer and a lower layer connected, a capacitor lower electrode formed surrounding the lower layer of the capacitor upper electrode, and a capacitor insulating film between the capacitor upper electrode and the capacitor lower electrode. The upper layer of the capacitor upper electrode is formed covering the upper surface and both sides of capacitor lower electrode.

In operation, the lower electrode is formed surrounding the lower layer of the upper electrode, the upper layer of upper electrode is formed covering the upper surface and both sides of the capacitor lower electrode, and, therefore, a tremendously increased capacitor capacity is provided in the same plane area as the conventional one by the capacitor insulating film positional on the outer wall portion of the lower layer of the above-stated capacitor upper electrode, and the upper surface and both sides of the capacitor lower electrode.

According to another aspect of the present invention, a method of manufacturing a semiconductor device includes steps of forming a first electrode layer, forming a first capacitor insulating layer on the first electrode layer, forming a second electrode layer on the first capacitor insulating layer positioned in the upper part of a prescribed portion of the first electrode layer, forming a third electrode layer on the second capacitor layer positioned in the upper part of a prescribed portion of the second electrode and electrically connected to the first electrode layer, forming a third capacitor insulating layer covering both sidewalls of the first electrode layer and the third electrode layer, removing a prescribed portion in the region over which the third electrode is not formed in the second capacitor insulating layer, and forming a fourth electrode layer electrically connected to the second electrode layer positioned under the portion left behind by the removed second capacitor insulating layer and covering the third capacitor insulating layer.

In operation, the first capacitor insulating layer is formed on the first electrode layer, the second electrode layer is formed on the first capacitor insulating layer positioned in the upper part of a prescribed portion of the first electrode layer, the second capacitor insulating layer is formed covering the second electrode layer, a prescribed region of the surface of the first electrode layer is exposed by removing a prescribed region of a second capacitor on which the second electrode is not formed, the third electrode layer is formed electrically connected to the exposed first electrode layer and on the second capacitor insulating layer positioned in the upper part of a prescribed portion of the second electrode layer, the third capacitor insulating layer is formed covering both sidewalls of the first electrode layer and third electrode layer, a prescribed portion in the region on which the third electrode is not formed in the second capacitor insulating layer is removed, the fourth electrode layer is formed electrically connected to the second electrode layer positioned under the part left behind by the removed second capacitor insulating layer and covering the third capacitor insulating layer, the above-stated first electrode layer and third electrode layer constitute the capacitor lower electrode, the above-stated second electrode layer and fourth electrode layer constitute the capacitor upper electrode, the first capacitor insulating layer, the second capacitor insulating layer, and third capacitor insulating layer interposed between the capacitor lower electrode and capacitor upper electrode greatly increase the capacity of the capacitor in the same plane area as compared to the conventional ones. According to a method of manufacturing a semiconductor device in accordance with the latter aspect the first, second, third, and fourth electrode layers, and the first, second, and third insulating layers are formed by repeating conventional manufacturing steps, and, therefore a semiconductor device in accordance with the present invention can readily be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, a description of the preferred embodiments of the present invention follows in conjunction with the accompanying drawings.

Figure 1:
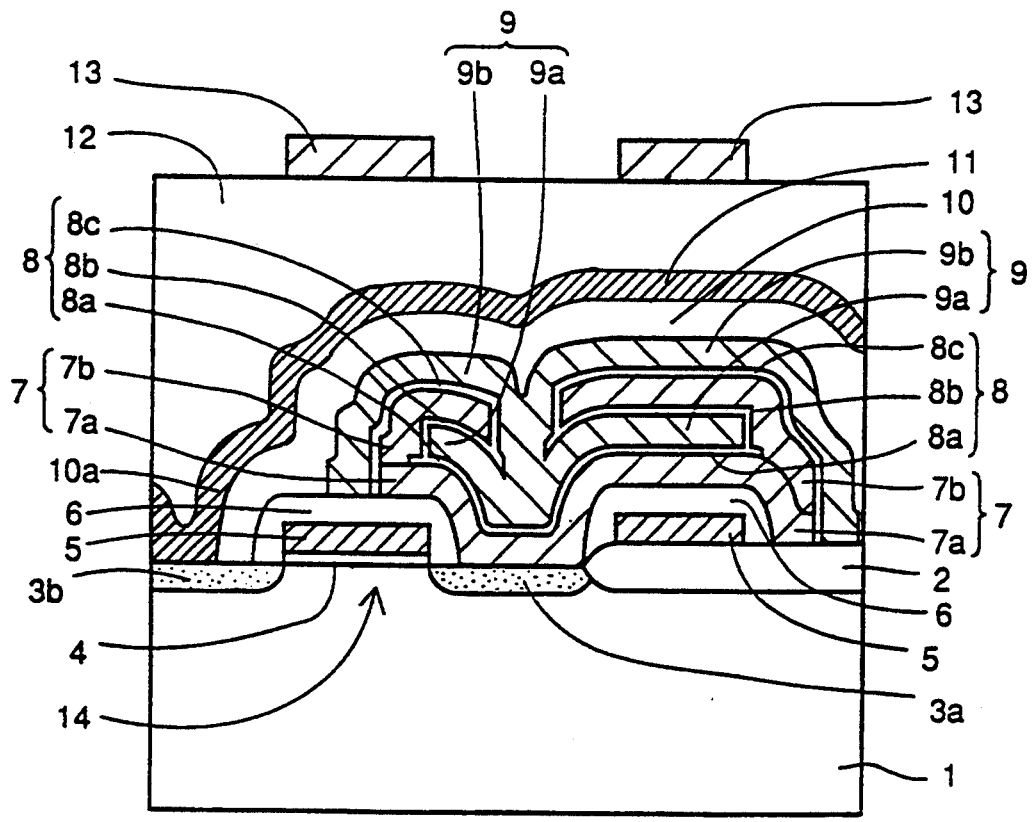
FIG. 1 is a cross-sectional view showing a DRAM including a stacked type capacitor in accordance with a first embodiment of the present invention.

Referring to FIG. 1, a DRAM in accordance with a first embodiment includes a P type silicon substrate 1, a field oxide film 2 formed in a prescribed region on the main surface of P type silicon substrate 1 for element isolation, source/drain regions 3a, 3b formed a prescribed distance apart from each other and holding therebetween a channel region 14 in an active region surrounded by field oxide film 2, a gate electrode 5 formed on channel region 14 with a gate oxide film 4 therebetween, an interlayer insulating film 6 formed covering gate electrode 5, a capacitor lower electrode 7 (7a, 7b) electrically connected to source/drain region 3a, a capacitor insulating film 8 (8a, 8b, 8c) formed along the surface of capacitor lower electrode 7, a capacitor upper electrode 9 (9a, 9b) formed on the surface of capacitor insulating film 8, an interlayer insulating film 10 formed covering capacitor upper electrode 9 and having a contact hole 10a on source/drain region 3b, a bit line 11 formed electrically connected to source/drain region 3b in contact hole 10a and extending along the surface of interlayer insulating film 10, an interlayer insulating film 12 formed covering the entire surface and having its surface planarized and, an aluminum interconnection 13 formed on interlayer insulating film 12 and corresponding to gate electrode 5.

Source/drain regions 3a and 3b, and gate electrode 5 constitute the transfer gate transistor of the memory cell. Capacitor lower electrode 7, capacitor insulating film 8, and capacitor upper electrode 9 constitute a stacked type capacitor for storing charge corresponding to a data signal. Capacitor lower electrode 7 is formed of polysilicon, the thickness of which is in the range from 1000 Å to 2000 Å. Capacitor upper electrode 9 is formed of doped polysilicon, the thickness of which is approximately in the range between 1000 Å and 3000 Å. Capacitor insulating film 8 is formed of an SiO2 film, the thickness of which is approximately in the range between 30 Å and 200 Å.

In this embodiment, capacitor upper electrode 9 is formed of a capacitor upper electrode 9a in the lower layer and a capacitor upper electrode 9b in the upper layer. Capacitor upper electrode 9b in the lower layer and capacitor upper electrode 9b in the upper layer are electrically connected with each other at their central portions. Capacitor upper electrode 9a in the lower layer is formed extending along the main surface of P type silicon substrate 1. Capacitor lower electrode 7 is formed surrounding capacitor upper electrode 9a in the lower layer. More specifically, capacitor lower electrode 7 is formed of capacitor lower electrode 7a in the lower layer formed extending over gate electrode 4 with interlayer insulating film 6 therebetween, and capacitor lower electrode 7b in the upper layer formed electrically connected to capacitor lower electrode 7b in the lower layer and covering the sides and upper surface of capacitor upper electrode 9a in the lower layer. Further in this embodiment, capacitor upper electrode 9b is formed covering the upper surface and both sidewalls of capacitor lower electrodes 7.

As described above, according to the present embodiment, capacitor upper electrode 9 is formed of upper electrode 9a in the lower layer and capacitor upper electrode 9b in the upper layer, and capacitor lower electrode 7 is formed so as to surround capacitor upper electrode 9a in the lower layer. Capacitor upper electrode 9b in the upper layer is formed so as to cover entirely the upper surface and both sidewalls of lower electrode 7b.

Figure 69:
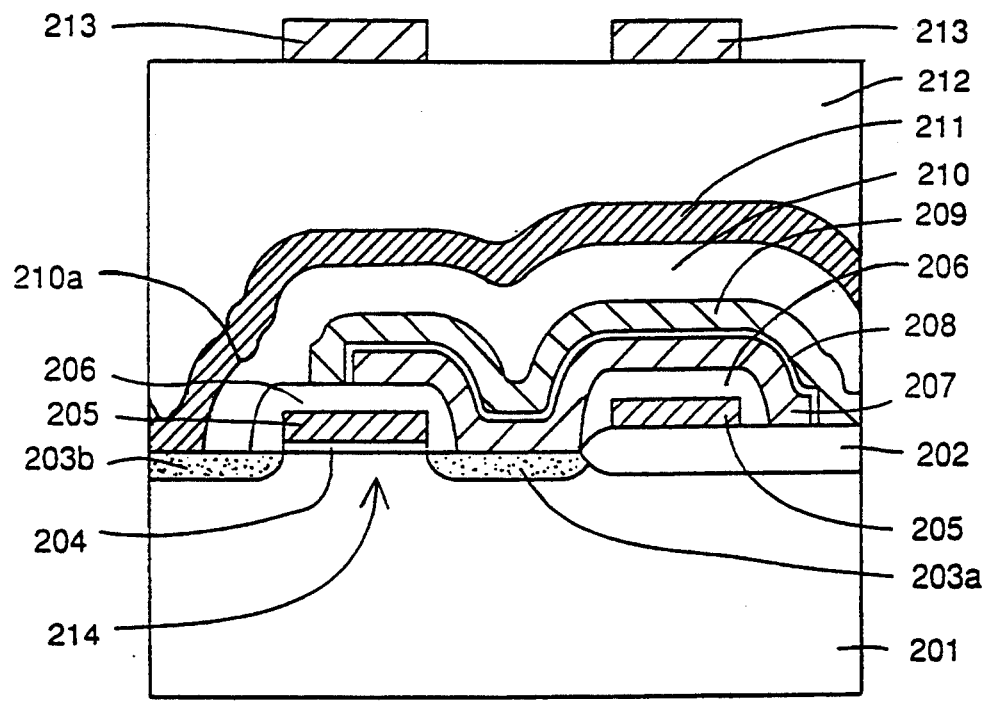
FIG. 69 is a cross-sectional view showing a conventional DRAM including a stacked type capacitor.
Figure 70:
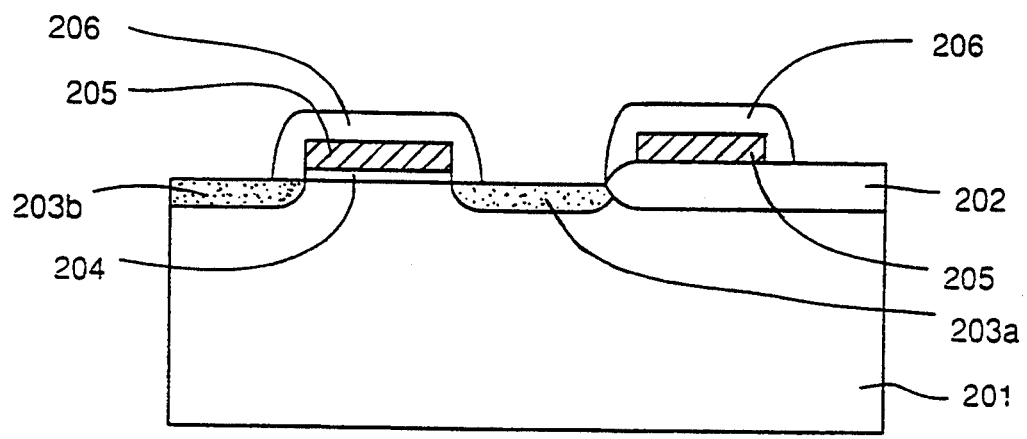
FIG. 70 is a cross-sectional view for use in illustration of a first step of a manufacturing process of the conventional DRAM shown in FIG. 69.
Figure 71:
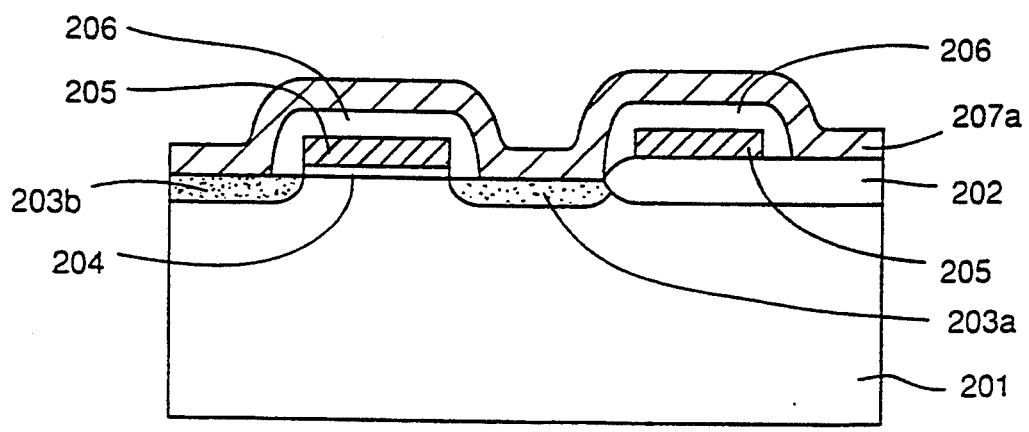
FIG. 71 is a cross-sectional view for use in illustration of a second step of the manufacturing process of the conventional DRAM shown in FIG. 69.
Figure 72:
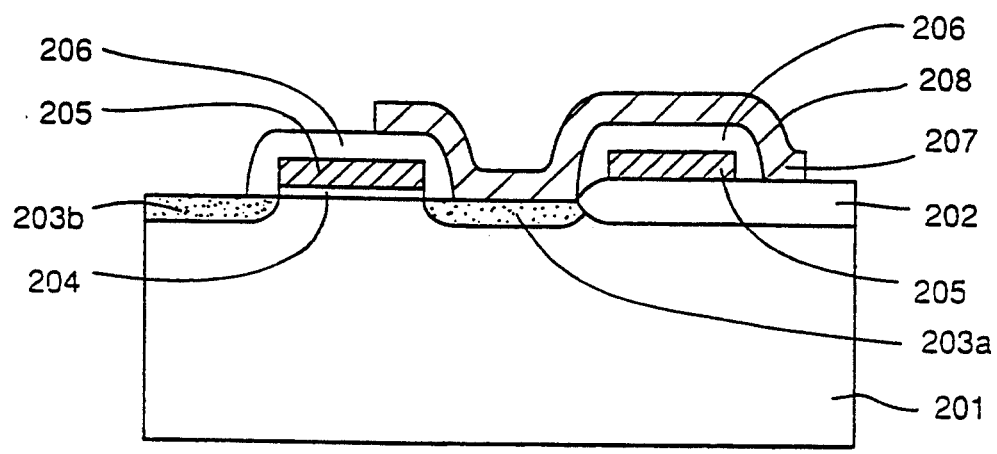
FIG. 72 is a cross-sectional view for use in illustration of a third step of the manufacturing process of the conventional DRAM shown in FIG. 69.
Figure 73:
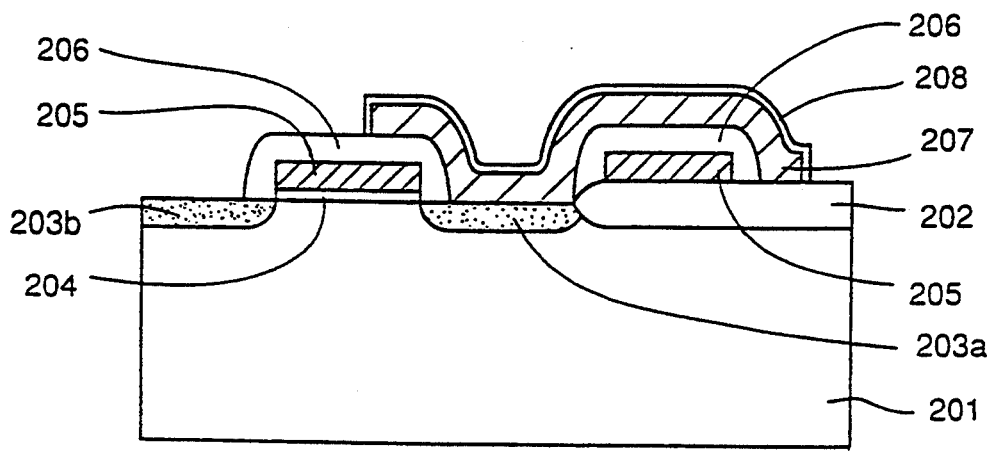
FIG. 73 is a cross-sectional view for use in illustration of a fourth step of the manufacturing process of the conventional DRAM shown in FIG. 69.
Figure 74:
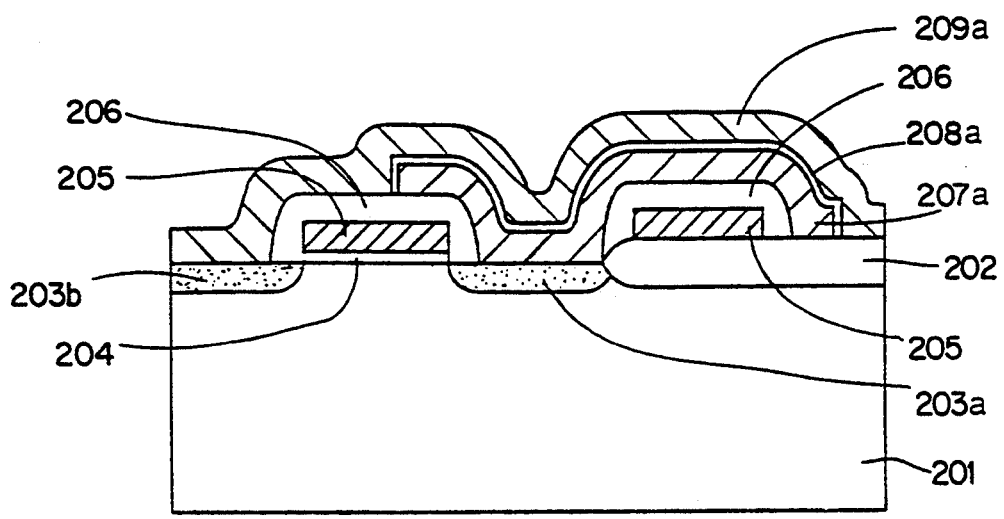
FIG. 74 is a cross-sectional view for use in illustration of a fifth step of the manufacturing process of the conventional DRAM shown in FIG. 69.
Figure 75:
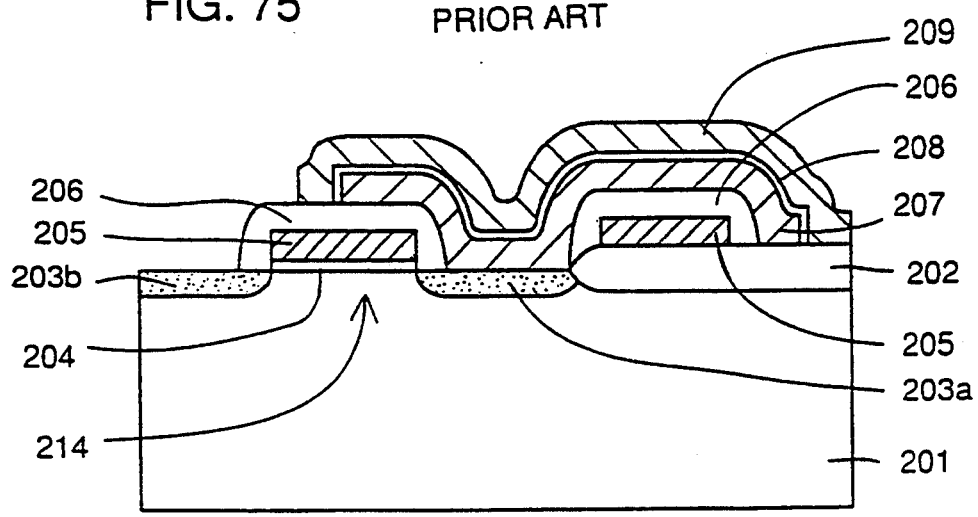
FIG. 75 is a cross-sectional view for use in illustration of a sixth step of the manufacturing process of the conventional DRAM shown in FIG. 69.
Figure 76:
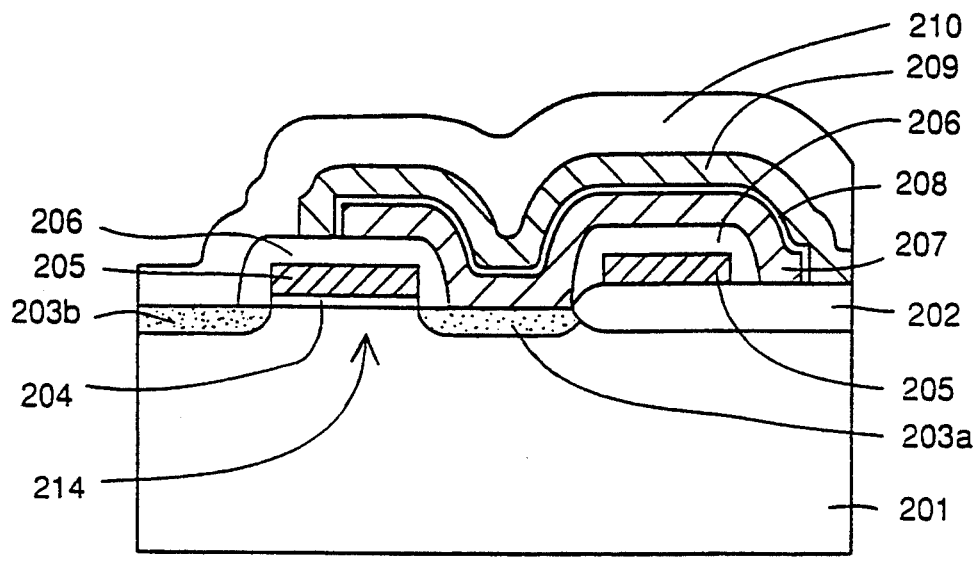
FIG. 76 is a cross-sectional view for use in illustration of a seventh step of the manufacturing process of the conventional DRAM shown in FIG. 69.
Figure 77:
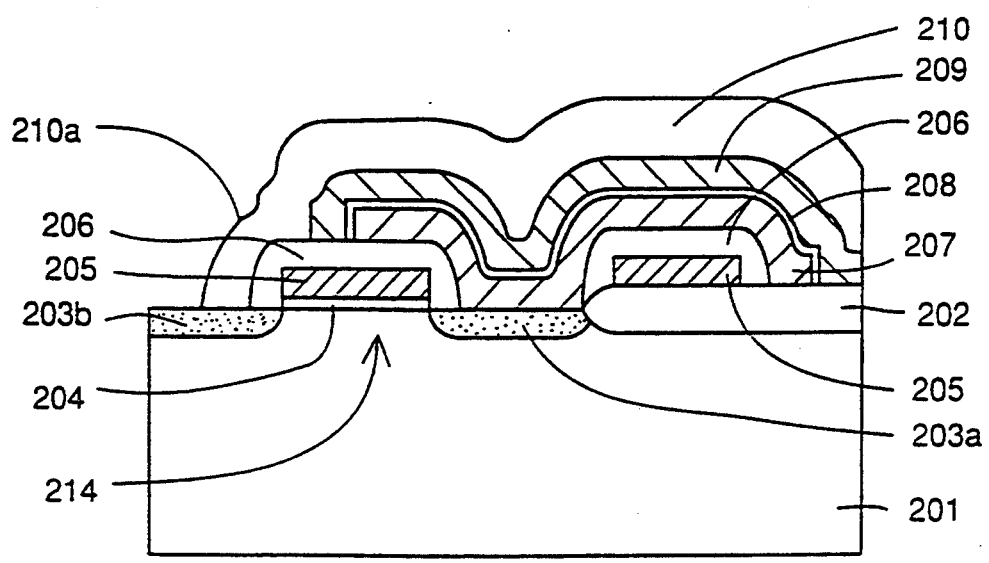
FIG. 77 is a cross-sectional view for use in illustration of an eighth step of the manufacturing process of the conventional DRAM shown in FIG. 69.
Figure 78:
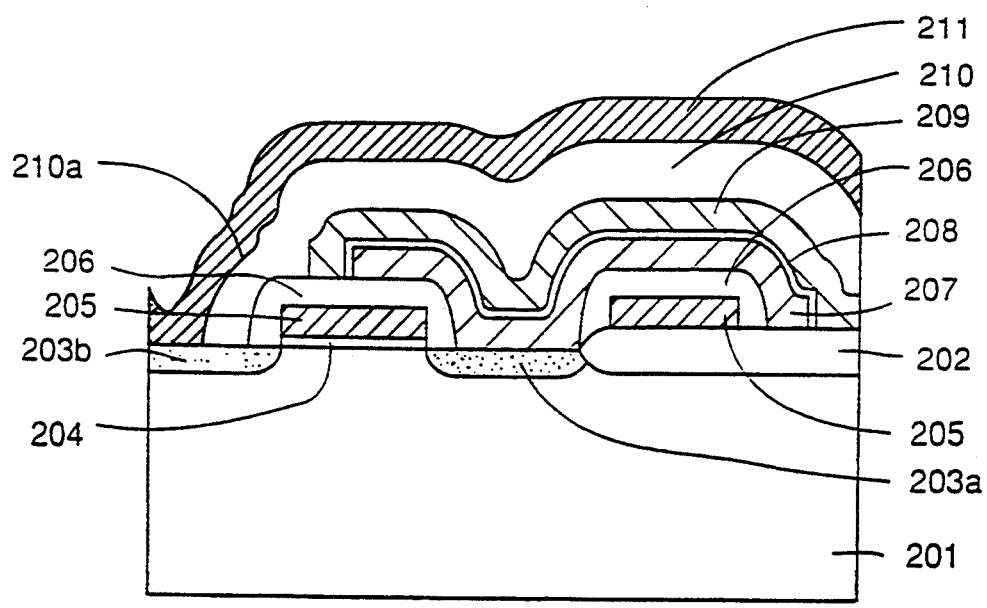
FIG. 78 is a cross-sectional view for use in illustration of a ninth step of the manufacturing process of the conventional DRAM shown in FIG. 69.

With such a structure, the area in which capacitor lower electrode 7 and capacitor upper electrode 9 face each other can be doubled in the same plane as the conventional DRAM shown in FIG. 69, resulting in a doubled capacitor capacity. Thus, even if elements are further reduced in size in accordance with high density integration of semiconductor devices, a capacitor capacity efficient for stable maintenance of stored data can be provided.

Referring to FIG. 1, and FIGS. 2-20, a description of a manufacturing process of a DRAM in accordance with the first embodiment follows.

Figure 2:
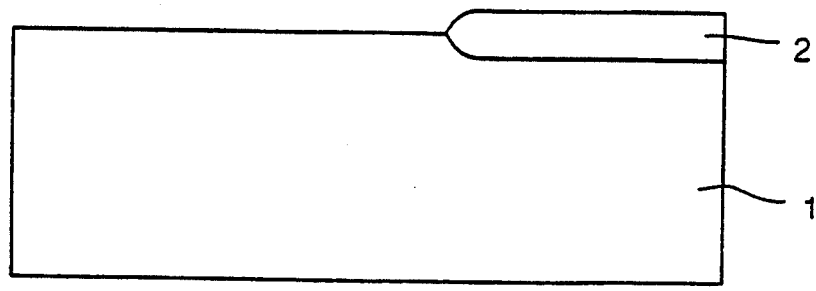
FIG. 2 is a cross-sectional view for use in illustration of a first step in a manufacturing process of the DRAM in accordance with the first embodiment shogun in FIG. 1.

As shown in FIG. 2, field oxide film 2 is formed in a prescribed region on the main surface of P type silicon substrate 1 by means of thermal oxidation.

Figure 3:
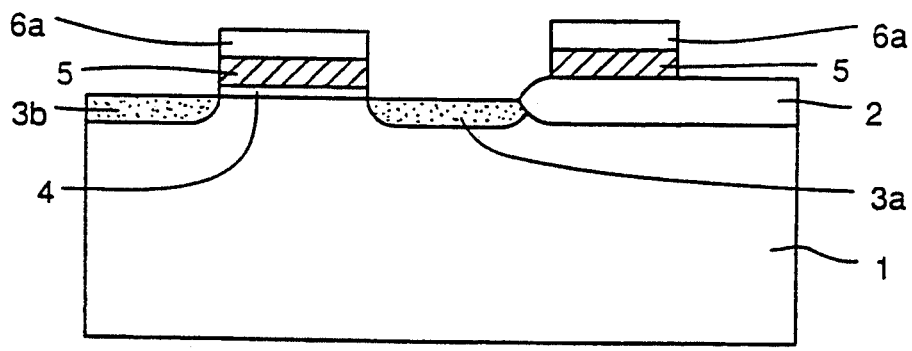
FIG. 3 is a cross-sectional view for use in illustration of a second step of the manufacturing process of the DRAM in accordance with the first embodiment shown in FIG. 1.

Then, as shown in FIG. 3, after a gate oxide film layer (not shown) is formed by thermal oxidation, a gate electrode layer (not shown) formed of polysilicon is formed by CVD. An oxide film layer (not shown) is formed on the gate electrode layer. Patterning by means of photolithography and etching techniques result gates oxide film 4, gate electrode 5, and oxide film 5a. Using gate electrode 5 and oxide film 6a as mask, oblique rotation ion implantation is conducted at 40–50 KeV, about $3 \times 10^3$ atoms/cm$^2$ to form source/drain regions 3a and 3b.

Figure 4:
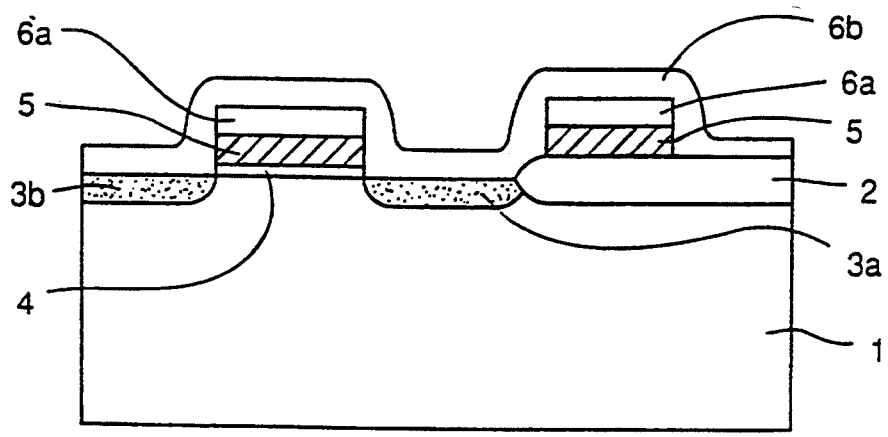
FIG. 4 is a cross-sectional view for use in illustration of a third step in the manufacturing process of the DRAM in accordance with the first embodiment shown in FIG. 1.
Figure 5:
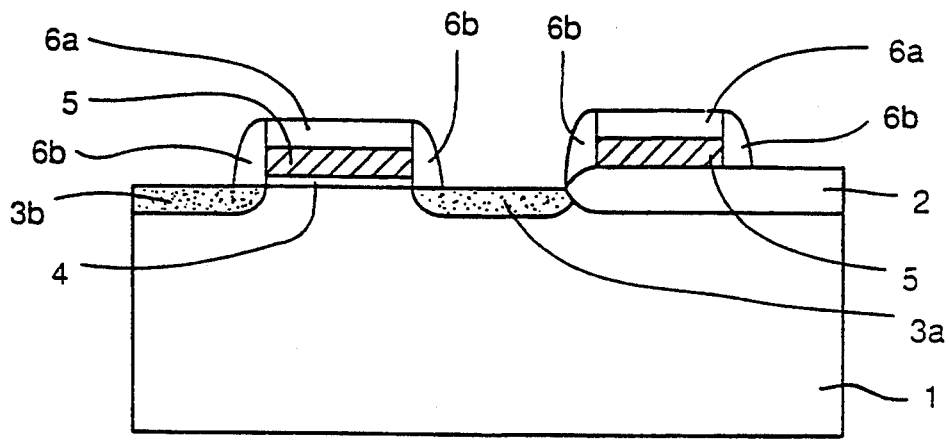
FIG. 5 is a cross-sectional view for use in illustration of a fourth step in the manufacturing process of the DRAM in accordance with the first embodiment shown in FIG. 1.

Then, as shown in FIG. 4, after formation of oxide film layer 6b on the entire surface, anisotropic etching is conducted to provide a sidewall oxide film 6b as shown in FIG. 5.

Figure 6:
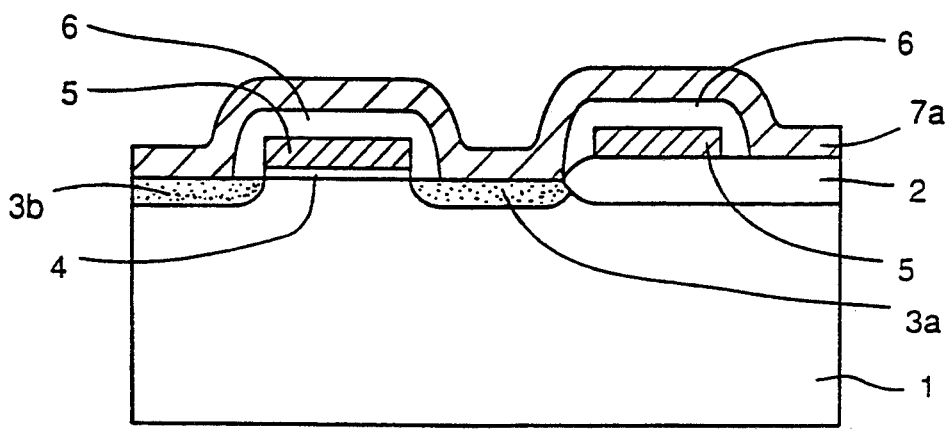
FIG. 6 is a cross-sectional view for use in illustration of a fifth step in the manufacturing process of the DRAM in accordance with the first embodiment shogun in FIG. 1.
Figure 7:
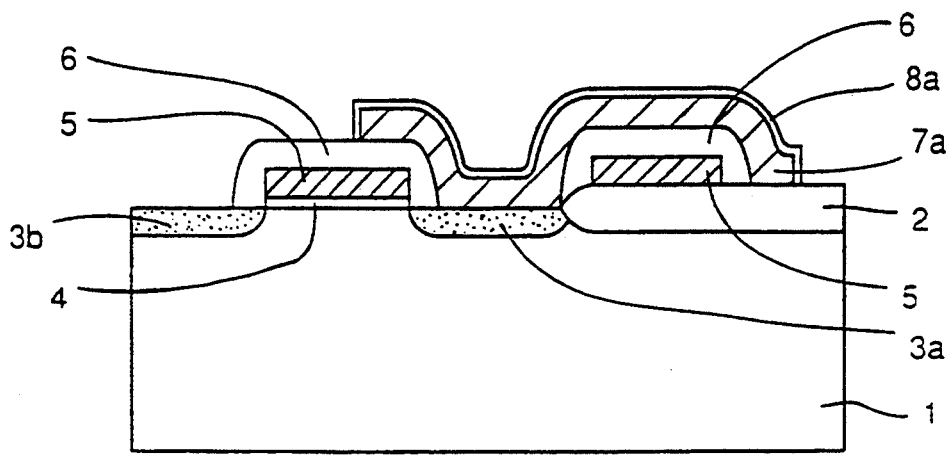
FIG. 7 is a cross-sectional view for use in illustration of a sixth step in the manufacturing process of the DRAM in accordance with the first embodiment shown in FIG. 1.

Then, as shown in FIG. 6, polysilicon layer 7a constituting a capacitor lower electrode having a thickness about in the range between 1000–2000 Å is formed on the entire surface by chemical vapor deposition at a temperature between 550°–650° C. Polysilicon layer 7a is patterned by means of photolithography and etching techniques, and capacitor lower electrode 7a as shown in FIG. 7 is obtained. The surface of capacitor lower electrode 7a is oxidized, to form $SiO_2$ film (capacitor insulating film) 8a. Capacitor insulating film 8a is formed to have a thickness about in the range between 30–200 Å. A two-layer film formed of $SiO_2$ and $Si_3N_4$ films may be used instead of $SiO_2$ film 8a.

Figure 8:
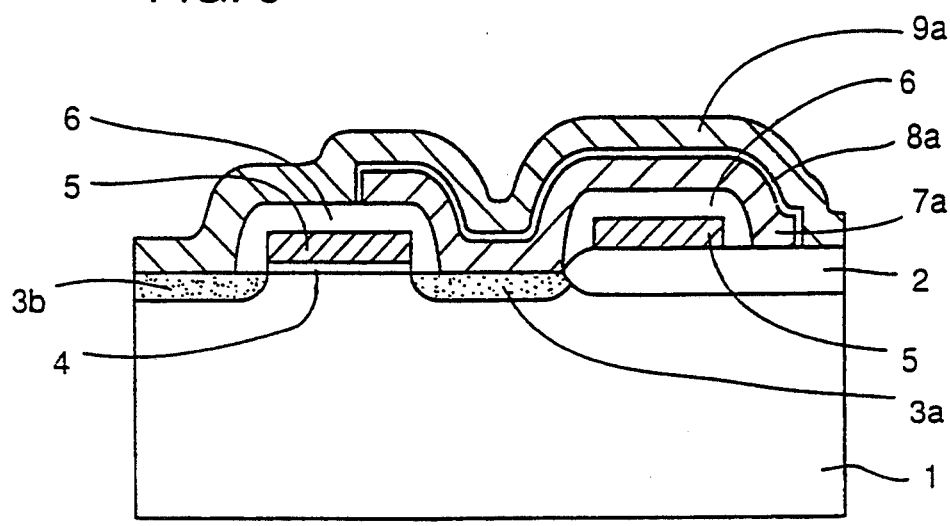
FIG. 8 is a cross-sectional view for use in illustration of a seventh step in the manufacturing process of the DRAM in accordance with the first embodiment shown in FIG. 1.
Figure 9:
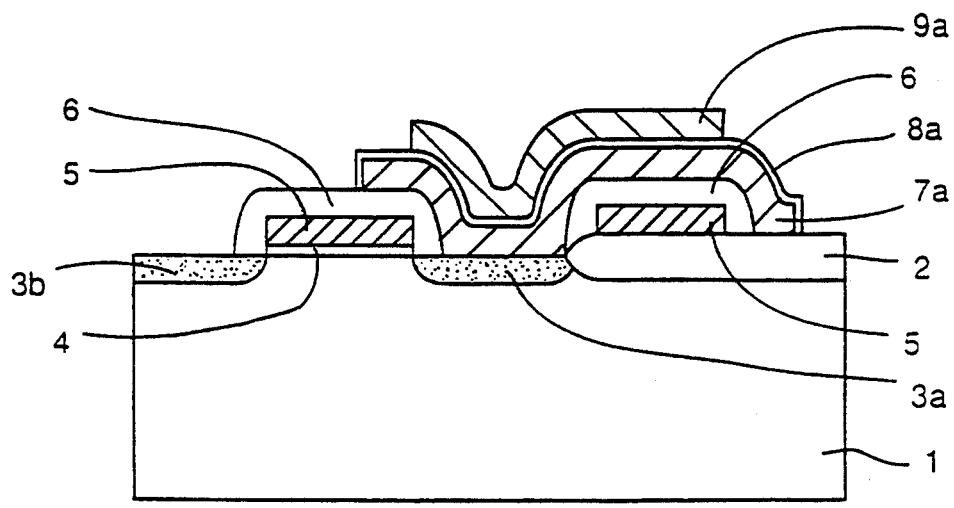
FIG. 9 is a cross-sectional view for use in illustration of an eighth step in the manufacturing process of the DRAM in accordance with the first embodiment shown in FIG. 1.

As shown in FIG. 8, after polysilicon layer 9a having a thickness about in the range between 1000–3000 Å is formed on the entire surface by means of chemical vapor deposition at a temperature between 500°–650° C., the formed polysilicon layer 9a is patterned to form capacitor upper electrode 9a in the lower layer as shown in FIG. 9.

Figure 10:
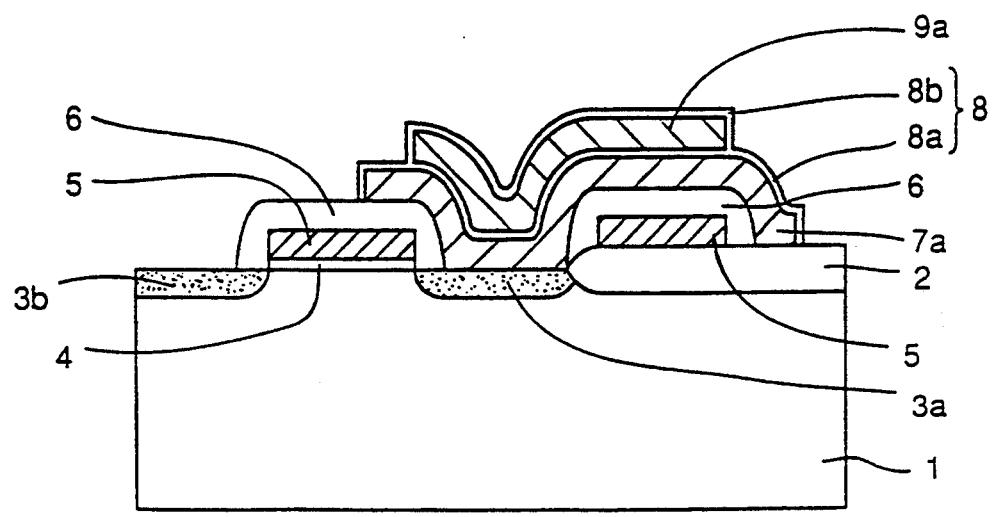
FIG. 10 is a cross-sectional view for use in illustration of a ninth step in the manufacturing process of the DRAM in accordance with the first embodiment shown in FIG. 1.

As shown in FIG. 10, the surface of capacitor upper electrodes 9a in the lower layer is oxidized, to form $SiO_2$ film (capacitor insulating film) 8b having a thickness in the range between 30–200 Å.

Figure 11:
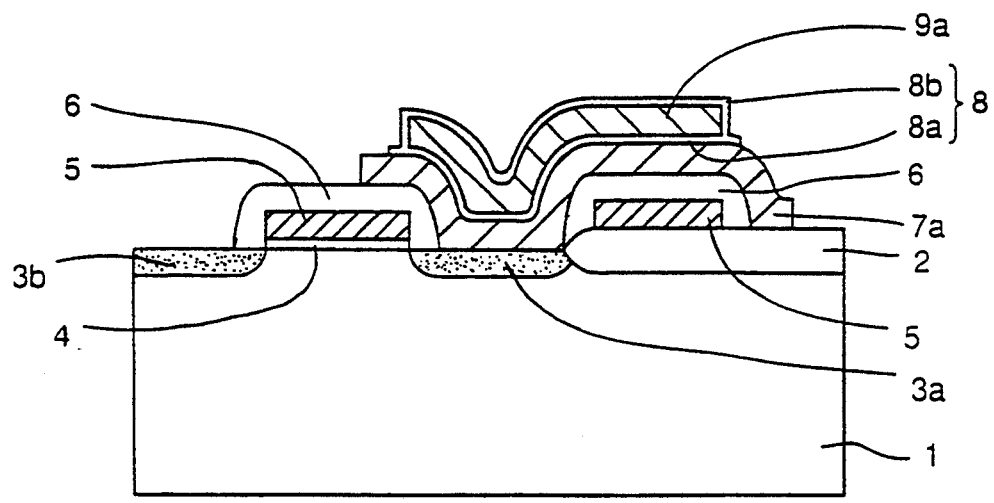
FIG. 11 is a cross-sectional view for use in illustration of a tenth step in the manufacturing process of the DRAM in accordance with the first embodiment shogun in FIG. 1.

As shown in FIG. 11, a prescribed part of capacitor insulating film 8a on which capacitor upper electrode 9a is not formed is removed among capacitor insulating film 8a, covering the surface of capacitor lower electrode 7a by means of photolithography and etching techniques. Thus, a prescribed surface portion of capacitor lower electrode 7a is exposed.

Figure 12:
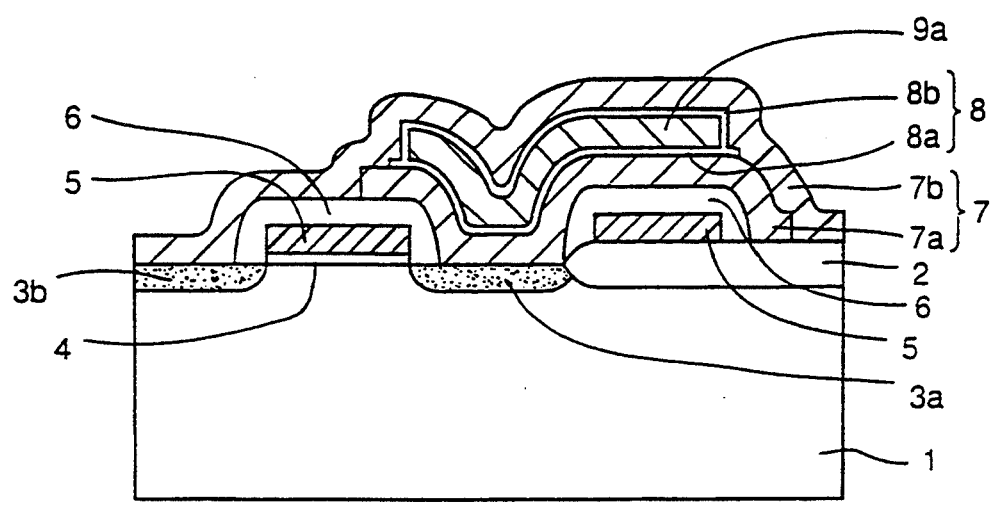
FIG. 12 is a cross-sectional view for use in illustration of an eleventh step in the manufacturing process of the DRAM in accordance with the first embodiment shogun in FIG. 1.

Then, as shown in FIG. 12, polysilicon layer 7b having a thickness about in the range between 1000–2000 Å is formed by means of chemical vapor deposition at a temperature between 550°–650° C. Polysilicon layer 7b is electrically connected to capacitor lower electrode 7a.

Figure 13:
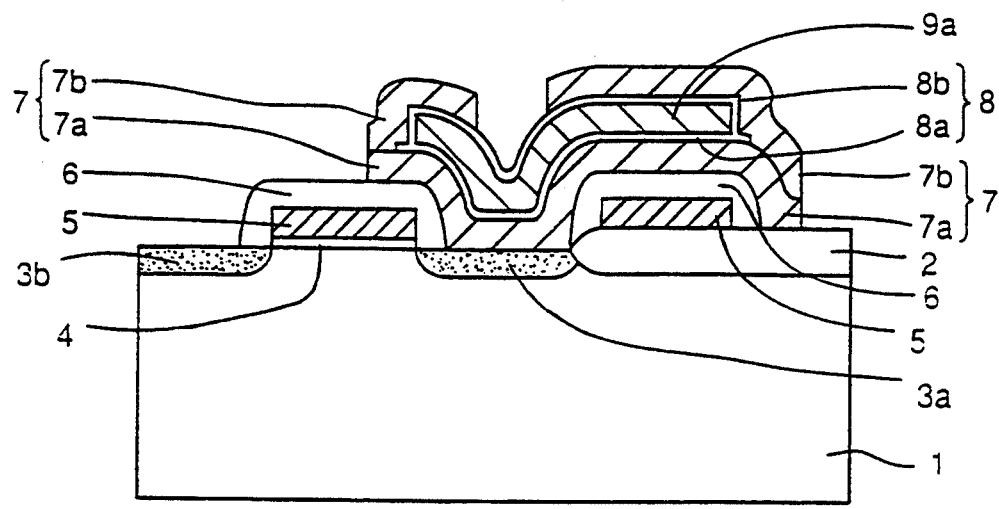
FIG. 13 is a cross-sectional view for use in illustration of a twelfth step in the manufacturing process of the DRAM in accordance with the first embodiment shown in FIG. 1.

As shown in FIG. 13, polysilicon layer 7b is patterned by photolithography and etching techniques, and capacitor lower electrode 7b in the upper layer is formed. Capacitor lower electrode 7b in the upper layer is patterned so as not to be formed in the region positioned over the central portion of capacitor upper electrode 9a in the lower layer.

Figure 14:
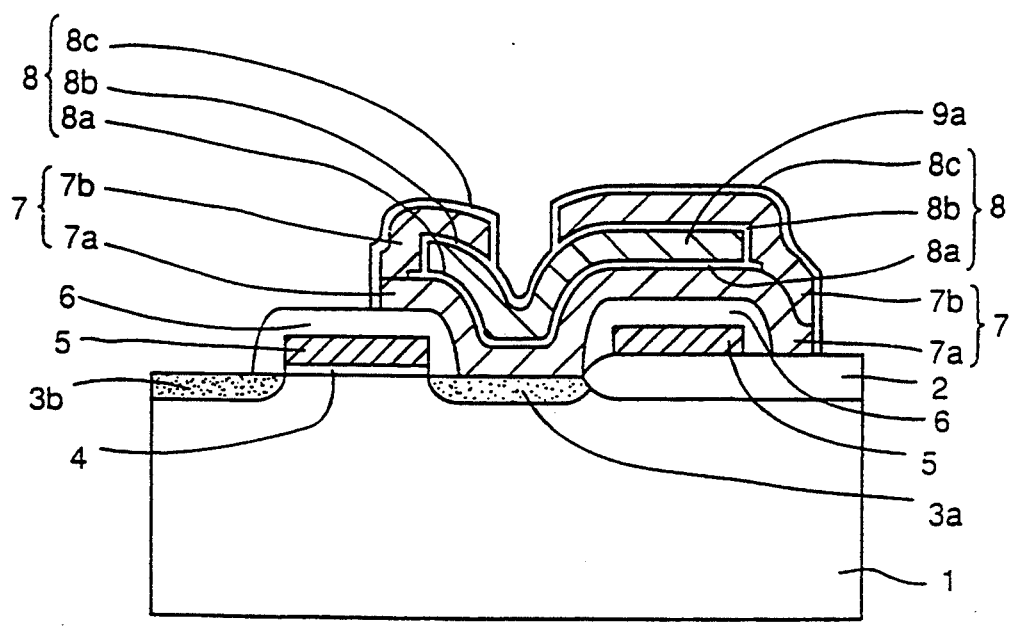
FIG. 14 is a cross-sectional view for use illustration of a thirteenth step in the manufacturing process of the DRAM in accordance with the first embodiment shown in FIG. 1.

As shown in FIG. 14, the surfaces of capacitor lower electrodes 7a and 7b are oxidized to form $SiO_2$ film (capacitor insulating film) 8c having a thickness about in the range between 30–300 Å.

Figure 15:
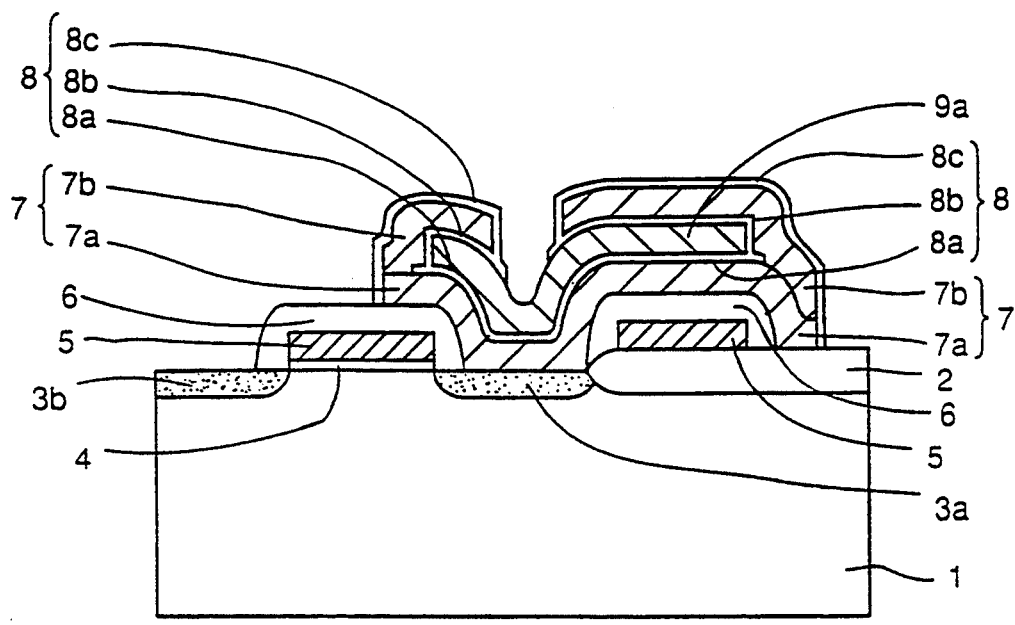
FIG. 15 is a cross-sectional view for use in illustration of a fourteenth step in the manufacturing process of the DRAM in accordance with the first embodiment shown in FIG. 1.

As shown in FIG. 15, a prescribed part of capacitor insulating film 8b on which capacitor lower electrode 7b is not formed is etched away. Thus, a prescribed region of the surface of the capacitor upper electrode 9a in the lower layer is exposed.

Figure 16:
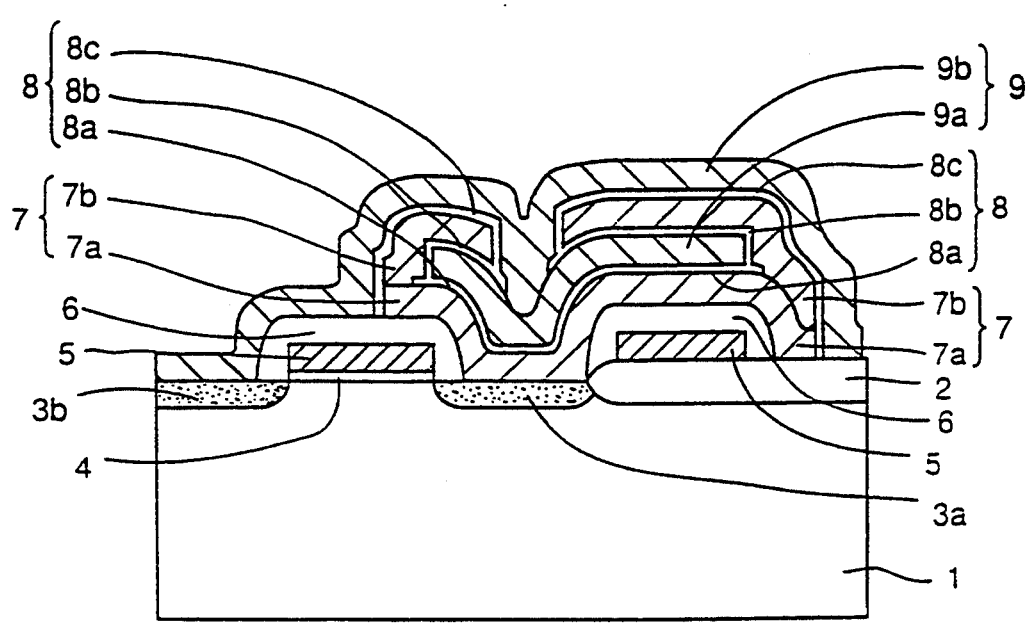
FIG. 16 is a cross-sectional view for use in illustration of a fifteenth step in the manufacturing process of the DRAM in accordance with the first embodiment shown in FIG. 1.

As shown in FIG. 16, polysilicon layer 9b having a thickness in the range between 1000–3000 Å is formed on the entire surface by chemical vapor deposition at a temperature between 550°–650° C.

Figure 17:
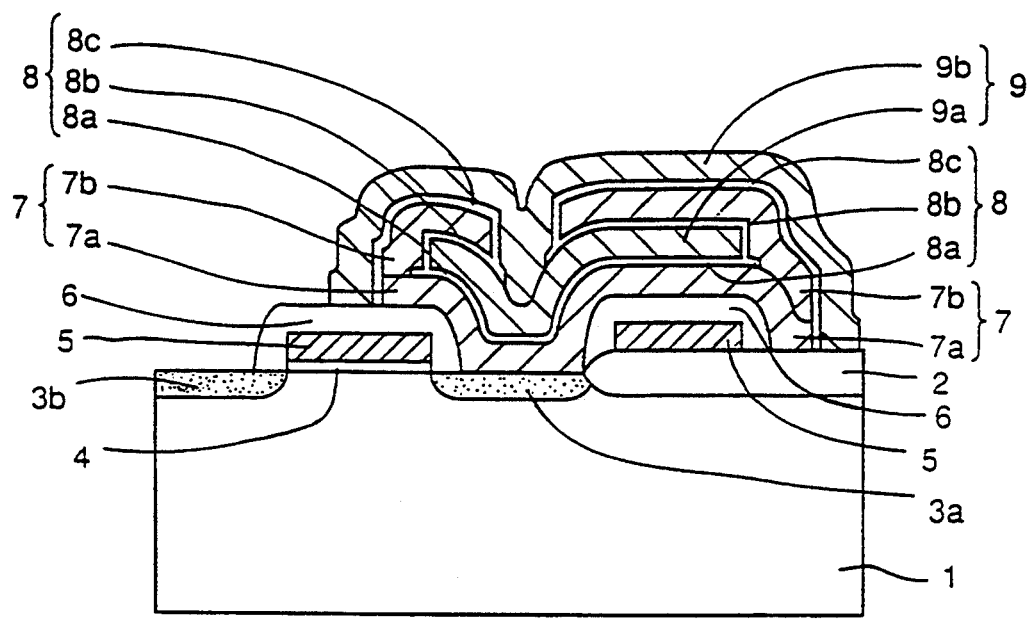
FIG. 17 is a cross-sectional view for use illustration of a sixteenth step in the manufacturing process of the DRAM in accordance with the first embodiment shown in FIG. 1.

Then as shown in FIG. 17, polysilicon layer 9b is patterned by photolithography and etching techniques and capacitor upper electrode 9b in the upper layer is formed. Capacitor upper electrode 9b in the upper layer is formed so as to cover the upper surface and both sidewalls of capacitor lower electrode 7b, and both sidewalls of capacitor lower electrode 7a. Thus, capacitor lower electrodes 7 (7a, 7b) and capacitor upper electrodes 9 (9a, 9b) are formed. More specifically, capacitor lower electrodes 7a and 7b are formed surrounding upper electrode 9a in the lower layer, and capacitor upper electrode 9b in the upper layer is formed covering the upper surface and both sides of capacitor lower electrode 7b, and both sides of capacitor lower electrode 7a.

Figure 18:
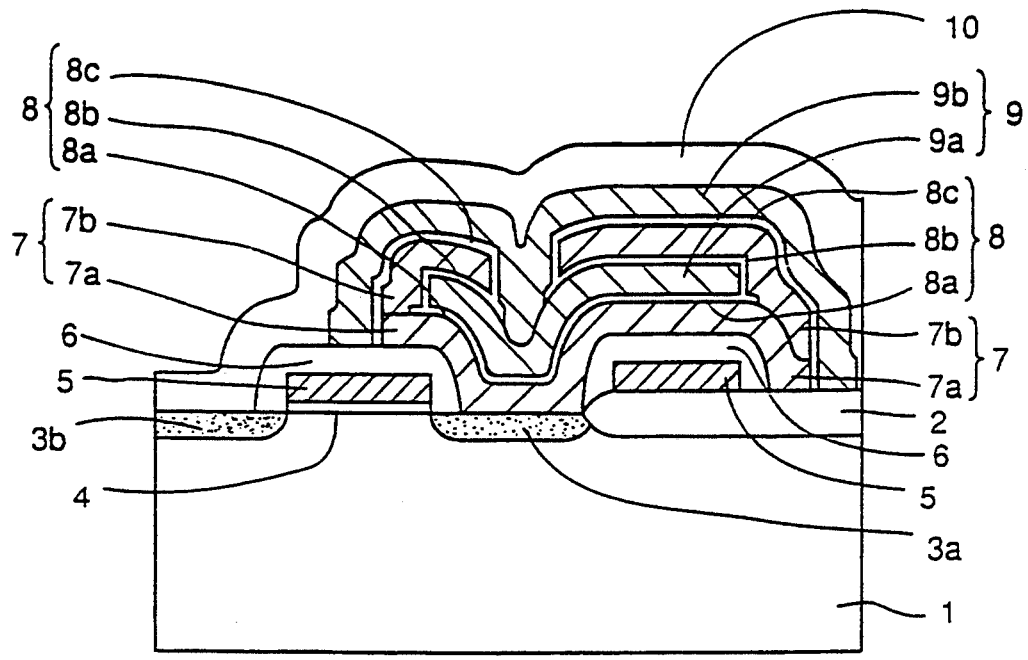
FIG. 18 is a cross-sectional view for use illustration of a seventeenth step in the manufacturing process of the DRAM in accordance with the first embodiment shown in FIG. 1.

Then, as shown in FIG. 18, interlayer insulating film is formed on the entire surface.

Figure 19:
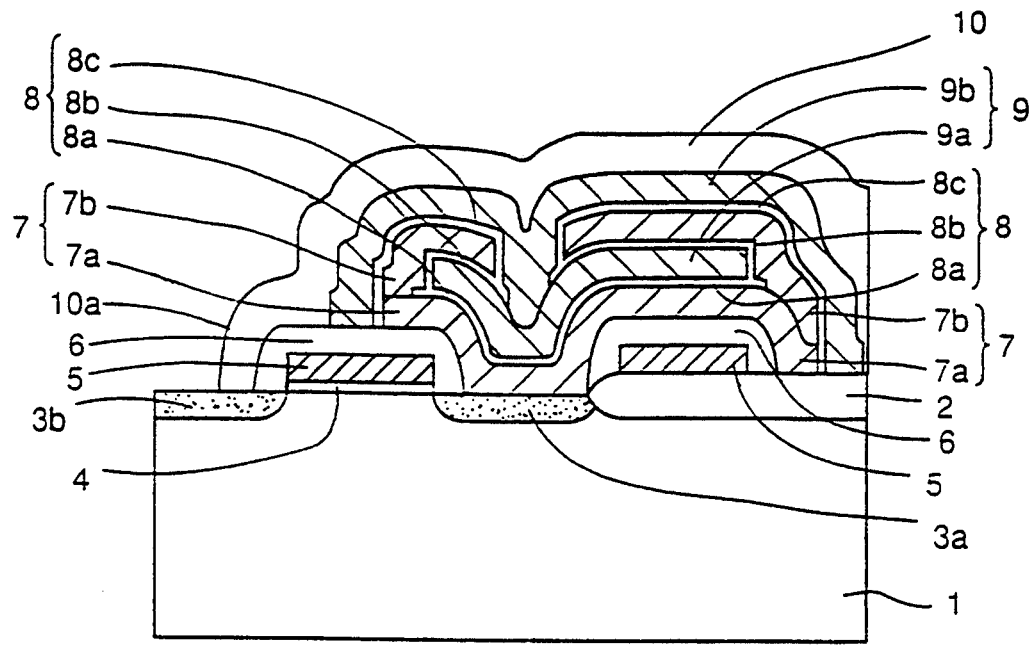
FIG. 19 is a cross-sectional view for use illustration of an eighteenth step in the manufacturing process of the DRAM in accordance with the first embodiment shown in FIG. 1.

As shown in FIG. 19, a contact hole 10a is formed in the region over the source/drain region 3b of interlayer insulating film 10 by means of photolithography and etching techniques.

Figure 20:
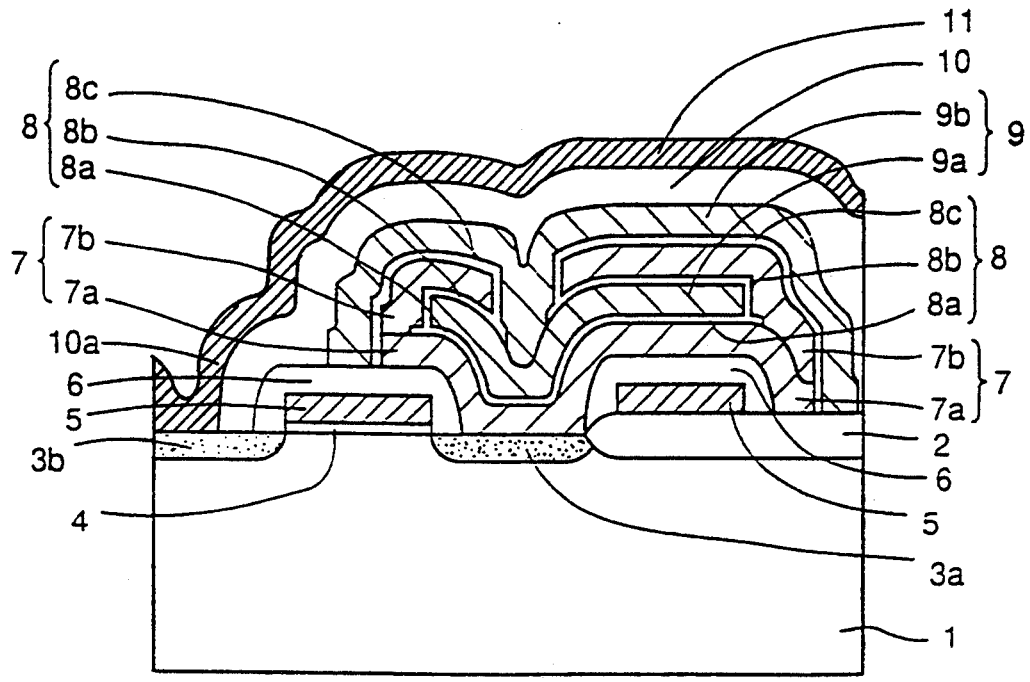
FIG. 20 is a cross-sectional view for use in illustration of an nineteenth step in the manufacturing process of the DRAM in accordance with the first embodiment shown in FIG. 1.

Then, as shown in FIG. 20, a bit line 11 formed of, for example, a two-layer film of polysilicon layers, or a polysilicon layer in a metal silicide layer.

Finally, as shown in FIG. 1, interlayer insulating film 12 formed of a PSG film or a TEOS film is formed. The surface of interlayer insulating film 12 is planarized by reflow or etch back methods. Aluminum interconnections 13 are formed a prescribed distance apart from each other and corresponding to gate electrode 5 on interlayer insulating film 12. Thus, the DRAM in accordance with the first embodiment of the present invention is completed. Capacitor lower electrode 7 (7a, 7b), capacitor upper electrode 9 (9a, 9b), and capacitor insulating film 8 (8a, 8b, 8c) are formed by the same steps as in a conventional method of forming a film, and readily formed by conducting such a conventional method of film formation a number of times.

Figure 21:
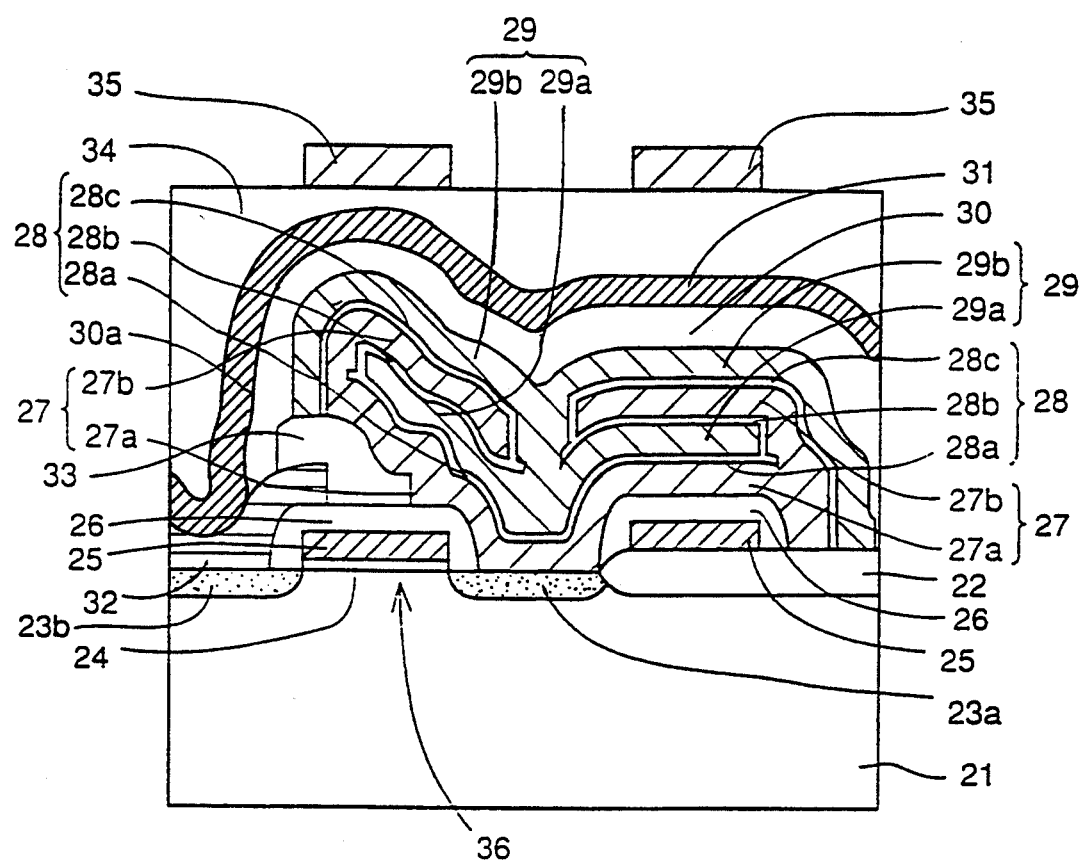
FIG. 21 is a cross-sectional view showing a structure of a DRAM including a stacked type capacitor in accordance with a second embodiment of the present invention.

Referring to FIG. 21, a DRAM in accordance with a second embodiment includes a P type silicon substrate 21, a field oxide film 22 formed in a prescribed region on the main surface of P type silicon substrate 21 for element isolation, a pair of source/drain regions 23a and 23b formed a prescribed distance apart from each other and holding therebetween a channel region 36 in an active region surrounded by field oxide film 22, a gate electrode 25 formed on channel region 36 with a gate oxide film 24 therebetween, an interlayer insulating film 26 formed covering gate electrode 25, a capacitor lower electrode 27 (27a, 27b) electrically connected to source/drain region 23a, a capacitor insulating film 28 (28a, 28b, 28c) formed on the surface of capacitor lower electrode 27, a capacitor upper electrodes 29 (29a, 29b) formed on the surface of capacitor insulating film 28, a pad layer 32 formed of polysilicon electrically connected to source/drain region 23b and extending over gate electrode 25 with interlayer insulating film 26 therebetween, a silicon oxide film 33 formed for insulation between pad layer 32, capacitor lower electrode 27, and capacitor upper electrode 29, an interlayer insulating film 30 formed to cover capacitor upper electrode 29 and having a contact hole 30a in pad layer 32, a bit line 31 formed of a two-layer film of polysilicon layers or a polysilicon layer and a metal silicide layer electrically connected to pad layer 32 in contact hole 30a and formed extending along the surface of interlayer insulating film 30, an interlayer insulating film 34 formed covering the entire surface and having its surface planarized, and aluminum interconnections 35 formed a prescribed distance apart from each other on interlayer insulating film 34 and corresponding to gate electrode 25.

Source/drain regions 23a and 23b, and gate electrode 25 constitute the transfer gate transistor of the memory cell. Capacitor lower electrode 27, capacitor insulating film 28, and capacitor upper electrode 29 constitute a capacitor for storing charge corresponding to a data signal. Capacitor lower electrodes 27a and 27b are each formed to have a thickness about in the range between 1000-2000 Å. Capacitor insulating films 28a, 28b, and 28c are each formed to have a thickness about in the range between 30-200 Å. Capacitor upper electrodes 29a and 29b are each formed to have a thickness in the range between 1000-3000 Å. Capacitor lower electrode 27 and capacitor upper electrode 29 are both formed of polysilicon layers.

According to the second embodiment, as is the case with the first embodiment shown in FIG. 1, capacitor upper electrode 29a in the lower layer is formed extending in the direction along the main surface of P type silicon substrate 21. Capacitor upper electrode 29a in the lower layer and capacitor upper electrode 29b in the upper layer are electrically connected at their central portions. Capacitor upper electrode 29a in the lower layer is formed to be surrounded by capacitor lower electrode 27 ( 27a, 27b). Capacitor upper electrode 29b in the upper layer is formed so as to cover the upper surface and both sidewalls of capacitor lower electrode 27b and both sidewalls of capacitor lower electrode 27a.

As opposed to the first embodiment shown in FIG. 1, in the second embodiment, pad layer 32 is interposed between bit line 31 and source/drain region 23b. Silicon oxide film 33 is formed to cover an end of pad layer 32. Thus, capacitor lower electrode 27a is formed to lie over silicon oxide film 33. As a result, a stepped portion corresponding to silicon oxide film 33 is generated to capacitor lower electrode 27a and a capacitor capacity is increased by the amount of the stepped portion as compared to the first embodiment shown in FIG. 1. Accordingly, in the structure of the second embodiment, the capacitor capacity can further be increased as compared to the first embodiment structure as shown in FIG. 1. Also in the second embodiment, the tolerance of the contact position of bit line 31 is expanded, the stepped portion of bit line 31 is reduced thus facilitating formation of bit line 31.

Referring to FIGS. 21-27, a description of a manufacturing process of the DRAM in accordance with the second embodiment follows .

Figure 22:
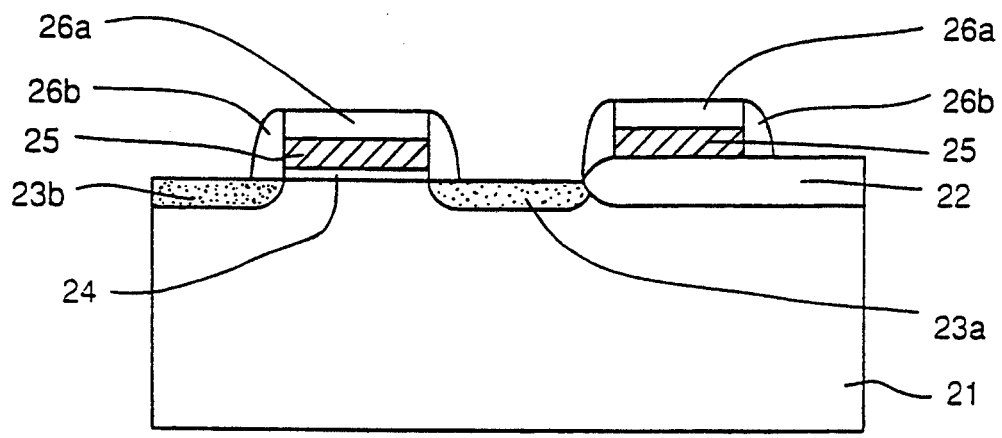
FIG. 22 is a cross-sectional view for use in illustration of a first step of the manufacturing process in accordance with the second embodiment shown in FIG. 21.

As shown in FIG. 22, field oxide film 22 for element isolation is formed in a prescribed region on the main surface of P type silicon substrate 21 by means of thermal oxidation. Gate oxide film 24, gate electrode 25, and oxide film 26a on gate electrode 25 are formed. Then, ion implantation is conducted using them as masks to form source/drain regions 23a and 23b. This ion implantation is conducted by mean of oblique rotation ion implantation with phosphorus (P) at 40-50 KeV, about $3 \times 10^3$ atoms/cm$^2$. Then, a sidewall oxide film 26b is formed on the sidewall portion of gate electrode 25 . Thus, interlayer insulating film 26 (26a, 26b) is formed to cover gate electrode 25.

Figure 23:
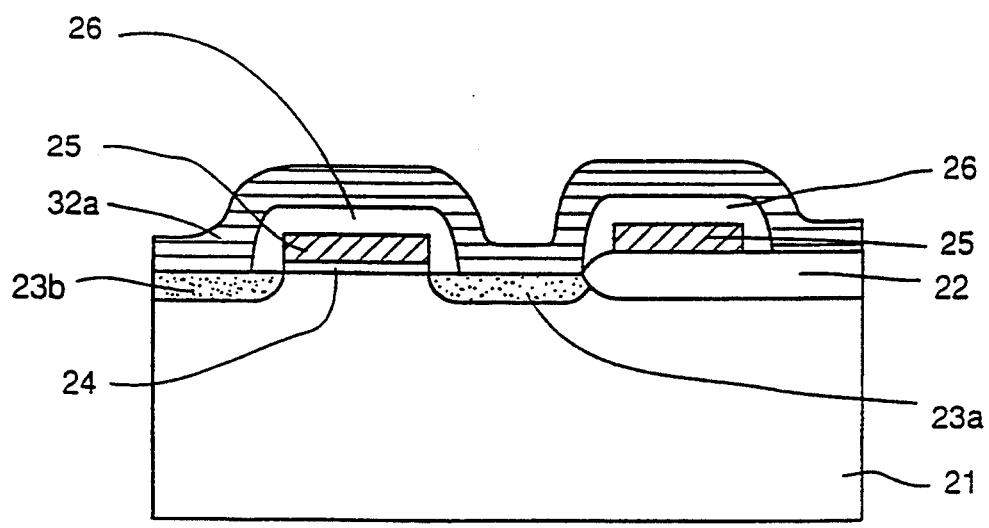
FIG. 23 is a cross-sectional view for use in illustration of a second step of the manufacturing process in accordance with the second embodiment shown in FIG. 21.

Then, as shown in FIG. 23, polysilicon layer 32a is formed by means of chemical vapor deposition.

Figure 24:
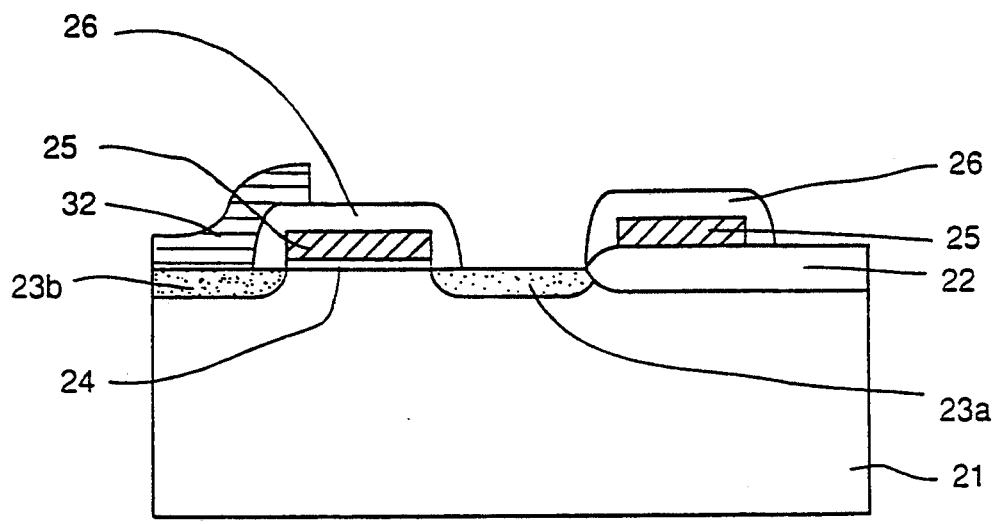
FIG. 24 is a cross-sectional view for use in illustration of a third step of the manufacturing process in accordance with the second embodiment shown in FIG. 21.

As shown in FIG. 24, polysilicon layer 32a (see FIG. 23) is patterned by photolithography and etching techniques to form pad layer 32.

Figure 25:
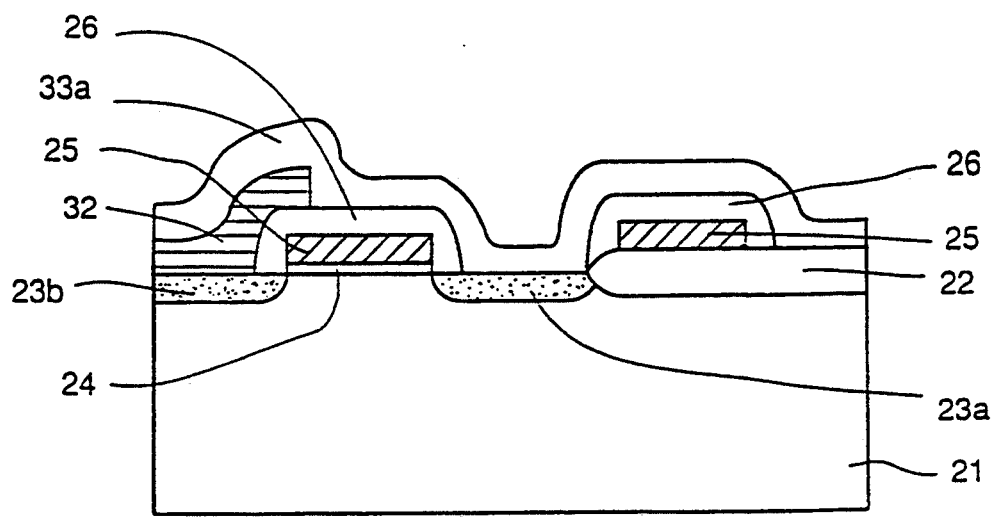
FIG. 25 is a cross-sectional view for use in illustration of a fourth step of the manufacturing process in accordance with the second embodiment shown in FIG. 21.

As shown in FIG. 25, silicon oxide film layer 33a is formed on the entire surface.

Figure 26:
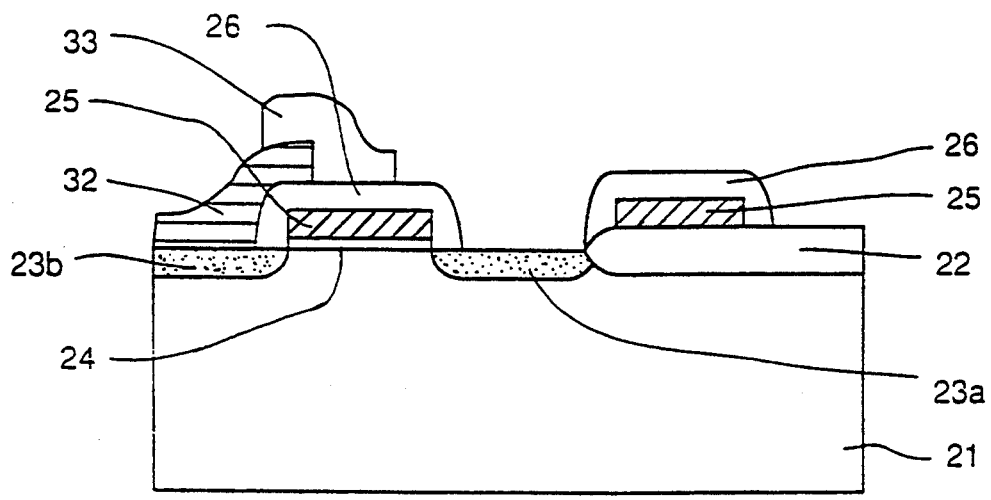
FIG. 26 is a cross-sectional view for use in illustration of a fifth step of the manufacturing process in accordance with the second embodiment shown in FIG. 21.
Figure 27:
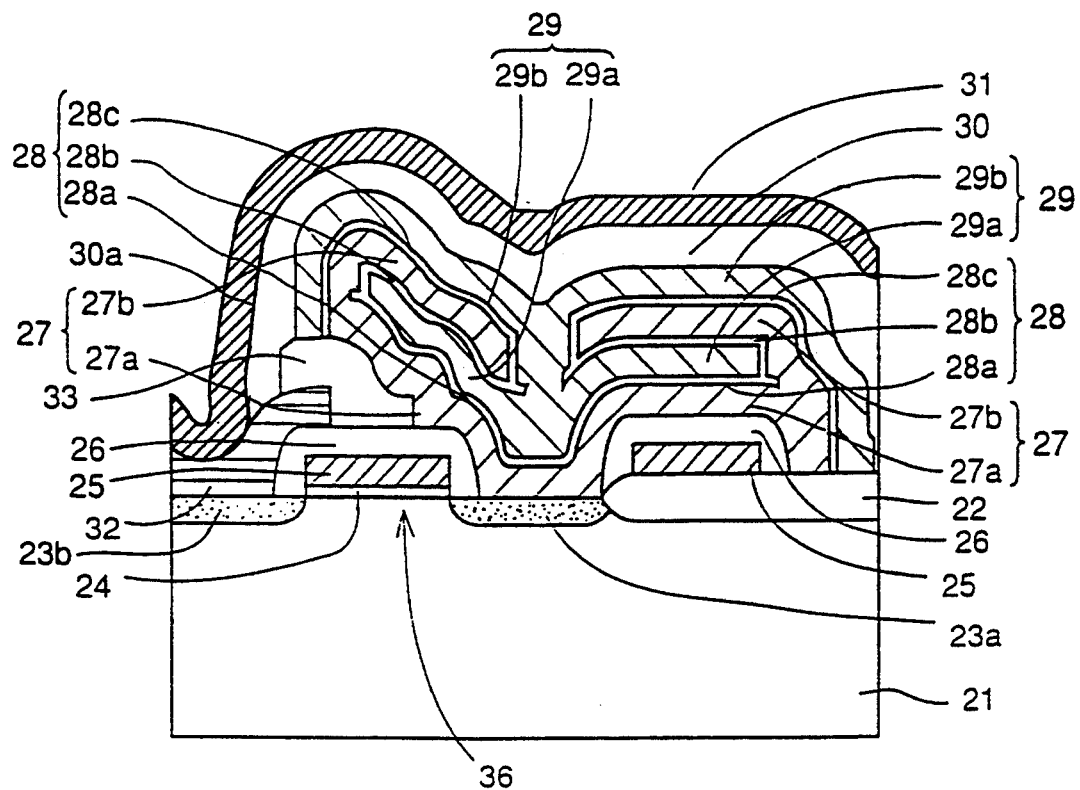
FIG. 27 is a cross-sectional view for use in illustration of a sixth step of the manufacturing process in accordance with the second embodiment shown in FIG. 21.

As shown in FIG. 26, silicon oxide film layer 33a is patterned by photolithography and etching techniques, and silicon oxide film 33 is formed so as to cover an end of pad layer 32. Then, using a manufacturing process identical to the manufacturing process of the first embodiment shown in FIGS. 6-20, a structure as shown in FIG. 27 is provided. As shown in FIG. 21, after interlayer insulating film 34 is formed, aluminum interconnections 35 are formed, thus completing the DRAM of the second embodiment.

Figure 28:
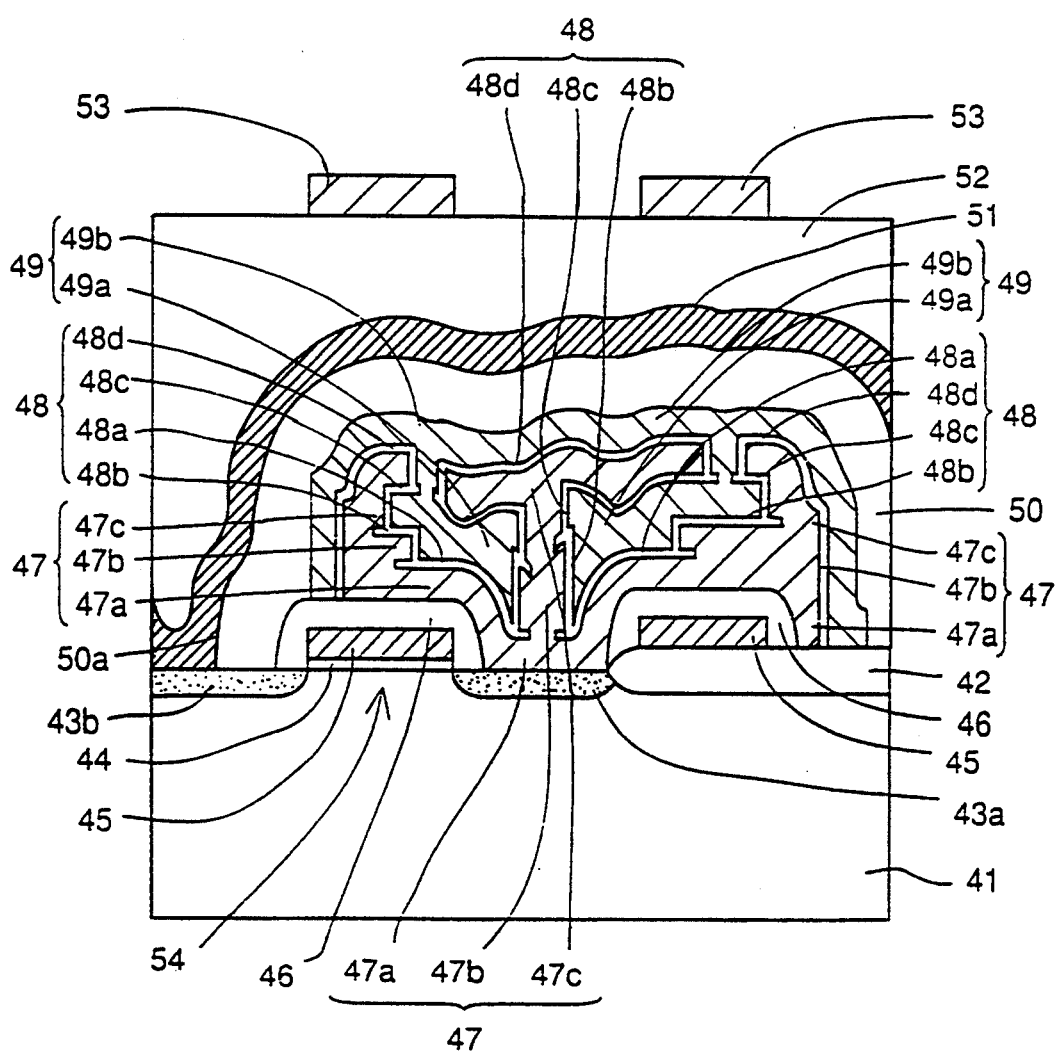
FIG. 28 is a cross-sectional view showing a DRAM including a stacked type capacitor in accordance with a third embodiment of the present invention.

Referring to FIG. 28, a DRAM in accordance with a third embodiment includes a P type silicon substrate 41, a field oxide film 42 formed in a prescribed region on the surface of P type silicon substrate 41 for element isolation, source/drain regions 43a and 43b formed a prescribed distance apart from each other and holding therebetween a channel region 54 in an active region surrounded by field oxide film 42, a gate electrode 45 formed on channel region 54 with a gate oxide film 44 therebetween, an interlayer insulating film 46 formed covering gate electrode 45, a capacitor lower electrode 47 (47a, 47b, 47c) electrically connected to source/drain region 43a, a capacitor insulating film 48 (48a, 48b, 48c, 48d) formed on the surface of capacitor lower electrode 47, a capacitor upper electrode 49 (49a, 49b) formed on the surface of capacitor insulating film 48, an interlayer insulating film 50 formed to cover capacity upper electrode 49 and having a contact hole 50a on source/drain region 43b, a bit line 51 electrically connected to source/drain region 43b in contact hole 50a and extending along the surface of interlayer insulating film 50, an interlayer insulating film 52 of a PSG film or a TEOS film formed to cover the entire surface and having its surface and planarized, and aluminum interconnections formed on interlayer insulating film 52 and corresponding to gate electrode 45.

Source/drain regions 43a and 43b, and gate electrode 45 constitute the transfer gate transistor of a memory cell. Capacitor lower electrode 47 and capacitor upper electrode 49 are both formed of polysilicon layers. Capacitor insulating film 48 is formed of a multi-layer film of $SiO_2$ films or $SiO_2$ and $Si_3N_4$ films.

Capacitor lower electrode 47 is formed of a capacitor lower electrode 47a in a first layer, a capacitor lower electrode 47b in a second layer, and a capacitor lower electrode 47c in a third layer, while capacitor upper electrode 49 is formed of a capacitor upper electrode 49a in a first layer and a capacitor upper electrode 49b in a second layer. Capacitor upper electrode 49b in the second layer and capacitor upper electrode 49a in the first layer are electrically connected at two points. Capacitor lower electrode 47 is formed of three portions extending in the vertical direction to the main surface of P type silicon substrate 41, and capacitor lower electrode 47 in the central portion is formed in a P type. Capacitor lower electrode 47 is formed to surround capacitor upper electrode 49a in the first layer.

According to the third embodiment, capacitor lower electrode 47 is of a three-layer structure of the first, second, and third layers, and, therefore, its height from the surface of P type silicon substrate 41 is larger than the embodiment shown in FIG. 1. As a result, the facing area between capacitor lower electrode 47 and capacitor upper electrode 49 can further be increased as compared to the first embodiment shown in FIG. 1. Accordingly, a capacitor capacity about three-four times as large as the conventional DRAM shown in FIG. 69 in the same plane area can be provided. Therefore, according to third embodiment, even if elements are further reduced in size in accordance with high intensity integration of semiconductor devices, capacitor capacity necessary for maintaining stable storage of data can be secured. The thicknesses of capacitor lower electrodes 47a, 47b and, 47c are each in the range between 1000-2000 Å and the thicknesses of capacitor upper electrodes 49a and 49b are each in the range between 1000–3000 Å. The thicknesses of capacitor insulating films 48a, 48b, 48c, and 48d are each approximately in the range between 30–200 Å.

Referring to FIGS. 28–47, a description of a manufacturing process of the DRAM in accordance with the third embodiment follows.

Figure 29:
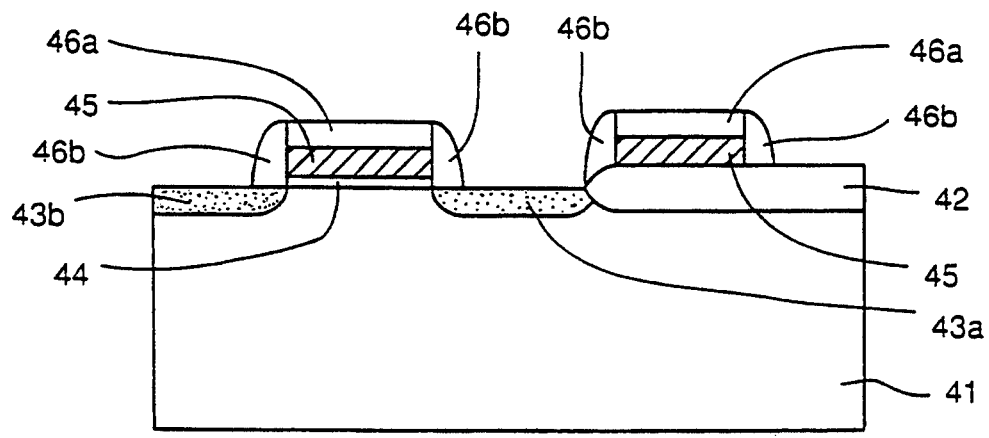
FIG. 29 is a cross-sectional view for use in illustration of a first step of a manufacturing process of the DRAM in accordance with the third embodiment shown in FIG. 28.

Referring to FIG. 29, field oxide film 42 is formed on P type silicon substrate 41 by means of thermal oxidation. After a gate oxide film layer (not shown) is formed by thermal oxidation, a gate electrode layer (not shown) formed of polysilicon is formed. Then, an oxide film layer (not shown) is formed on the gate electrode layer. These layers are patterned by means of photolithography and etching techniques, and gates oxide film 44, gate electrode 44, and oxide film 46a are formed. Using gate oxide film 44, gate electrode 44, and oxide film 46a are formed. Using gate oxide film 44, gate electrode 45, and oxide film 46a as mask, oblique rotation ion implantation is conducted at 40–50 KeV, about $3 \times 10^3$ atoms/cm$^2$, and source/drain regions 43a and 43b are formed. After formation of an oxide film (not shown) on the entire surface, anisotropic etching is conducted to form a sidewall oxide film 46b on the sidewalls of gate electrode 45a and oxide film 46a. Thus, an interlayer insulating film 46 formed of oxide film 46a and sidewall oxide film 36b is formed.

Figure 30:
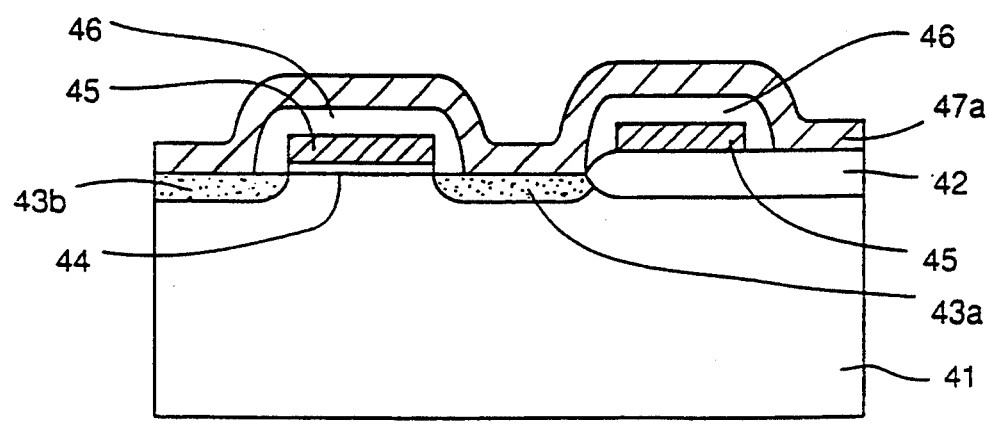
FIG. 30 is a cross-sectional view for use in illustration of a second step of the manufacturing process of the DRAM in accordance with the third embodiment shown in FIG. 28.

As shown in FIG. 30, polysilicon layer (capacitor lower electrode in the first layer) 47a having a thickness in the range between 1000–2000 Å is formed by means of CVD at a temperature between 550°–650° C.

Figure 31:
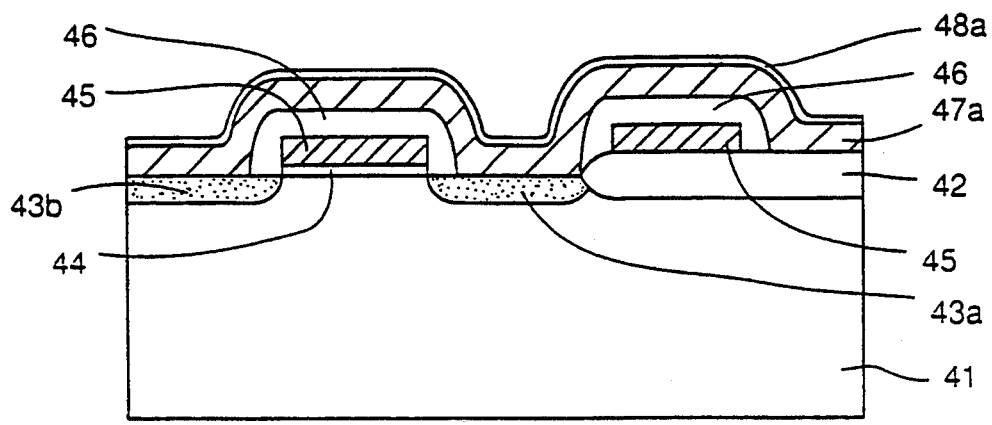
FIG. 31 is a cross-sectional view for use in illustration of a third step of the manufacturing process of the DRAM in accordance with the third embodiment shown in FIG. 28.

Then, as shown in FIG. 31, silicon oxide film (capacitor insulating film in the first layer) having a thickness in the range between 30–200 Å is formed on the surface of capacitor lower electrode 47a in the first layer by means of thermal oxidation.

Figure 32:
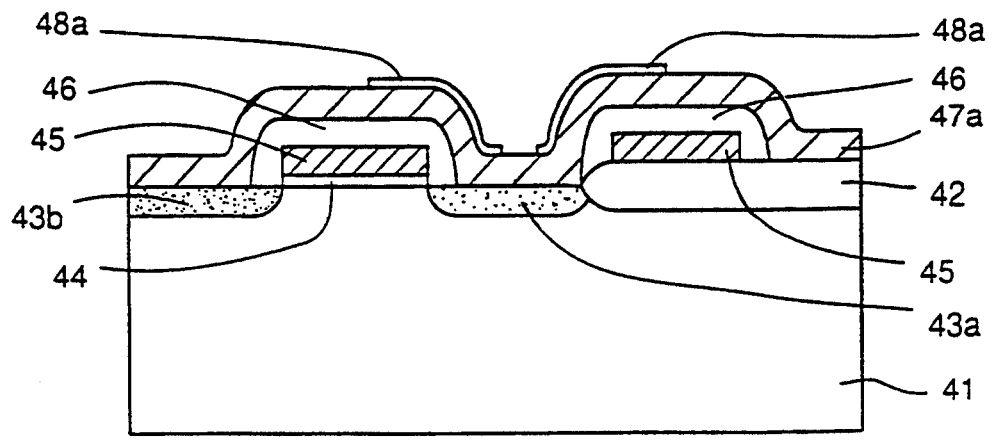
FIG. 32 is a cross-sectional view for use in illustration of a fourth step of the manufacturing process of the DRAM in accordance with the third embodiment shown in FIG. 28.

As shown in FIG. 32, capacitor insulating film 48a in the first layer is patterned by means of photolithography and etching techniques.

Figure 33:
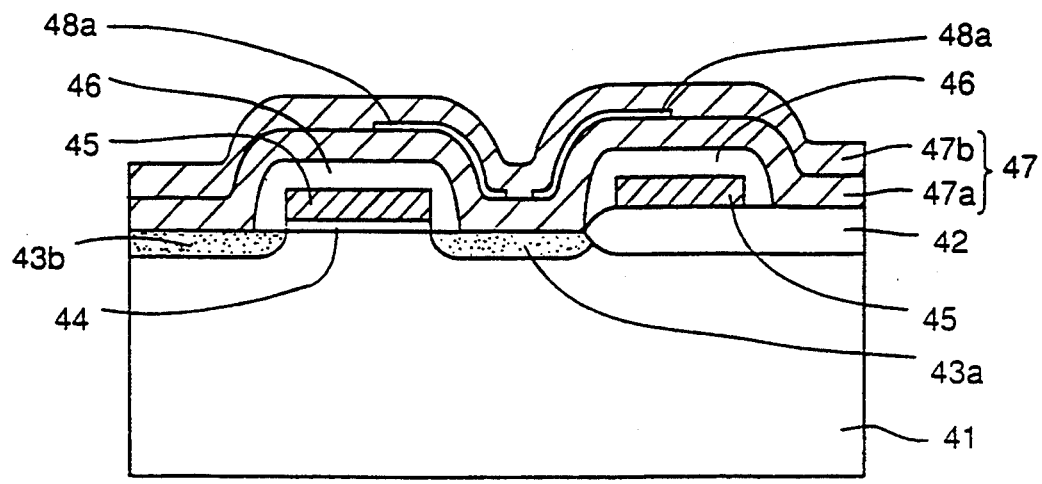
FIG. 33 is a cross-sectional view for use in illustration of a fifth step of the manufacturing process of the DRAM in accordance with the third embodiment shown in FIG. 28.

As shown in FIG. 33, polysilicon layer (capacitor lower electrode) 47b having a thickness about in the range 1000–2000 Å is formed by chemical vapor deposition at a temperature between 500°–650° C.

Figure 34:
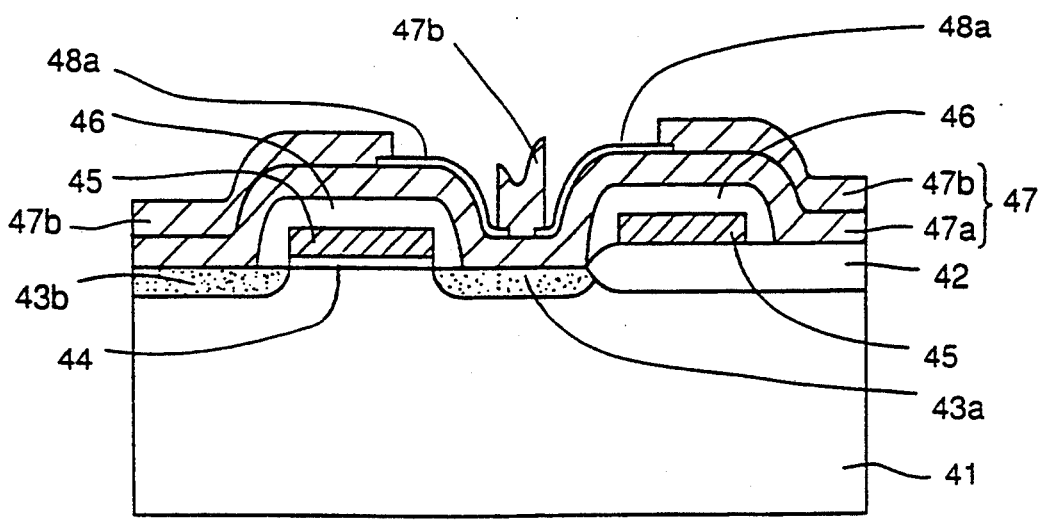
FIG. 34 is a cross-sectional view for use in illustration of a sixth step of the manufacturing process of the DRAM in accordance with the third embodiment shown in FIG. 28.

As shown in FIG. 34, capacitor lower electrode 47b in the second layer positioned on capacitor insulating film 48a in the first layer is removed by photolithography and etching techniques.

Figure 35:
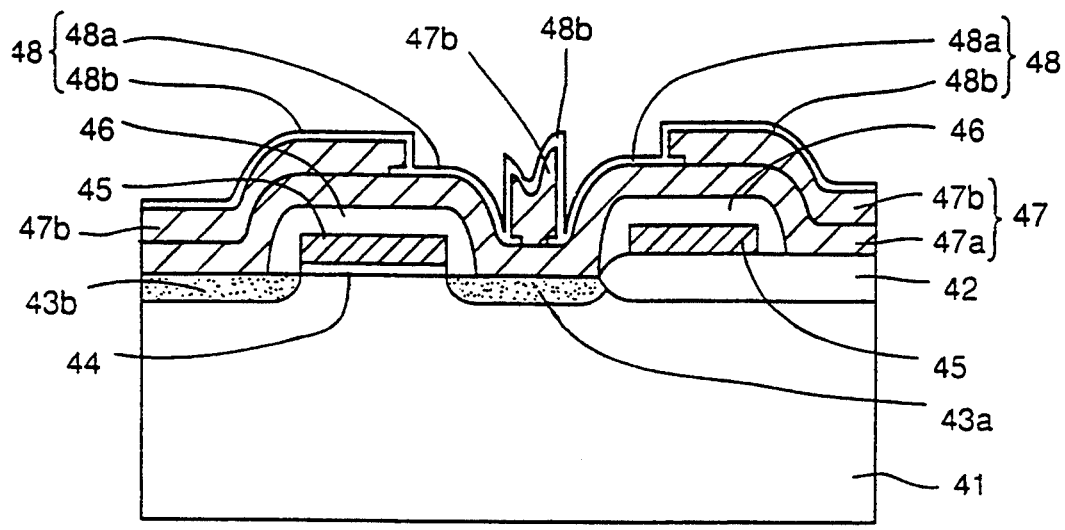
FIG. 35 is a cross-sectional view for use in illustration of a seventh step of the manufacturing process of the DRAM in accordance with the third embodiment shown in FIG. 28.

As shogun in FIG. 35, the surface of capacitor lower electrode 47b in the second layer is oxidized to form silicon oxide film (capacitor insulating film in the second layer) 48b having a thickness in the range between 30–200 Å. Thus capacitor insulating film 48a in the first layer and capacitor insulating film 48b in the second layer are connected with each other.

Figure 36:
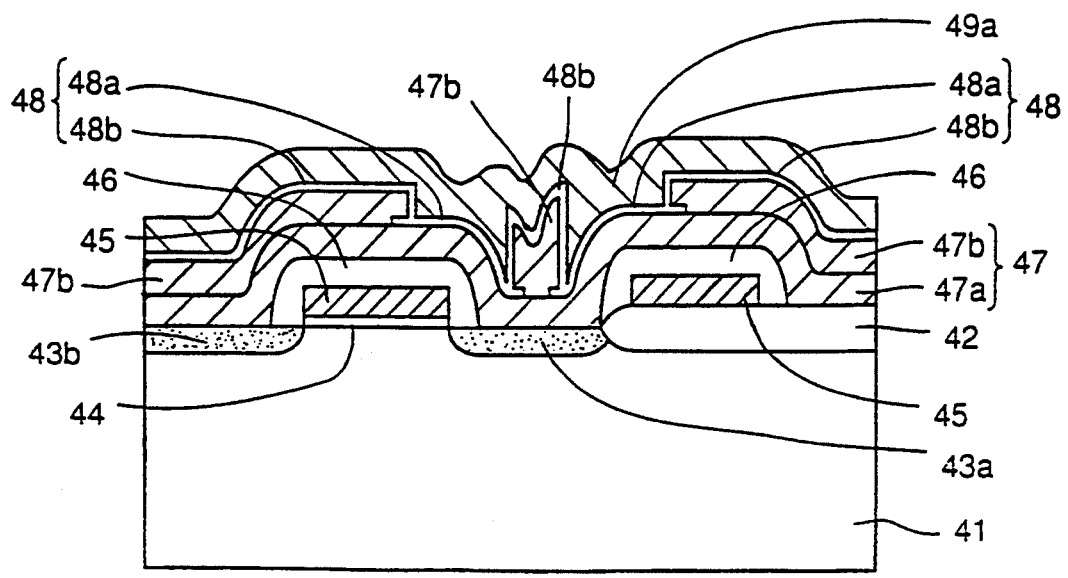
FIG. 36 is a cross-sectional view for use in illustration of an eighth step of the manufacturing process of the DRAM in accordance with the third embodiment shown in FIG. 28.

As shown in FIG. 36, polysilicon layer (capacitor upper electrode in the first layer) 49a having a thickness about in the range between 1000–3000 Å is formed by chemical vapor deposition at a temperature between 550°–650°.

Figure 37:
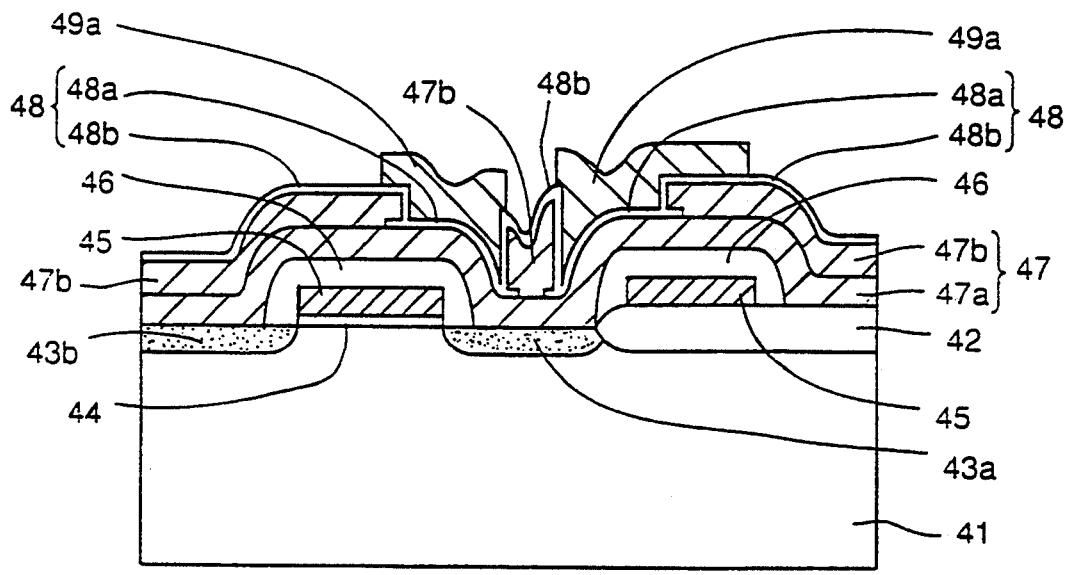
FIG. 37 is a cross-sectional view for use in illustration of a ninth step of the manufacturing process of the DRAM in accordance with the third embodiment shown in FIG. 28.

As shown in FIG. 37, capacitor upper electrode 49a in the first layer is patterned into a prescribed form using photolithography and etching techniques. More specifically, a prescribed part of capacitor upper electrode 49a in the first layer in the region positioned over capacitor lower electrode 47b in the second layer is removed.

Figure 38:
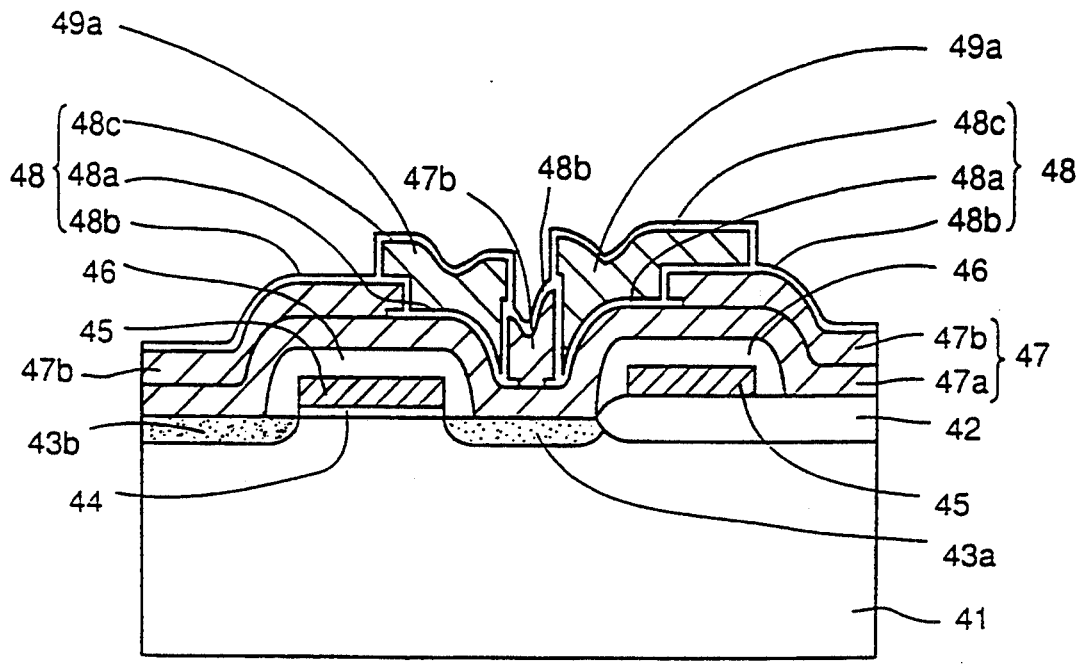
FIG. 38 is a cross-sectional view for use in illustration of a tenth step of the manufacturing process of the DRAM in accordance with the third embodiment shown in FIG. 28.

Then, as shown in Fig. 38, silicon oxide film (capacitor insulating film in the third layer) 48c having a thickness about in the range between 30–200 Å is formed on the surface of capacitor upper electrode 48c in the first layer by means of thermal oxidation.

Figure 39:
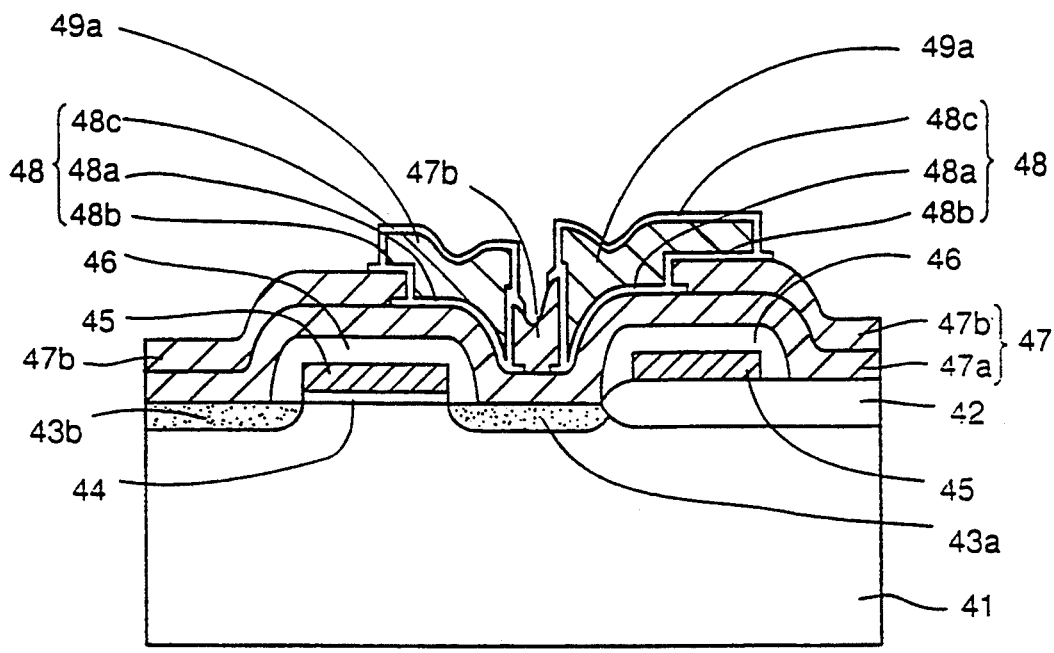
FIG. 39 is a cross-sectional view for use in illustration of an eleventh step of the manufacturing process of the DRAM in accordance with the third embodiment shown in FIG. 28.

Then, as shown in FIG. 39, capacitor insulating film 48b in the second layer positioned in the periphery of capacitor upper electrode 49a in the first layer is formed.

Figure 40:
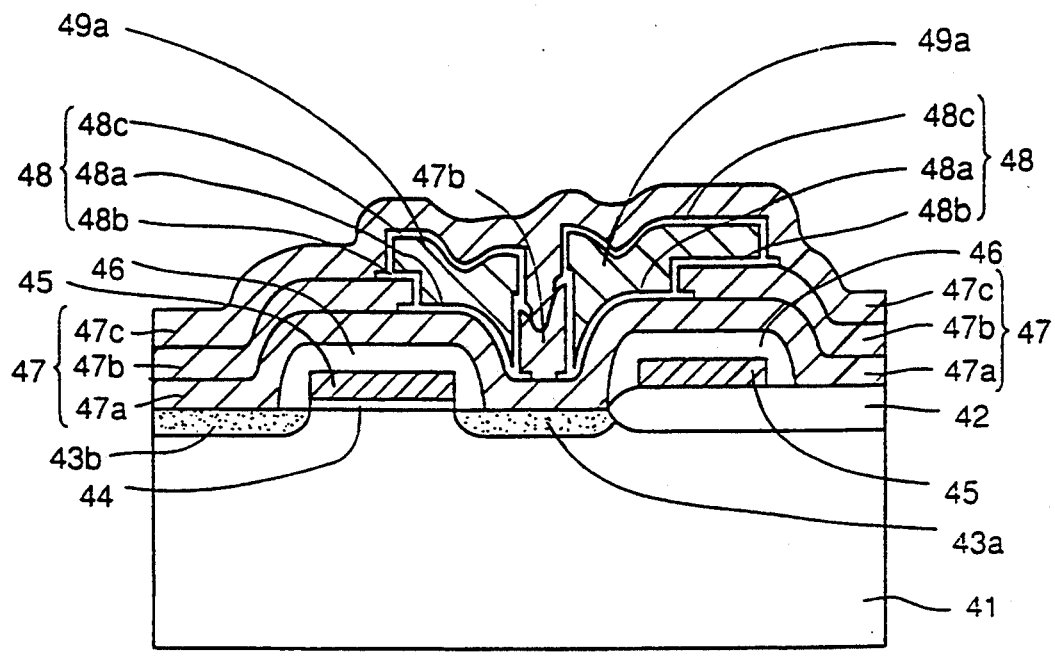
FIG. 40 is a cross-sectional view for use in illustration of a twelfth step of the manufacturing process of the DRAM in accordance with the third embodiment shown in FIG. 28.

As shown in FIG. 40, polysilicon layer (capacitor lower electrode in the third layer) 47c having a thickness about in the range between 1000–2000 Å is formed by means of chemical vapor deposition at a temperature between 550°–650° C.

Figure 41:
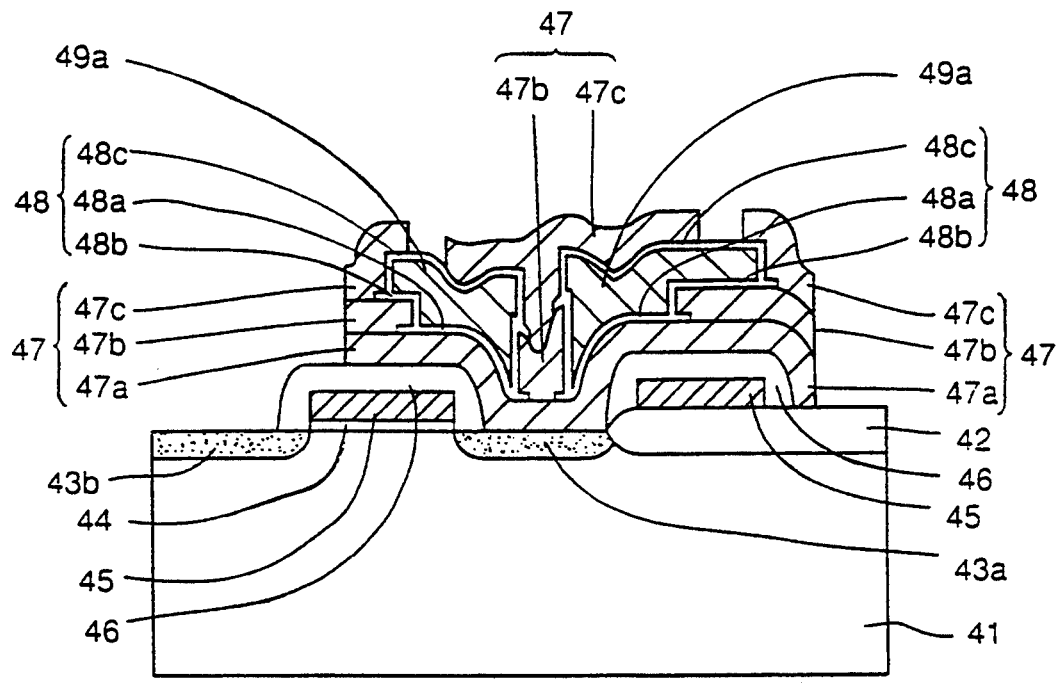
FIG. 41 is a cross-sectional view for use in illustration of a thirteenth step of the manufacturing process of the DRAM in accordance with the third embodiment shown in FIG. 28.

As shown in FIG. 41, a part of capacitor lower electrode 47c in the third layer over capacitor upper electrode 49a in the first layer is removed, and a part of the portion in which capacitor lower electrode 47a in the first layer, capacitor lower electrode 47b in the second layer, and capacitor lower electrode 47c in the third layer are piled upon each other is removed. Thus, capacitor lower electrode 47 of capacitor lower electrode 47a in the first layer, capacitor lower electrode 47b in the second layer, and capacitor lower electrode 47c in the third layer is formed.

Figure 42:
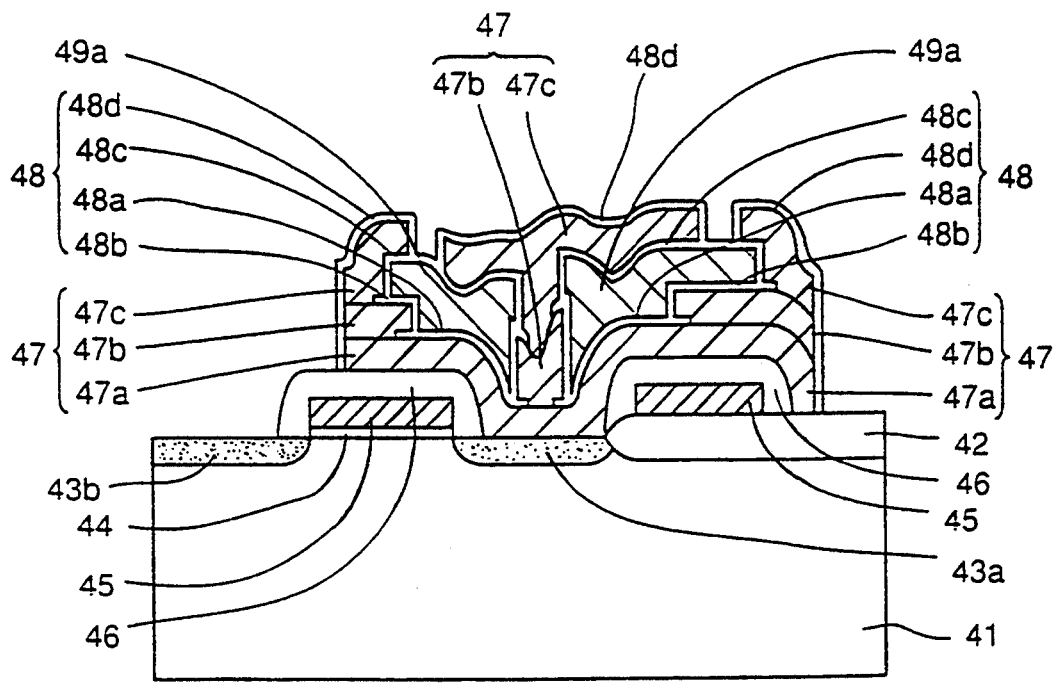
FIG. 42 is a cross-sectional view for use in illustration of a fourteenth step of the manufacturing process of the DRAM in accordance with the third embodiment shown in FIG. 28.

Now, as shown in FIG. 42, a capacitor insulating film 48d in a fourth layer formed of a silicon oxide film having a thickness about in the range between 30–200 Å is formed on the surfaces of capacitor lower electrode 47a in the first layer, capacitor lower electrode 47b in the second layer, and capacitor lower electrode 47c in the third layer.

Figure 43:
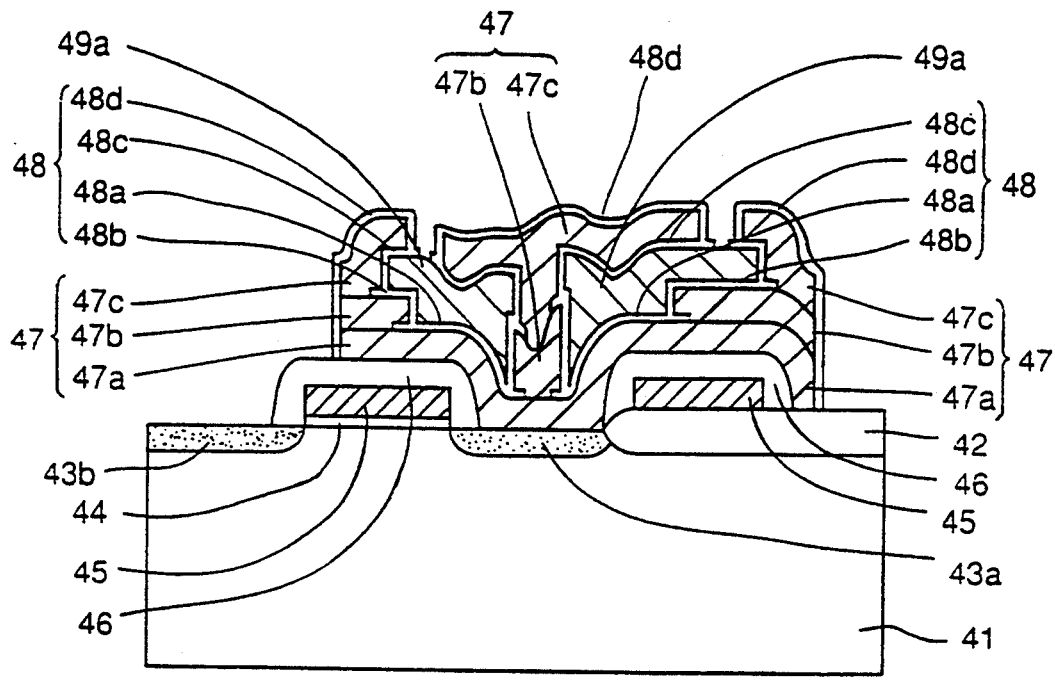
FIG. 43 is a across-sectional view for use in illustration of a fifteenth step of the manufacturing process of the DRAM in accordance with the third embodiment shown in FIG. 28.

Then, as shown in FIG. 43, capacitor insulating film 48c in the third layer on capacitor upper electrode 49a in the first layer and positioned in the part left behind by capacitor lower electrode 47c is removed.

Figure 44:
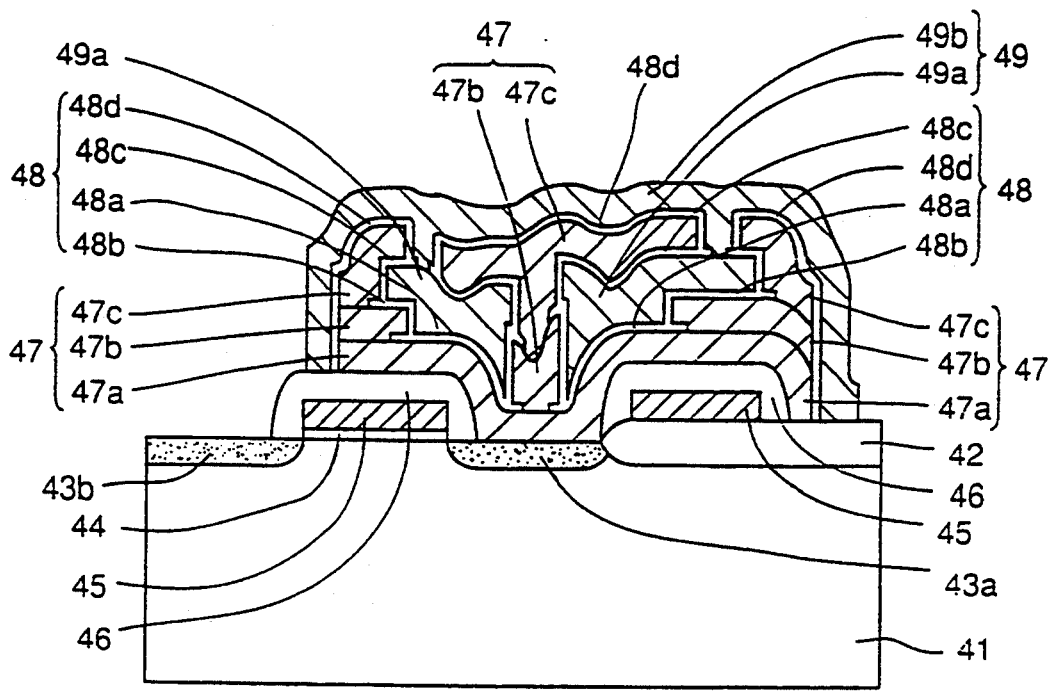
FIG. 44 is a cross-sectional view for use in illustration of a sixteenth step of the manufacturing process of the DRAM in accordance with the third embodiment shown in FIG. 28.

As shown in FIG. 44, polysilicon layer (capacitor upper electrode in the second layer) 49b having a thickness about in the range between 1000–3000 Å is formed on the entire surface by chemical vapor deposition at a temperature between 550°–650° C. Thus, capacitor upper electrode 49 formed of capacitor upper electrode 49a in the first layer and capacitor upper electrode 49b in the second layer is formed.

Figure 45:
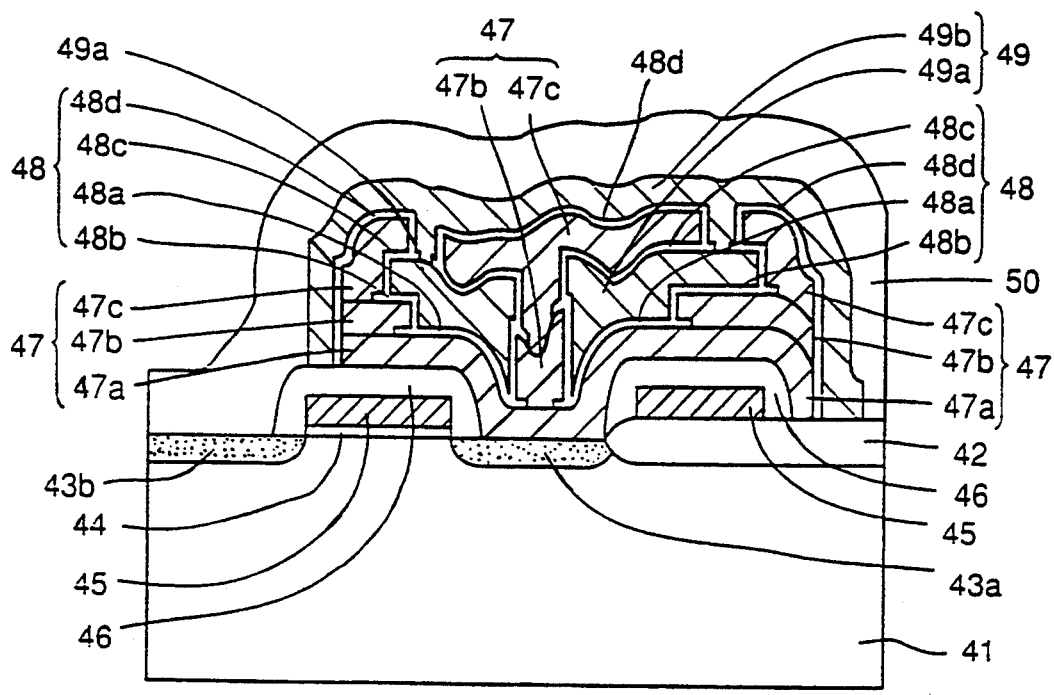
FIG. 45 is a cross-sectional view for use in illustration of a seventeenth step of the manufacturing process of the DRAM in accordance with the third embodiment shown in FIG. 28.

As shown in FIG. 45, interlayer insulating film 10 is formed on the entire surface.

Figure 46:
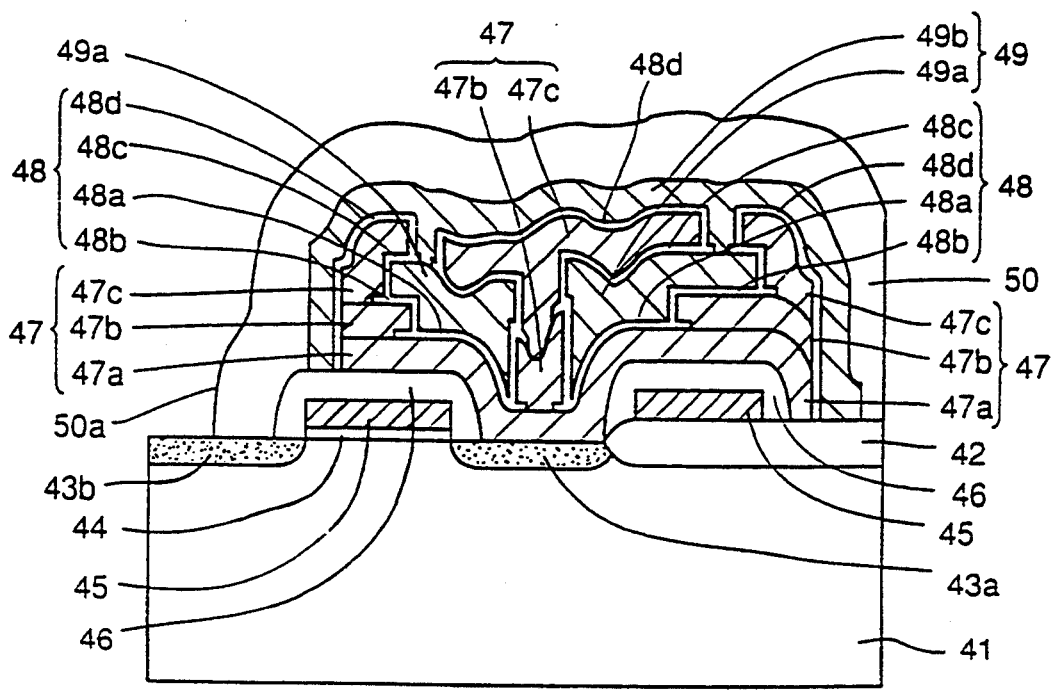
FIG. 46 is a cross-sectional view for use in illustration of an eighteenth step of the manufacturing process of the DRAM in accordance with the third embodiment shown in FIG. 28.

As shown in FIG. 46, a contact hole 50a is formed in interlayer insulating film 50 positioned on source/drain region 43b.

Figure 47:
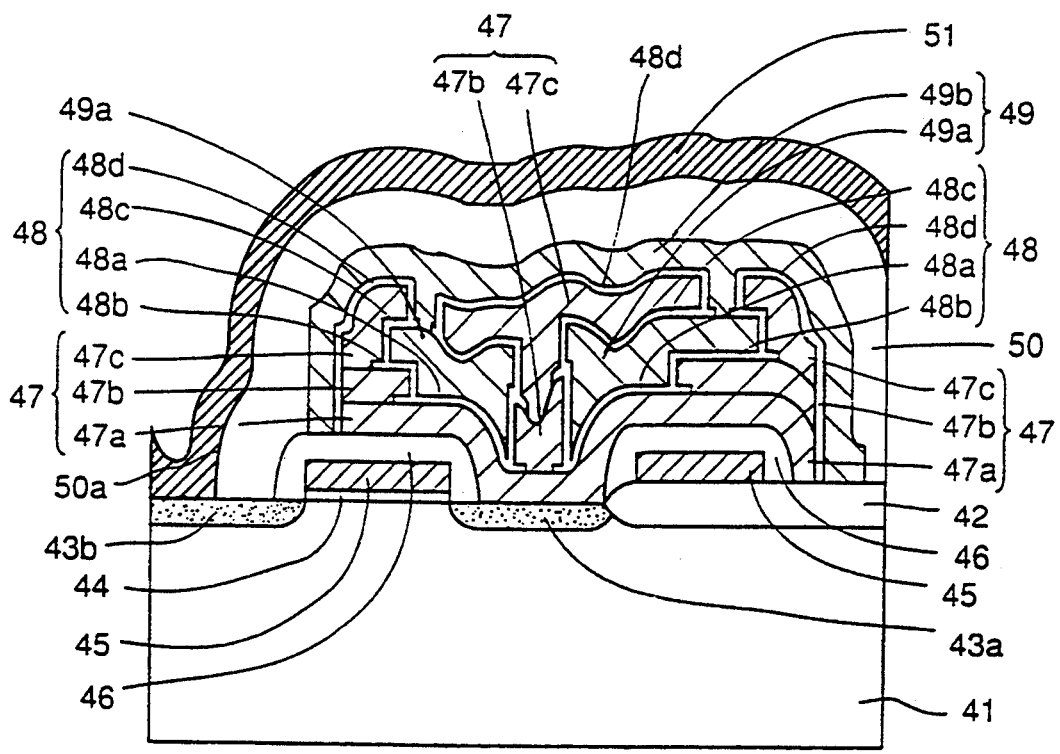
FIG. 47 is a cross-sectional view for use in illustration of a nineteenth step of the manufacturing process of the DRAM in accordance with the third embodiment shown in FIG. 28.

As shown in FIG. 47, a bit line electrically connected to source/drain region 43b in contact hole 50a and formed extending along the surface of interlayer insulating film 50 is formed.

Finally, as shown in FIG. 28, interlayer insulating film 52 is formed to cover bit line 51. The surface of interlayer insulating film 52 is planarized by means of reflow or etch back method. Aluminum interconnections 53 are formed on the surface of the planarized interlayer insulating film 52 and corresponding to gate electrode 45. Thus, the DRAM of the third embodiment is completed.

Figure 48:
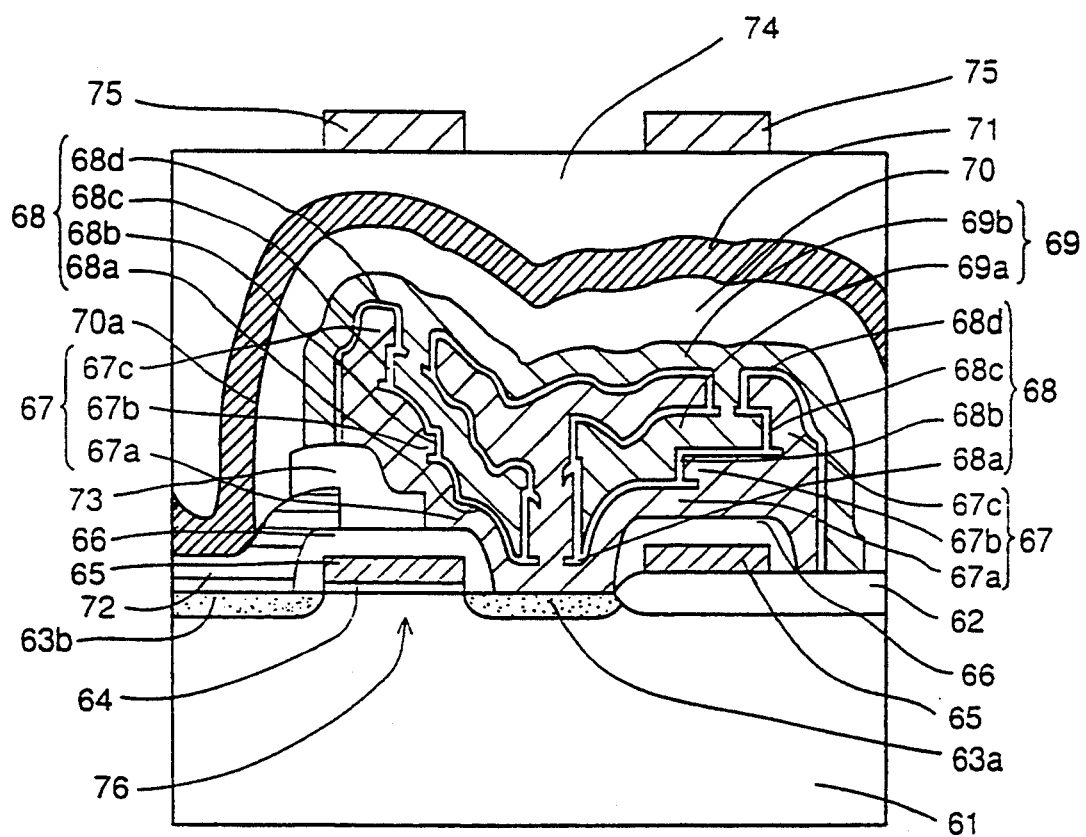
FIG. 48 is a cross-sectional view showing a structure of a DRAM including a stacked type capacitor in accordance with a fourth embodiment of the present invention.

Referring to FIG. 48, a DRAM in accordance with a fourth embodiment includes a P type silicon substrate 61, a field oxide film 62 formed in a prescribed region on the main surface of P type silicon substrate 61 for element isolation, a pair of source/drain regions 63a and 63b formed a prescribed distance apart #rom each other and holding therebetween a channel region 76 in an active region surrounded by field oxide film 62, a gate electrode 65 formed on channel region 76 with a gate oxide film 64 therebetween, an interlayer insulating film 66 formed covering gate electrode 65, a capacitor lower electrode 67 (67a, 67b, 67c) electrically connected to source/drain region 63a, a capacitor insulating film 68 (68a, 68b, 68c, 68d) formed on the surface of capacitor lower electrode 67, a capacitor upper electrode 69 (69a, 69b) formed on the surface of capacitor insulating film 68, a pad layer 72 electrically connected to source/drain region 63b and formed extending over gate electrode 65 with interlayer insulating film 66 therebetween, a silicon oxide film 73 covering an end of pad layer 72 positioned over gate electrode 65 for insulation between the pad layer, capacitor lower electrode 67, and capacitor upper electrode 69, an interlayer insulating film 70 formed covering capacitor upper electrode 69 and having a contact hole 70a on pad layer 72, a bit line 71 electrically connected to pad layer 72 in contact hole 70a and extending along the surface of interlayer insulating film 70, an interlayer insulating film 74 formed of a PSG film or a TEOS film having its surface planarized and covering bit line 71, and an aluminum interconnection 75 formed on interlayer insulating film 74 corresponding to gate electrode 65. Source/drain regions 63a and 63b, and gate electrode 65 constitute the transfer gate transistor of a memory cell.

The capacitor in accordance with the fourth embodiment has basically the same structure as the capacitor in accordance with the third embodiment shown in FIG. 28. However, in this fourth embodiment, pad layer 72 is interposed between bit lines 71 and source/drain region 63b. Furthermore, silicon oxide film 73 is interposed between pad layer 72, capacitor lower electrode 67, and capacitor upper electrode 69. Thus, in the fourth embodiment, the facing area between capacitor lower electrode 67 and capacitor upper electrode 69 is increased by the amount corresponding to the stepped portion of silicon oxide film 73. As a result, the capacity of capacitor in this embodiment is increased by the amount of the step portion of silicon oxide film 73 as compared to the third embodiment shown in FIG. 28. More specifically, the capacity of capacitor is increased about three-four times as large as that of the conventional DRAM shown in FIG. 69 in the same plane area. Capacitor capacity sufficient for maintenance of stable storage of data can be secured even when elements are further reduced in size in accordance with high density integration of semiconductor devices. Also in the fourth embodiment, interposing pad layer 72 between bit line 71 and source/drain region 63b facilitates formation of bit lines 71. More specifically, with the presence of pad layers 72, the tolerance for the contact position of bit line 71 is expanded, and the stepped portion of bit line 71 is reduced, thereby facilitating formation of bit line 71. The thicknesses of capacitor lower electrode 67a in the first layer, capacitor lower electrode 67b in the second layer, and capacitor lower electrode of 67c in the third layer are each about in the range between 1000–2000 Å. The thicknesses of capacitor insulating film 67a in the first layer, capacitor insulating film 68b in the second layer, capacitor lower electrode 68c in the third layer and capacitor insulating film 68d in the fourth layer are each about in the range between 30–200 Å. The thicknesses of capacitor upper electrode of 69a in the first layer and capacitor upper electrode 69b in the second layer are each about in the range between 1000–3000 Å.

Now, referring to FIGS. 48–54, a description of a manufacturing process of the DRAM in accordance with the fourth embodiment follows.

Figure 49:
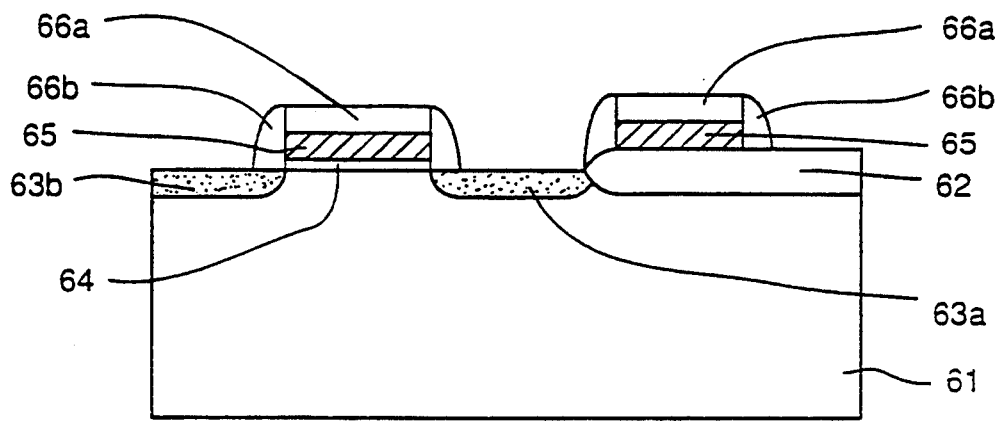
FIG. 49 is a cross-sectional view for use in illustration of a first step of a manufacturing process of the DRAM in accordance with the fourth embodiment shown in FIG. 48.

As shown in FIG. 49, field oxide film 62 is formed in a prescribed region on the main surface of P type silicon substrate 61 by means of thermal oxidation. After gate oxide film 64, gate electrode 65, and oxide film 66a are formed, oblique rotation ion implantation of phosphorus (P) is conducted using them as mask at 40–50 KeV, about $3 \times 10^3$ atoms/cm$^2$, and source/drain regions 63a and 63b are formed in a self-aligned manner. After an oxide film layer (not shogun) is formed on the entire surface, a sidewall oxide film 66b is formed on both sidewalls of gate electrode 65 by anisotropic etching.

Figure 50:
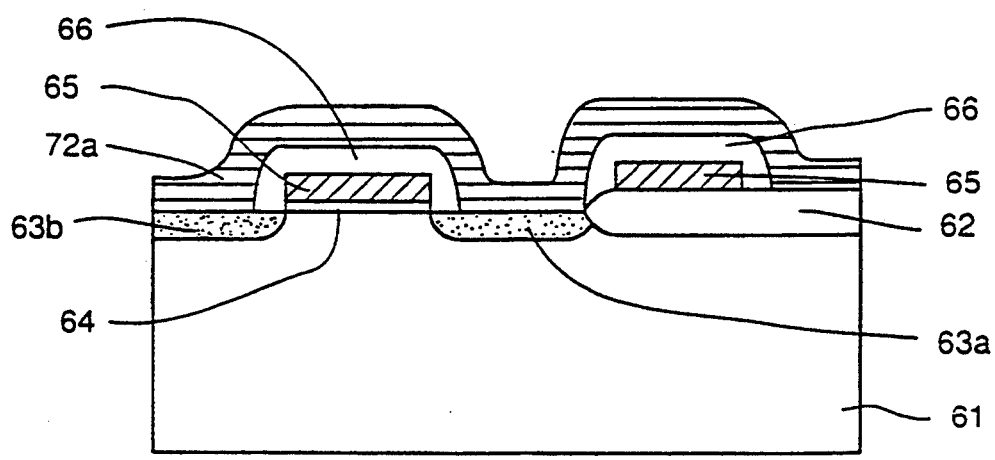
FIG. 50 is a cross-sectional view for use in illustration of a second step of a manufacturing process of the DRAM in accordance with the fourth embodiment shown in FIG. 48.
Figure 51:
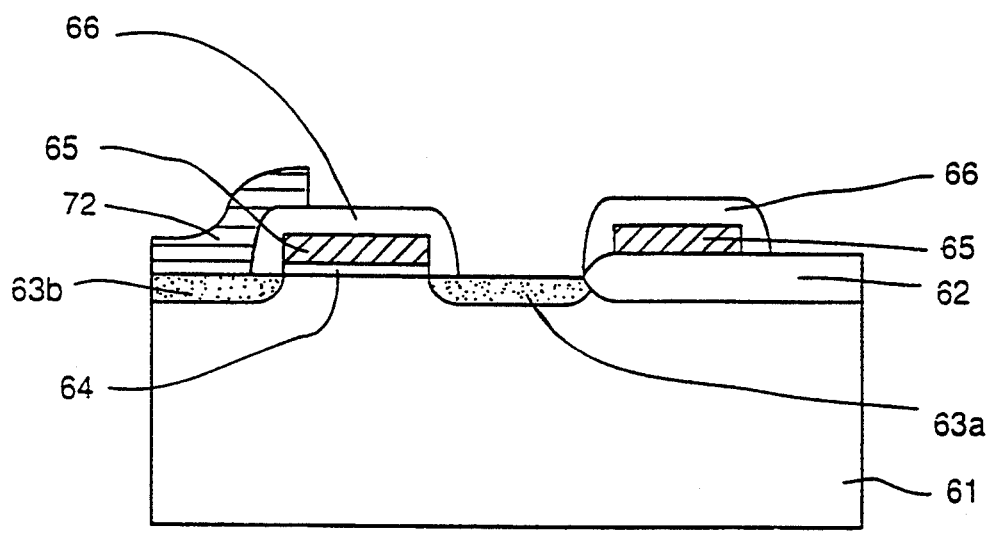
FIG. 51 is a cross-sectional view for use in illustration of a third step of a manufacturing process of the DRAM in accordance with the fourth embodiment shown in FIG. 48.

As shown in FIG. 50, polysilicon layer 72a is formed by chemical vapor deposition. Polysilicon layer 72a is patterned by means of photolithography and etching techniques, and pad layers 72 having a shape as shown in FIG. 51 is formed.

Figure 52:
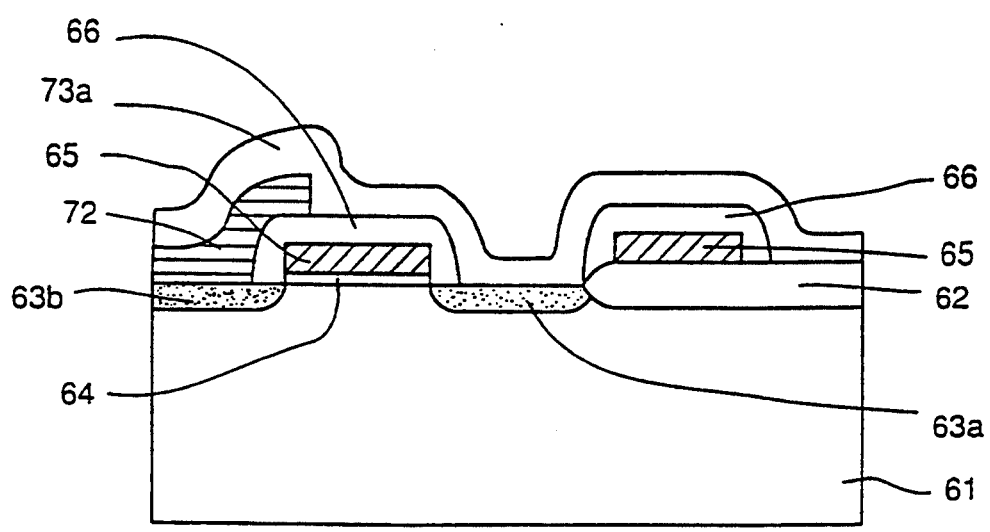
FIG. 52 is a cross-sectional view for use in illustration of a fourth step of a manufacturing process of the DRAM in accordance with the fourth embodiment shown in FIG. 48.
Figure 53:
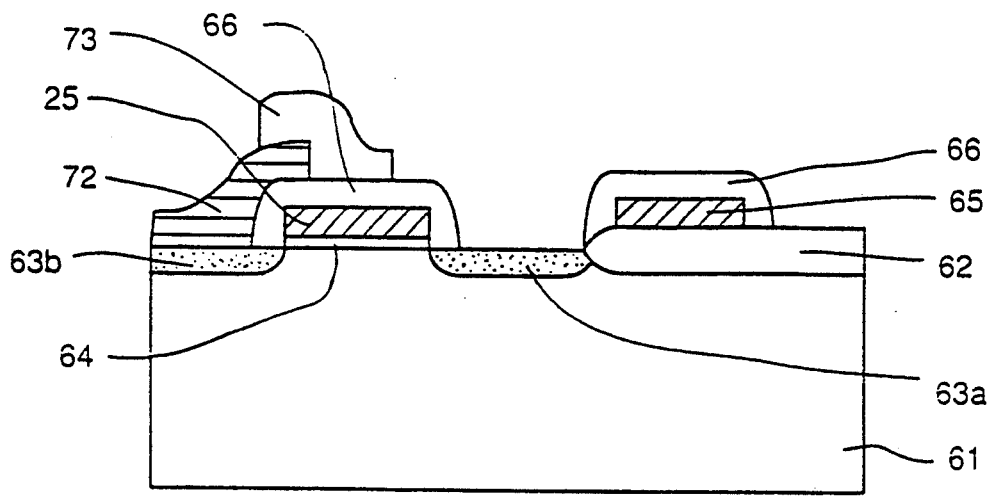
FIG. 53 is a cross-sectional view for use in illustration of a fifth step of a manufacturing process of the DRAM in accordance with the fourth embodiment shown in FIG. 48.
Figure 54:
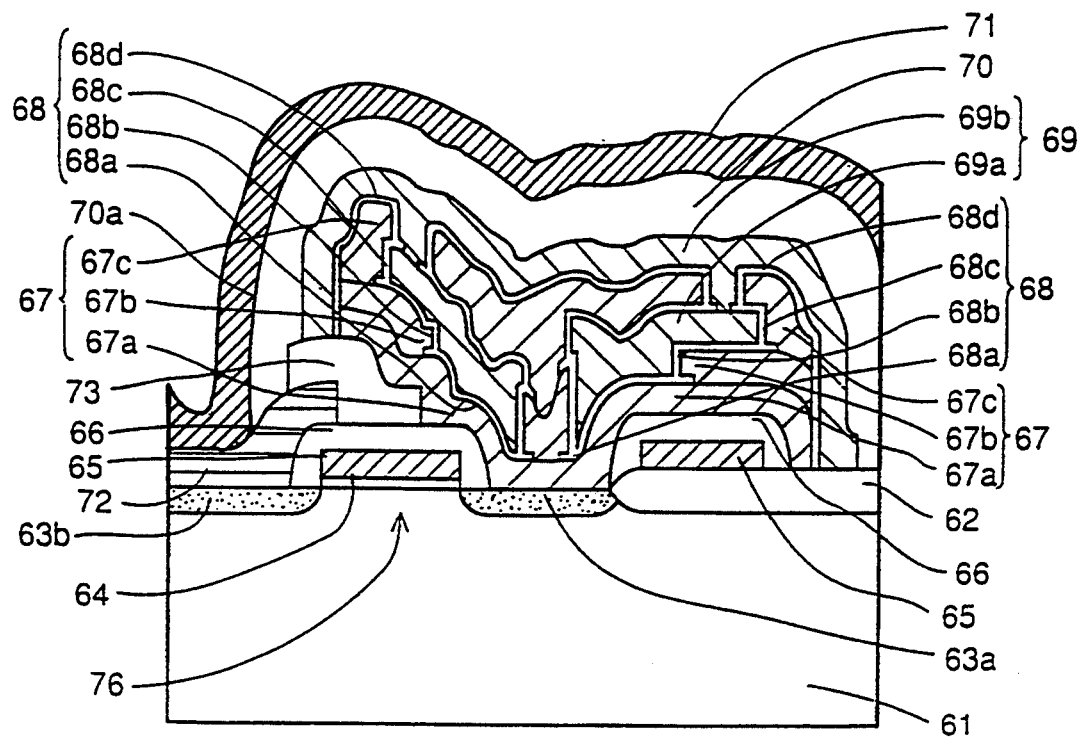
FIG. 54 is a cross-sectional view for use in illustration of a sixth step of a manufacturing process of the DRAM in accordance with the fourth embodiment shown in FIG. 48.

As shown in FIG. 52, silicon oxide film layer 73a is formed by chemical vapor deposition. Silicon oxide film layer 73a is patterned by means of photolithography and etching techniques, and silicon oxide film 73 in a shape as shown in FIG. 53 is formed. More specifically, silicon oxide film 73 shaped to cover an edge portion of pad layer 72 positioned over gate electrode 65. Thereafter, a shape as shown in FIG. 54 is provided by the same steps as in the manufacturing process of the DRAM of the third embodiment shown in FIG. 30 to 47.

Finally, as shown in FIG. 48, interlayer insulating film 74 formed of a PSG film or a TEOS film covering bit lines 71 is formed. The surface of interlayer insulating film 74 is planarized by reflow or etch back methods. An aluminum interconnection 75 corresponding to gate electrode 65 is formed on interlayer insulating film 74. Thus, the DRAM in accordance with the fourth embodiment is completed.

Figure 55:
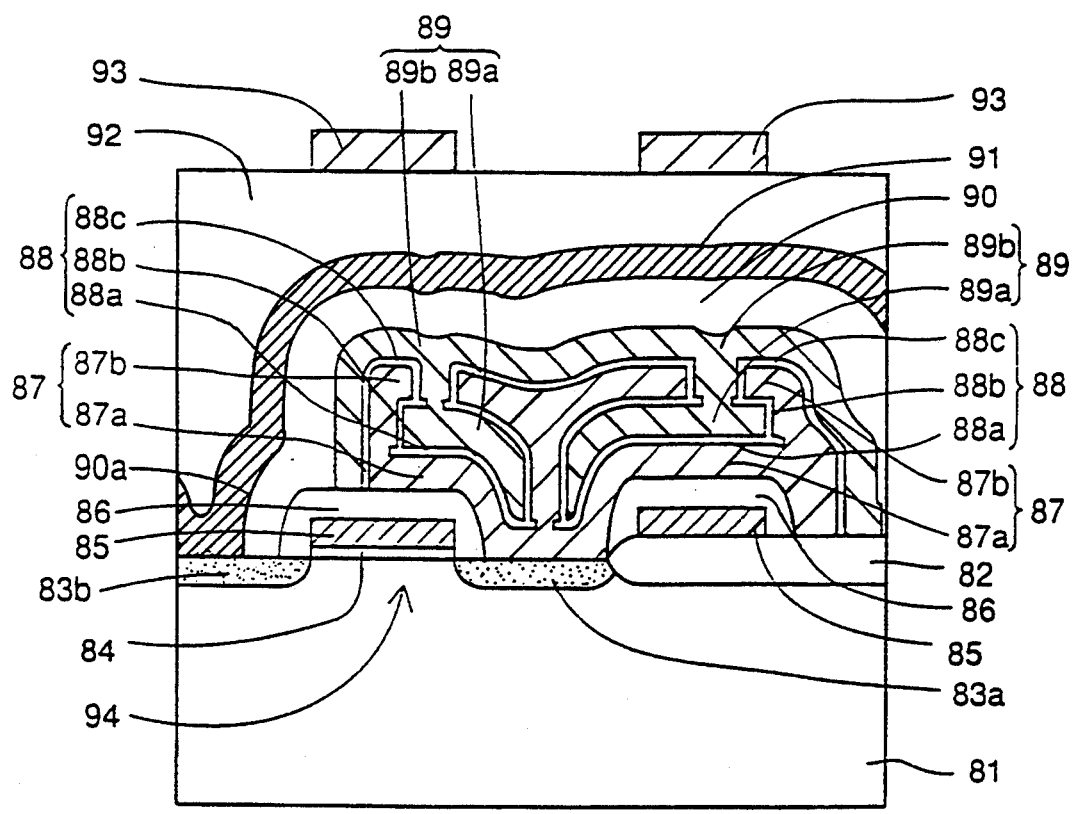
FIG. 55 is a cross-sectional view showing a DRAM including a stacked type capacitor in accordance with a fifth embodiment of the present invention.

Referring to FIG. 55, a DRAM of the fifth embodiment includes a P type silicon substrate 81, a field oxide film 82 formed in a prescribed region on the main surface of P type silicon substrate 81 for element isolation, a pair of source/drain regions 83a and 83b formed a prescribed distance apart from each other and holding therebetween a channel region 94 in an active region surrounded by field oxide film 82, a gate electrode 85 formed on channel region 94 with a gate oxide film 84 therebetween, an interlayer insulating film 86 formed so as to cover gate electrode 85, a capacitor lower electrode 87 (87a, 87b) electrically connected to source/drain regions 83a and extending over gate electrode 85 with interlayer insulating film 86 therebetween, a capacitor insulating film 88 (88a, 88b, 88c) formed on the surface of capacitor lower electrode 87, a capacitor upper electrode 89 (89a, 89b) formed on the surface of capacitor insulating film 88, an interlayer insulating film 90 formed covering capacitor upper electrode 89 and having a contact hole 90a on source/drain region 83b, a bit line 91 electrically connected to source/drain region 83b in contact hole 90a and formed extending along the surface of interlayer insulating film 90, an interlayer insulating film 92 formed of a PSG film or TEOS film having its surface planarized and formed covering bit line 91, and an aluminum interconnection 93 formed on interlayer insulating film 92 and corresponding to gate electrode 85.

Source/drain regions 83a and 83b, and gate electrode 85 constitute the transfer gate transistor of a memory cell. Capacitor lower electrode 87, capacitor insulating film 88, and capacitor upper electrode 89 constitute a stacked type capacitor for storing charge corresponding to a data signal.

In other words, capacitor lower electrode 87 is formed of capacitor lower electrode 87a in a first layer electrically connected to source/drain region 83a and formed extending over gate electrode 85 with interlayer insulating film 86, and capacitor lower electrode 87b in a second layer formed extending perpendicularly to the main surface of P type silicon substrate 81. Capacitor upper electrode 89 is formed of capacitor upper electrode 89a in a first layer formed extending along the surface of P type silicon substrate 81, and capacitor upper electrode 89b in a second layer electrically connected in a prescribed position to capacitor lower electrode 89a in the first layer and formed covering the upper surface and both sidewalls of capacitor lower electrode 87. Furthermore, capacitor lower electrode 87 is formed of three portions extending perpendicularly to the main surface of P type silicon substrate 81, the central portion of which is formed to take a T shape. In other words, capacitor lower electrode 87 is formed to surround capacitor upper electrode 89a in the first layer. Thus, capacitor capacity about twice-three times as large as that of the conventional DRAM shown in FIG. 69 in the same plane area is secured. Therefore, also in this fifth embodiment, a capacitor capacity sufficient for maintaining stable storage of data is secured even if elements are further reduced in size in accordance with high density integration of semiconductor devices. Capacitor lower electrodes 87a and 87b are formed of polysilicon, and each have a thickness in the range between 1000 Å and 2000 Å. Capacitor insulating film 88 (88a, 88b, 88c) is formed of a two-layer film of $SiO_2$ films, or a $SiO_2$ film and a $SiO_3N_4$ and has a thickness about in the range between 30 Å and 200 Å. Capacitor upper electrodes 89a and 89b are formed of polysilicon and each have a thickness about in the range between 1000 Å and 3000 Å.

Now, referring to FIGS. 55-60, a description of a manufacturing process of the DRAM in accordance with the fifth embodiment follows.

Figure 56:
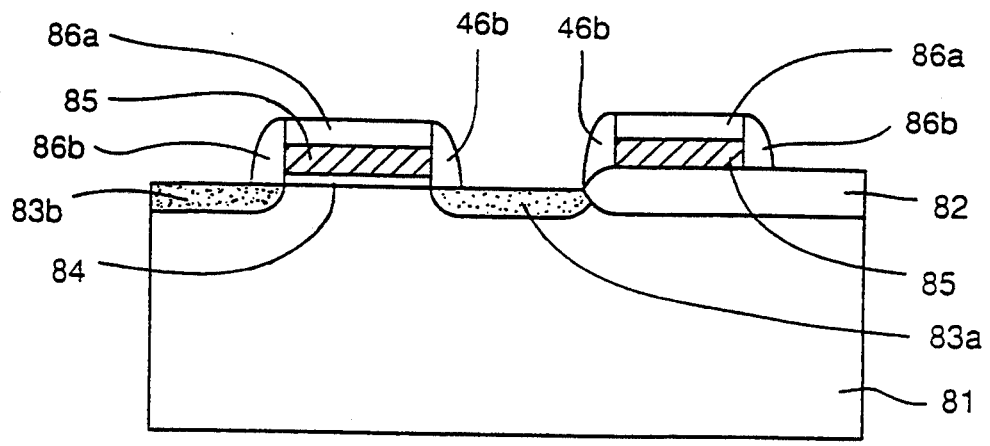
FIG. 56 is a cross-sectional view for use in illustration of a first step of a manufacturing process of the DRAM in accordance with the fifth embodiment shown in FIG. 55.

As shown in FIG. 56, field oxide film 82 for element isolation is formed in a prescribed region on the main surface of P type silicon substrate 81 by means of thermal oxidation. Gate oxide film 84, gate electrode 85, and oxide film 86a are formed. Using them as mask oblique rotation ion implantation of phosphorus (P) is conducted at 40-50 KeV, about $3\times10^3$ atoms/cm$^2$ to form source/drain regions 83 and 83b. After formation of an oxide film (not shown) on the entire surface, sidewall oxide film 86b is formed on both sidewalls of gate electrodes 85 by anisotropic etching.

Figure 57:
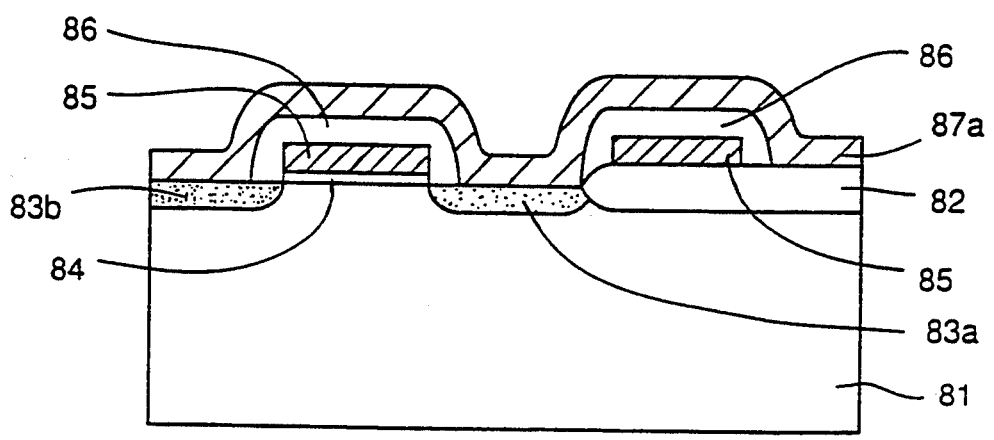
FIG. 57 is a cross-sectional view for use in illustration of a second step of a manufacturing process of the DRAM in accordance with the fifth embodiment shogun in FIG. 55.
Figure 58:
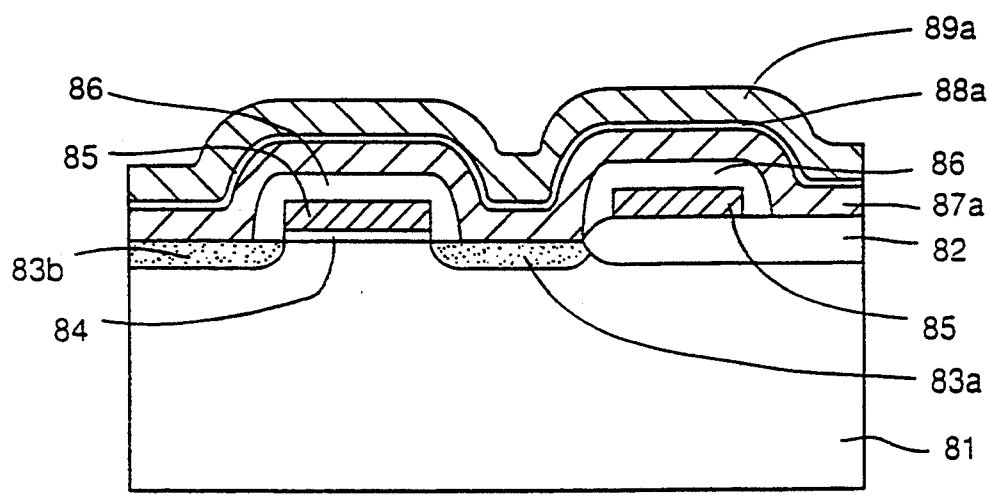
FIG. 58 is a cross-sectional view for use in illustration of a third step of a manufacturing process of the DRAM in accordance with the fifth embodiment shown in FIG. 55.
Figure 59:
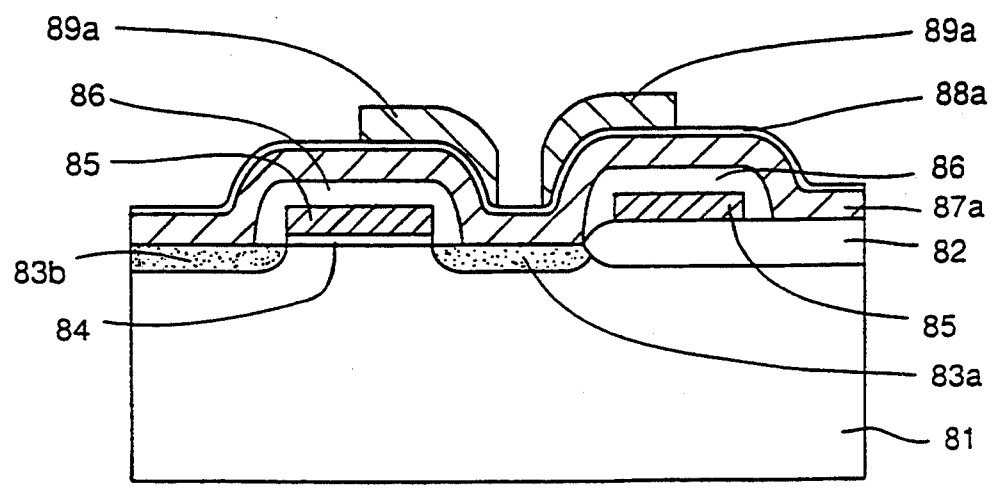
FIG. 59 is a cross-sectional view for use in illustration of a fourth step of a manufacturing process of the DRAM in accordance with the fifth embodiment shown in FIG. 55.

Then, as shown in FIG. 57, capacitor lower electrode 87a in the first layer having a thickness about in the range between 1000-2000 Å is formed by means of chemical vapor deposition at a temperature between 500°-650° C.

Figure 60:
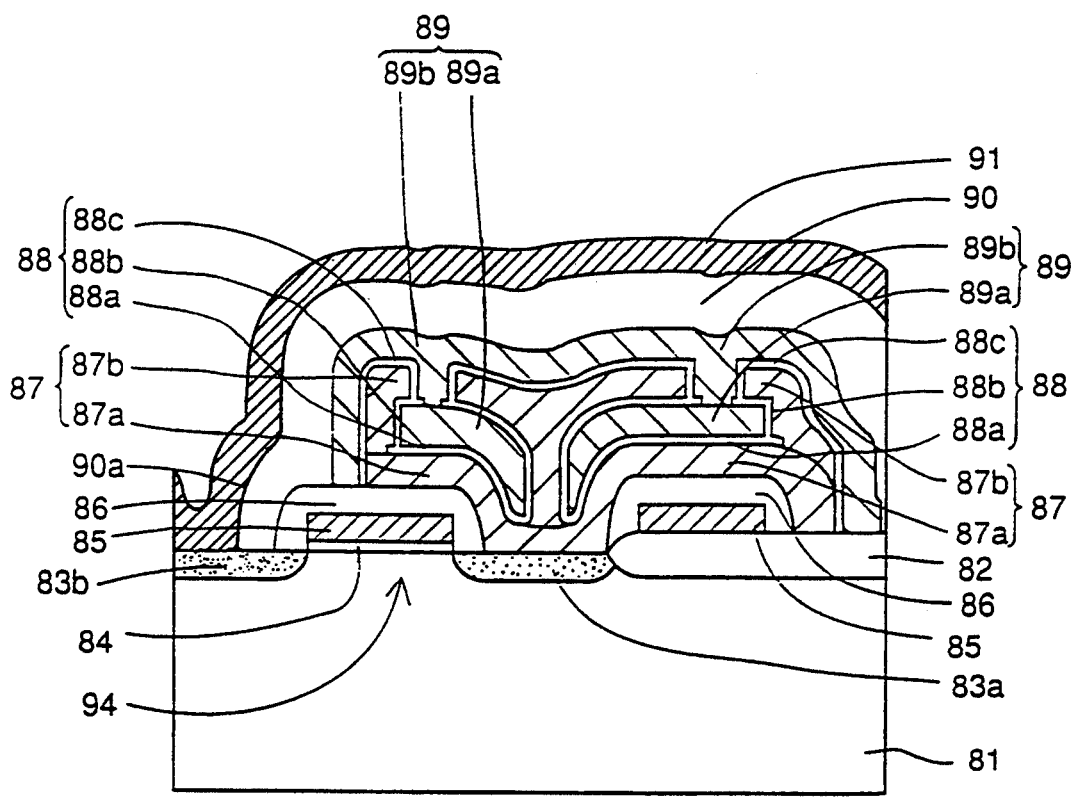
FIG. 60 is a cross-sectional view for use in illustration of a fifth step of a manufacturing process of the DRAM in accordance with the fifth embodiment shogun in FIG. 55.

As shown in 58, capacitor insulating film 88a in the first layer of $SiO_2$ and having a thickness in the range between 30 Å and 200 Å is formed by oxidizing the surface of capacitor lower electrode 87a in the first layer. Capacitor upper electrode 89a in the first layer having a thickness about in the range between 1000-3000 Å is formed on capacitor lower electrode 88a in the first layer by means of chemical vapor deposition at a temperature between 550°-650° C. Capacitor upper electrode 89a in the first layer is patterned by lithography and etching techniques to form capacitor upper electrode 89a in the first layer having a shape as shown in FIG. 55. Thereafter, going through the same manufacturing process as in the third embodiment shown in FIGS. 38-47, a structure as shown in FIG. 60 is provided.

Finally, as shogun in FIG. 55, after forming interlayer insulating film 92 to cover bit line 91, the surface of interlayer insulating film 92 is planarized by reflow or etch back method. An aluminum interconnection 93 is formed corresponding to gate electrode 85 on interlayer insulating film 92. Thus, the DRAM in accordance with the fifth embodiment is completed.

Figure 61:
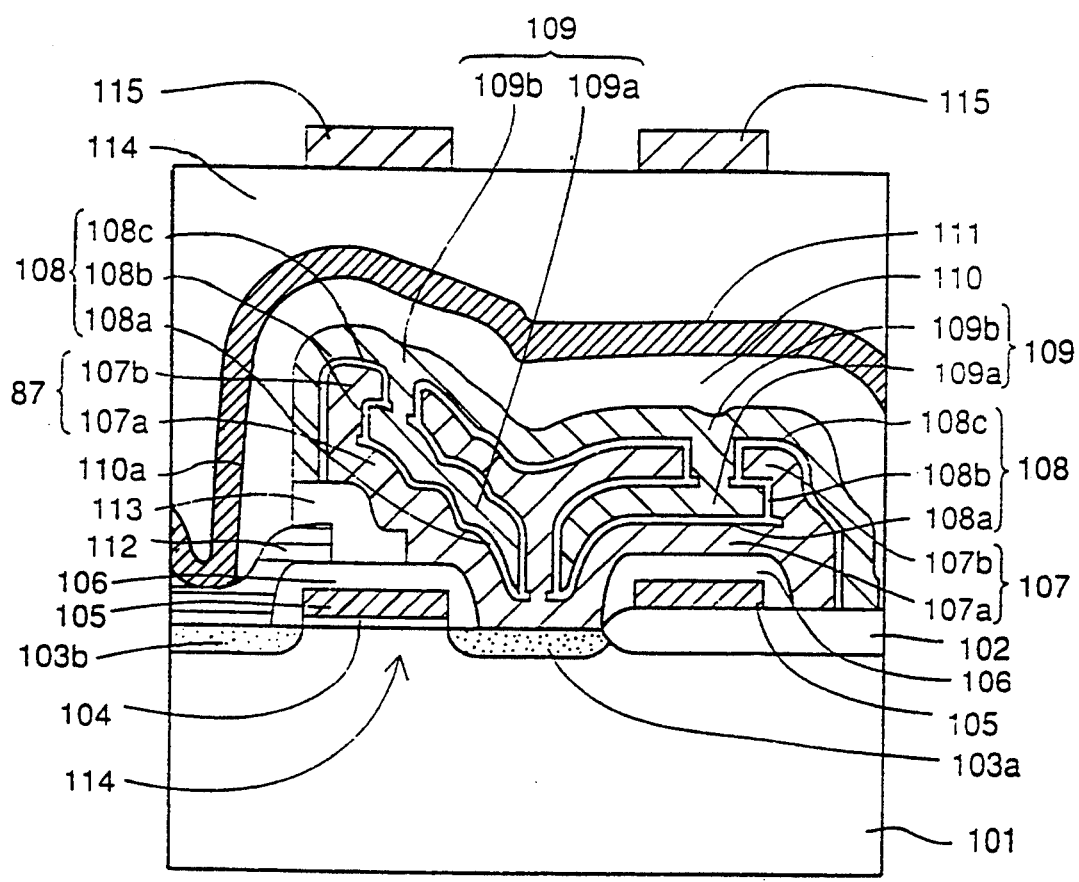
FIG. 61 is a cross-sectional view showing a structure of a DRAM including a stacked type capacitor in accordance with a sixth embodiment of the present invention.

Referring to FIG. 61, a DRAM in accordance with a sixth embodiment includes a P type silicon substrate 101, a field oxide film 102 formed in a prescribed region on the main surface of P type silicon substrate 101 for element isolation, a pair of source/drain regions 103a and 103b formed a prescribed distance apart from each other and holding therebetween a channel region 114 in an active region surrounded by field oxide film 102, a gate electrode 105 formed on channel region 114 with a gate oxide film 104 therebetween, an interlayer insulating film 10b formed covering gate electrode 105, a capacitor lower electrode 107 (107a, 107b) electrically connected to source/drain region 103a and extending over gate electrode 105 with interlayer insulating film 106, a capacitor insulating film 108 (108a, 108b, 108c) formed on the surface of capacitor lower electrode 107, a capacitor upper electrode 109 (109a, 109b) formed on the surface of capacitor insulating film 108, a pad layer 112 of polysilicon electrically connected to source/drain region 103b and extending over gate electrode 103 with interlayer insulating film 106 therebetween, a silicon oxide film 113 covering an edge portion of pad layer 112 positioned over gate electrode 105 and for isolation between pad layer 112, capacitor lower electrode 107, and capacitor upper electrode 109, an interlayer insulating film 110 formed covering capacitor upper electrode 109 and having a contact hole 110a on pad layer 112, a bit line 111 electrically connected to pad layer 112 in contact hole 110a and formed extending along the surface of interlayer insulating film 110, an interlayer insulating film 112 of a PSG film or a TEOS film having its surface planarized and covering bit line 111, and an aluminum interconnection 113 formed corresponding to gate electrode 105 on interlayer insulating film 112.

Source/drain regions 103a and 103b, and gate electrode 105 constitute the transfer gate transistor of the memory cell. Capacitor lower electrode 107 is formed of capacitor lower electrode 107a in a first layer electrically connected to source/drain region 103a and extending over gate electrode 105 with interlayer insulating film 106 therebetween, and capacitor lower electrode 107b in a second layer electrically connected to capacitor lower electrode 107a in the first layer and formed extending perpendicularly to the main surface of P type silicon substrate 101. Capacitor lower electrode 107 is formed of three portions extending perpendicularly to the main surface of P type silicon substrate 101, the central portion of which is formed in a T shape. Capacitor upper electrode 109 is formed of capacitor upper electrode 109a in the first layer positioned between capacitor lower electrode 107a in the first layer and capacitor lower electrode 107b in the second layer and extending along P type silicon substrate 101, and capacitor upper electrode 109b in the second layer electrically connected at a prescribed point to capacitor upper electrode 109a in the first layer and formed covering the upper surface and both sidewalls of capacitor lower electrode 107. More specifically, capacitor upper electrode 109a in the first layer is surrounded by capacitor lower electrode 107. This structure is substantially identical to the capacity portion in accordance with the fifth embodiment shown in FIG. 55.

However, in the sixth embodiment, as opposed to the fifth embodiment, pad layer 112 is interposed between bit line 111 and source/drain region 103b, and silicon oxide film 113 is formed so as to cover the edge portion of pad layer 112. Thus, capacitor lower electrode 107a in the first layer is formed to lie on silicon oxide film 113, and capacitor lower electrode 107a in the first layer takes a shape which reflects the step portion of silicon oxide film 113. As a result, the facing area between capacitor lower electrode 107 and capacitor upper electrode 109 is increased as compared to the fifth embodiment by the amount of the step portion of silicon oxide film. Therefore, capacitor capacity is further increased in the sixth embodiment as compared to the fifth embodiment. Therefore also in the sixth embodiment, capacitor capacity sufficient for maintenance of stable storage of data can be secured even when elements are further reduced in size in accordance with high density integration of semiconductor devices.

Capacitor lower electrode 107a in the first layer and capacitor lower electrode 107b in the second layer are formed of polysilicon and each have a thickness about in the range between 1000 Å-2000 Å. Capacitor insulating films 108a, 108b, and 108c are formed of, for example, a multilayer film of a $SiO_2$ film, a $SiO_2$ film, and a $Si_3N_4$ film, thicknesses of which are each about in the range between 30 Å-200 Å. Capacitor upper electrode 109a in the first layer and capacitor upper electrode 109b in the second layer are formed of polysilicon and each have a thickness about in the range between 1000 Å-3000 Å.

Also in the sixth embodiment, as in the case with the second and fourth embodiments, with pad layer 112 being interposed between bit line 111 and source/drain region 103b, the stepped portion of bit line 111 is reduced and the contact margin of bit line 111 is expanded. As a result, formation of bit lines is further facilitated.

Now referring to FIGS. 61-67, a description of a manufacturing process of the DRAM in accordance with the sixth embodiment follows.

Figure 62:
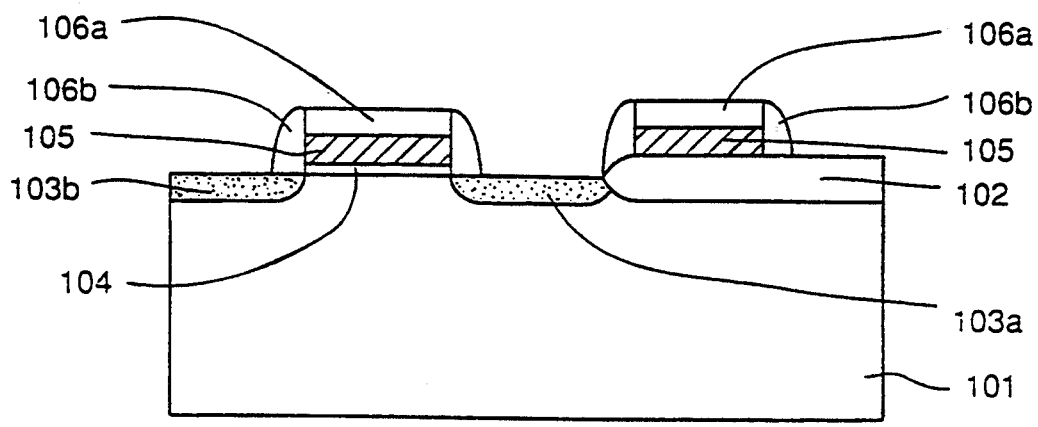
FIG. 62 is a cross-sectional view for use in illustration of a first step of a manufacturing process of the DRAM in accordance with the sixth embodiment shown in FIG. 61.

As shown in FIG. 62, field oxide film 102 for element isolation is formed in a prescribed region on the main surface of P type silicon substrate 101 by means of thermal oxidation. Gate oxide film 104, gate electrode 105, and oxide film 106a are formed. Using them as mask, source/drain regions 103a and 103b are formed in a self-aligned manner by implanting impurity ions. This ion implantation is conducted by oblique rotation ion implantation of phosphorus (P) at 40-50 KeV, about $3 \times 10^3$ atoms/cm². An oxide film (not shown) is formed to cover the entire surface and then anisotropically etched to form sidewall oxide film 106b on both sidewalls of gate electrode 105.

Figure 63:
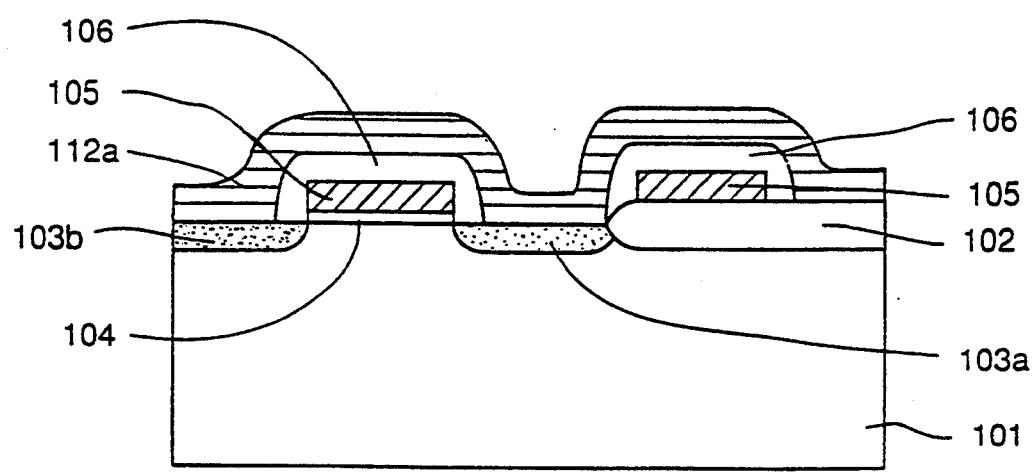
FIG. 63 is a cross-sectional view for use in illustration of a second step of a manufacturing process of the DRAM in accordance with the sixth embodiment shogun in Fig. 61.
Figure 64:
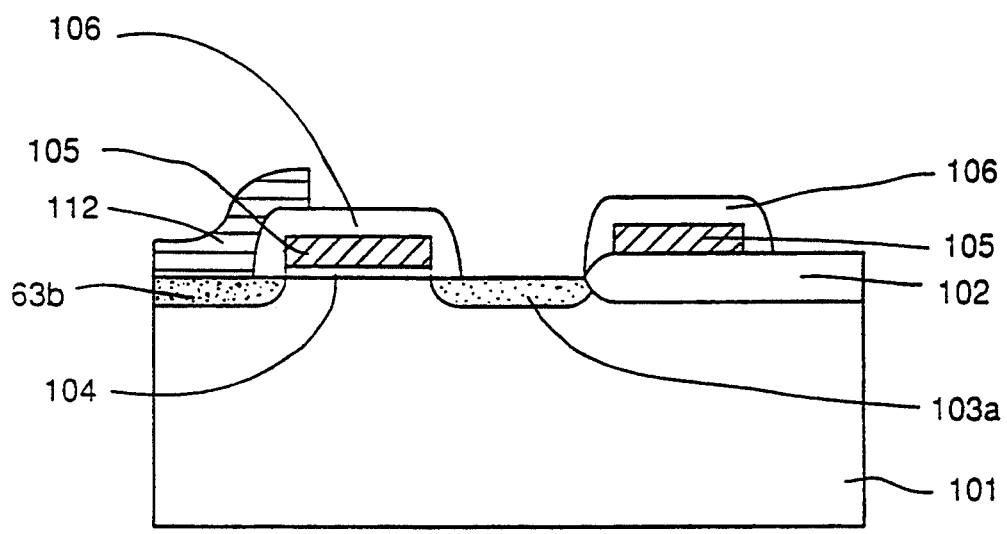
FIG. 64 is a cross-sectional view for use in illustration of a third step of a manufacturing process of the DRAM in accordance with the sixth embodiment shown in FIG. 61.

As shown in FIG. 63, polysilicon layer 112a is formed by means of chemical vapor deposition. Polysilicon layer 112a is patterned by photolithography and etching techniques, and pad layer 112 having a shape shown in Fig. 64 is formed.

Figure 65:
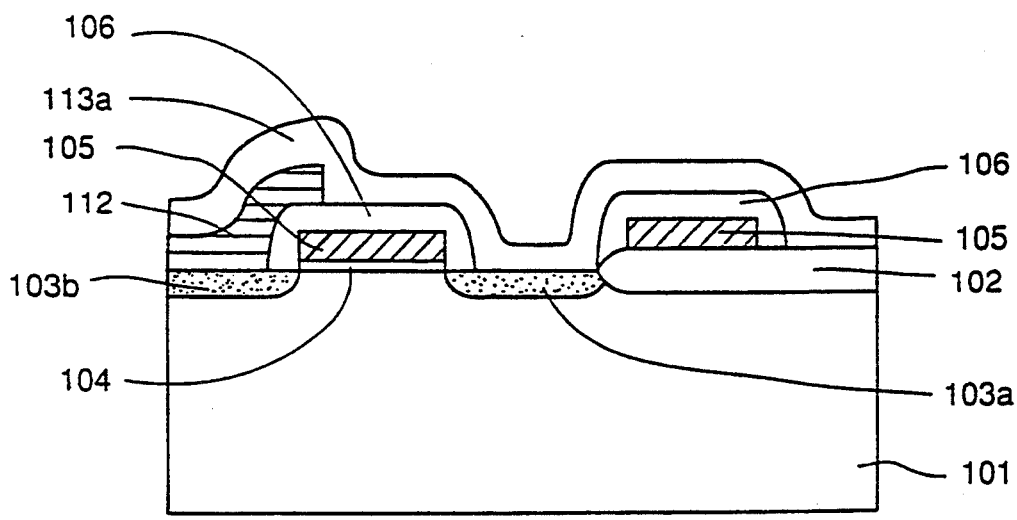
FIG. 65 is a cross-sectional view for use in illustration of a fourth step of a manufacturing process of the DRAM in accordance with the sixth embodiment shogun in FIG. 61.
Figure 66:
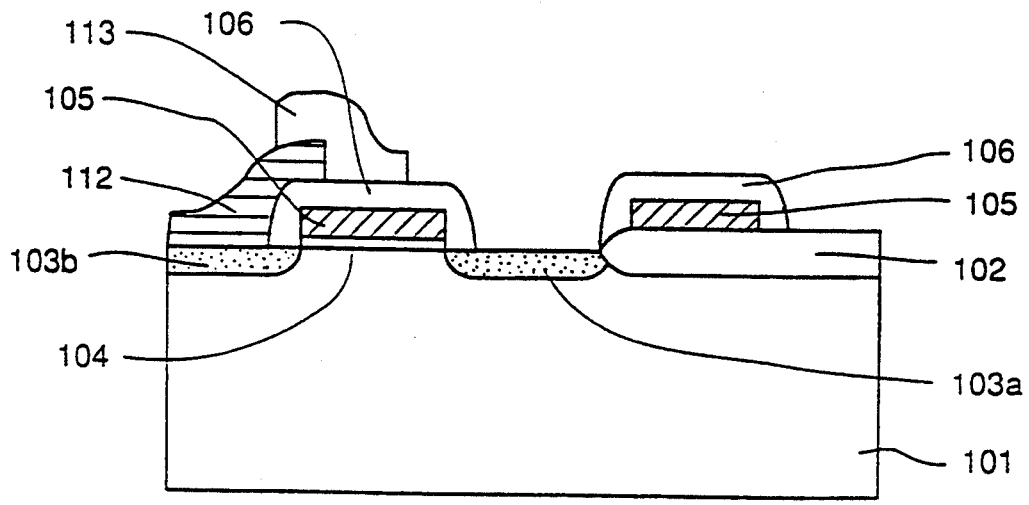
FIG. 66 is a cross-sectional view for use in illustration of a fifth step of a manufacturing process of the DRAM in accordance with the sixth embodiment shown in FIG. 61.
Figure 67:
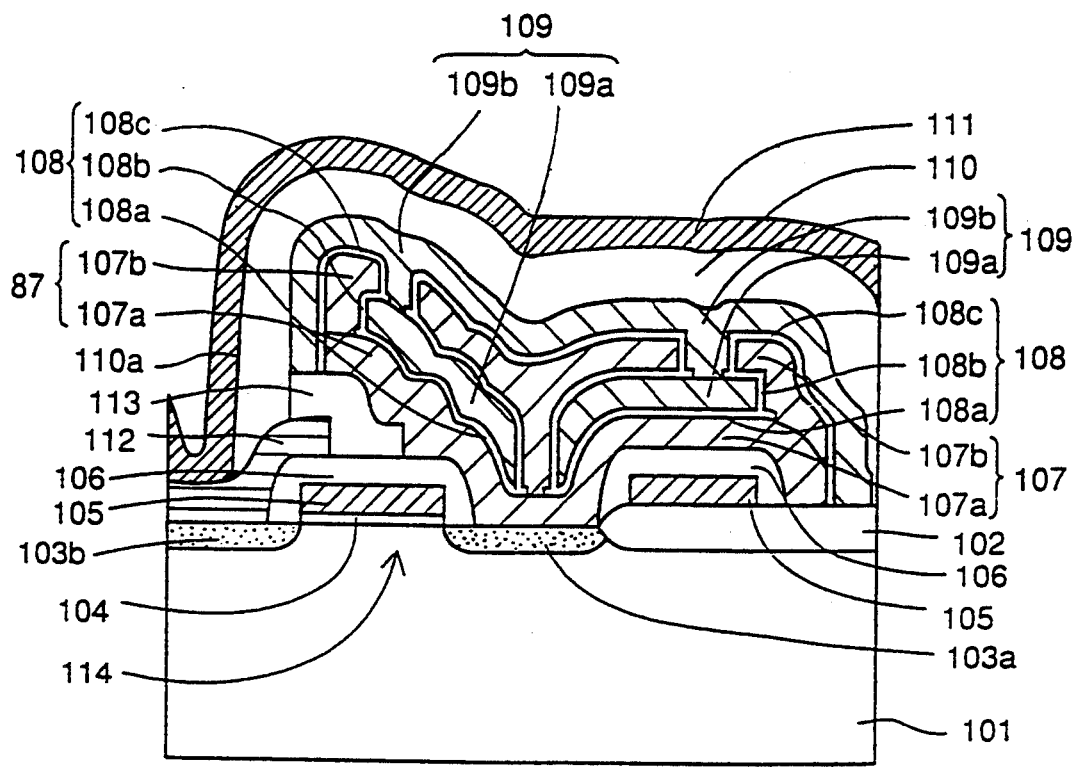
FIG. 67 is a cross-sectional view for use in illustration of a sixth step of a manufacturing process of the DRAM in accordance with the sixth embodiment shown in FIG. 61.
Figure 68:
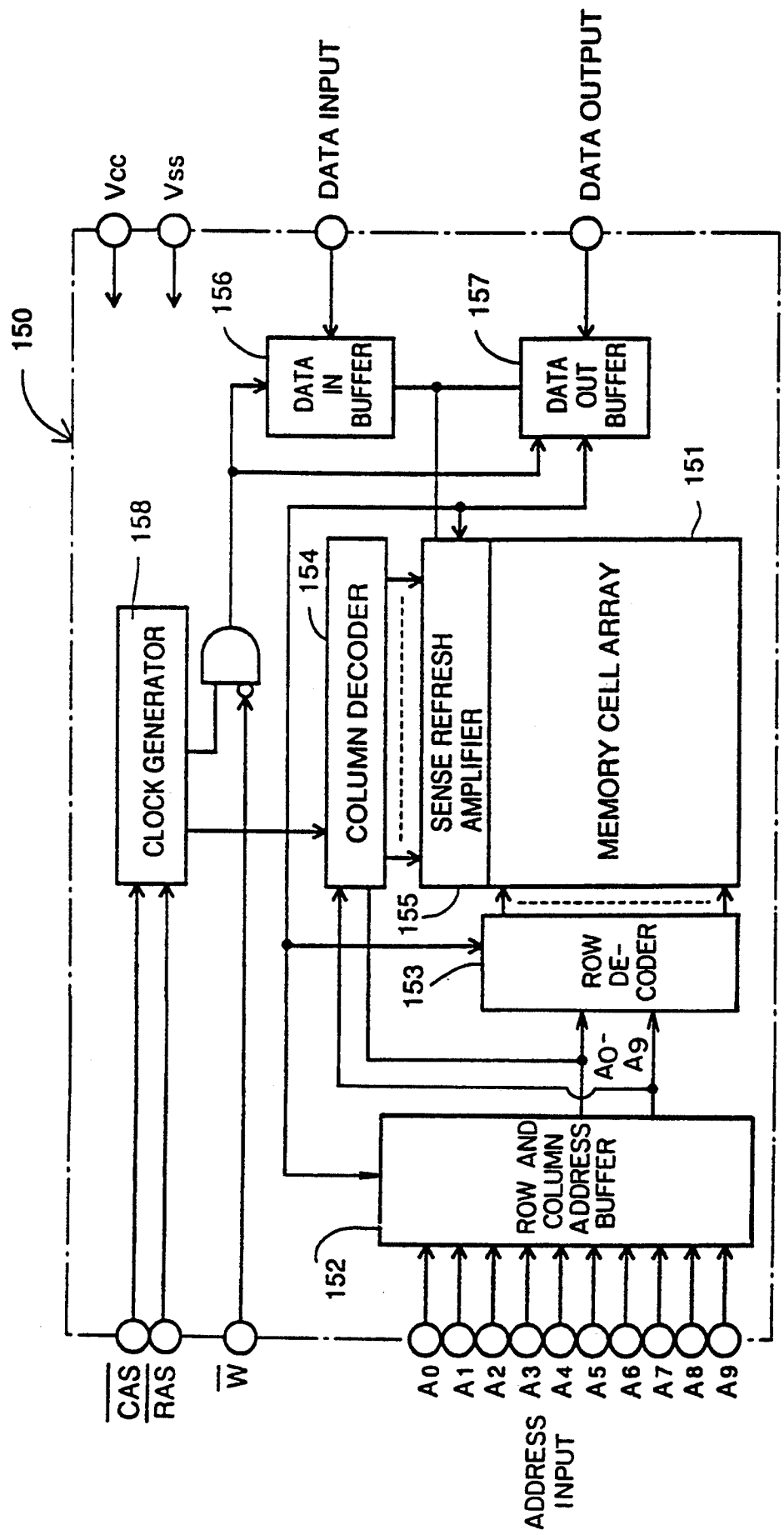
FIG. 68 is a block diagram showing a general structure of a DRAM.

As shown in FIG. 65, silicon oxide film layer 113a is formed on the entire surface by CVD. Patterning is performed by photolithography and etching techniques and silicon oxide film 113 as shown in FIG. 66 is formed as a result. More specifically, silicon oxide film 113 is formed so as to cover an edge portion of pad layer 112 positioned above the gate electrode 105. Then, going through the same manufacturing process as the fifth embodiment shown in FIGS. 57-60, a structure as shown in FIG. 67 is provided.

Finally, interlayer insulating film 114 is formed so as to cover bit line 111. The surface of interlayer insulating film 114 is planarized by reflow or etched back method. An aluminum interconnection 115 corresponding to gate electrode 105 is formed on interlayer insulating film 114. Thus, the DRAM in accordance with the sixth embodiment is completed.

Thus, in a semiconductor device in accordance with the present invention, a capacitor upper electrode is formed to have upper and lower layers connected with each other, a capacitor lower electrode is formed to surround the lower layer of capacitor upper electrode, the upper layer of the capacitor upper electrode is formed to cover the upper surface and both sides of the capacitor lower electrode, and the area in which capacitor upper electrode and capacitor lower electrode face each other is greatly increased as compared to the conventional ones. As a result, capacitor capacity can be tremendously increased in the same plane area as conventional ones and capacitor capacity sufficient for stably maintaining stored data can be secured even if elements are further reduced in size in accordance with high density integration of semiconductor devices.

Furthermore, in a method of manufacturing a semiconductor device in accordance with the present invention, a first capacitor insulating layer is formed on a first electrode layer, a second electrode layer is formed on the first capacitor insulating layer positioned above a prescribed portion of the first electrode layer, a second capacitor insulating layer is formed so as to cover the second electrode layer, a prescribed region of the surface of the first electrode layer is exposed by removing a prescribed region of the second capacitor insulating layer on which the second electrode layer is not formed, a third electrode layer is formed to be electrically connected to the first electrode layer exposed on the second capacitor insulating layer positioned on the prescribed region of the second electrode layer, a third capacitor insulating layer is formed so as to cover both sidewalls of the first electrode and the third electrode, a prescribed portion of the region of the second capacitor insulating layer on which the third electrode layer is not formed is removed, a fourth electrode layer is formed to be electrically connected to the second electrode layer positioned below the portion left behind by the removed second capacitor insulating layer and to cover the third capacitor insulating layer, whereby the capacitor lower electrode is formed by the first and third electrode layers, the capacitor upper electrode is formed by the second and fourth electrode layers, and the fourth electrode layer forming the capacitor upper electrode covers both sidewalls of the first electrode layer and third electrode layer, thus increasing the area in which the capacitor upper electrode and the capacitor lower electrode face each other as compared to conventional ones. As a result, capacitor capacity can be greatly increased in the same plane area as the conventional ones. The first, second, third, and fourth electrode layers can advantageously and readily be formed by repeating a process similar to a conventional process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a capacitor upper electrode having an upper layer and a lower layer connected with each other;
a capacitor lower electrode surrounding the lower layer of said capacitor upper electrode; and
a capacitor insulating film interposed between said capacitor upper electrode and said capacitor lower electrode,
wherein the upper layer of said capacitor upper electrode covers the upper surface and both side surfaces of said capacitor lower electrode, and the upper and lower layers of the capacitor upper electrode are electrically connected at corresponding annular portions thereof,
and further wherein said capacitor lower electrode includes a first electrode layer and a second electrode layer electrically connected to each other, said first electrode layer extending under the lower layer of said capacitor upper electrode with said capacitor insulating film therebetween, and said second electrode layer extending on an upper surface of the lower layer of said capacitor upper electrode with said capacitor insulating film therebetween.

2. A semiconductor device as recited in claim 1, wherein
the upper layer of said capacitor upper electrode covers the upper surface and both sidewalls of said second electrode layer and both sidewalls of said first electrode layer.

3. A semiconductor device as recited in claim 1, wherein
said capacitor lower electrode includes a third electrode layer connecting the first and second electrode layers.

4. A semiconductor device as recited in claim 3, wherein
said third electrode layer of the capacitor lower electrode includes an outer annular standing wall and a central standing wall formed a prescribed distance apart from the outer annular wall, and the standing walls being substantially vertical to a substrate surface, and
the upper and lower layers of said capacitor upper electrode being electrically connected between said outer annular standing wall and said central standing wall at the corresponding annular portions thereof.

5. A semiconductor device, comprising
a semiconductor substrate of a first type conductivity having a main surface;
a pair of source/drain regions of a second type conductivity formed on the main surface of said semiconductor substrate a prescribed distance apart from each other to have therebetween a channel region;
a gate electrode formed on said channel region with a gate insulating film therebetween;
a capacitor lower electrode electrically connected to one of said source/drain regions; and
a capacitor upper electrode formed on the surface of said capacitor lower electrode with a capacitor insulating film therebetween, said capacitor upper electrode having an upper layer and a lower layer electrically connected with each other at corresponding annular portions thereof,
said capacitor lower electrode surrounding the lower layer of said capacitor upper electrode and including a first electrode layer and a second electrode layer electrically connected with each other, said first electrode layer extending on said gate electrode with an insulating film therebetween, and said second electrode layer extending on an upper surface of the lower layer of said capacitor upper electrode with said capacitor insulating film therebetween, and
the upper layer of said capacitor upper electrode being formed to cover the upper surface and both side surfaces of said capacitor lower electrode.

6. A semiconductor device as recited in claim 5, wherein
a bit line is connected to said the other source/drain region, and
said bit line is formed extending on said capacitor upper electrode with an interlayer insulating film therebetween.

7. A semiconductor device as recited in claim 6, wherein
a pad layer is interposed between said bit line and said the other source/drain region, and
an interlayer insulating layer is interposed between said pad layer, said capacitor upper electrode, and said capacitor lower electrode.

8. A semiconductor device as recited in claim 1, wherein
said capacitor lower electrode and capacitor upper electrode are formed of polysilicon layers.

9. A semiconductor device as recited in claim 1, wherein the thickness of said capacitor lower electrode is approximately in the range between 1000 Å and 2000 Å, and
the thicknesses of the upper layer and lower layer of said capacitor upper electrode are both approximately in the range between 1000 Å and 3000 Å.

10. A semiconductor device as recited in claim 5 wherein the capacitor lower electrode further includes a third electrode layer,
said third electrode layer of the capacitor lower electrode includes an outer annular standing wall and a central standing wall formed a prescribed distance apart form the outer annular wall, and the standing walls being substantially vertical to a substrate surface, and
the upper and lower layers of said capacitor upper electrode being electrically connected between said outer annular standing wall and said central standing wall at the corresponding annular portions thereof.

* * * * *